(12) United States Patent
Hajjahmad et al.

(10) Patent No.: US 6,643,406 B1
(45) Date of Patent: Nov. 4, 2003

(54) METHOD AND APPARATUS FOR PERFORMING LINEAR FILTERING IN WAVELET BASED DOMAIN

(75) Inventors: Ibrahim Hajjahmad, San Diego, CA (US); Munib Wober, Wakefield, MA (US); F. Richard Cottrell, Westport, MA (US)

(73) Assignee: Polaroid Corporation, Waltham, MA (US)

( * ) Notice: Subject to any disclaimer, the term of this patent is extended or adjusted under 35 U.S.C. 154(b) by 0 days.

(21) Appl. No.: 09/537,734

(22) Filed: Mar. 29, 2000

Related U.S. Application Data
(60) Provisional application No. 60/146,063, filed on Jul. 28, 1999.

(51) Int. Cl.$^7$ ................................................. G06K 9/36
(52) U.S. Cl. ....................................................... 382/240
(58) Field of Search ................................. 382/232, 233, 382/236, 238, 240, 242, 248, 250; 348/384.1, 394.1, 395.1, 400.1–404.1, 407.1–416.1, 420.1, 421.1, 425.2, 430.1, 431.1; 375/240.02–240.03, 240.11–240.16, 240.18–240.2, 240.22–240.25; 341/51, 63, 65, 67, 107; 364/724.011, 724.04, 724.05, 724.13, 724.14, 725.01, 725.02

(56) References Cited

U.S. PATENT DOCUMENTS

| | | | | |
|---|---|---|---|---|
| 4,974,187 | A | * 11/1990 | Lawton ................... | 364/728.01 |
| 5,014,134 | A | 5/1991 | Lawton et al. ............ | 358/261.3 |
| 5,347,479 | A | 9/1994 | Miyazaki .................... | 364/725 |
| 5,412,741 | A | 5/1995 | Shapiro ....................... | 382/232 |
| 5,420,636 | A | 5/1995 | Kojima ........................ | 348/403 |
| 5,453,945 | A | 9/1995 | Tucker et al. ................ | 364/725 |
| 5,546,477 | A | 8/1996 | Knowles et al. ............. | 382/242 |
| 5,598,481 | A | 1/1997 | Nishikawa et al. .......... | 382/130 |
| 5,600,373 | A | 2/1997 | Chui et al. ................... | 348/397 |
| 5,602,589 | A | 2/1997 | Vishwanath et al. ........ | 348/398 |
| 5,604,824 | A | 2/1997 | Chui et al. ................... | 382/248 |
| 5,703,965 | A | 12/1997 | Fu et al. ....................... | 382/232 |
| 5,706,220 | A | 1/1998 | Vafai et al. ............. | 364/724.05 |
| 5,710,835 | A | 1/1998 | Bradley ....................... | 382/233 |
| 5,748,786 | A | 5/1998 | Zandi et al. ................. | 392/240 |
| 5,754,702 | A | * 5/1998 | Simpson ...................... | 382/240 |
| 5,754,793 | A | 5/1998 | Eom et al. ............. | 395/200.77 |

(List continued on next page.)

OTHER PUBLICATIONS

Hyungjun Kim: "Image compression using biorthogonal wavelet transforms with multiplierless 2–D filter mask operation," pp. 648–651, 1997, Pub. Proc. Of the Int'l. Conf., on Image Processing, Santa Barbara, CA, USA, Oct. 26–29, 1997, Publisher IEEE Comput. Soc.

Jorge Torres, et al.: "Satellite image destriping: a wavelet-based approach," pp. 130–139, 1997, Pub. Proc. Of the SPIE, vol. 3170, Publisher, SPIE–Int. Soc. Opt. Eng.

*Primary Examiner*—Jose L. Couso

(57) ABSTRACT

Disclosed herein are a method, apparatus and computer usable medium for linear filtering with filters of any desired shape and length using the wavelet transform as the computation engine by modifying the basis functions. Specifically, the method and apparatus modifies the basis function of the wavelet and/or inverse wavelet transform(s) by convolving it with the desired filter, thereby forming a modified wavelet and/or inverse wavelet transform(s). The linear filtering is performed in the signal processing and image processing related fields using the wavelet transform with a method that is mathematically equivalent to the filtering operation in the spatial domain. Linear filtering in the wavelet based domain eliminates the need for another program for software support or additional silicon area or real estate to accommodate more functions in hardware. The modified wavelet and/or inverse wavelet transform harnesses and leverages the wavelet and/or inverse wavelet basis function of the wavelet and/or inverse wavelet transform so as to perform the desired linear filtering of the digital or analog signals, without incurring extra cost in terms of software computations or hardware modifications.

46 Claims, 26 Drawing Sheets

U.S. PATENT DOCUMENTS

| | | |
|---|---|---|
| 5,757,974 A | 5/1998 | Impagliazzo et al. ........ 382/248 |
| 5,802,369 A | 9/1998 | Ganesh et al. ......... 395/200.77 |
| 5,815,198 A | 9/1998 | Vachtsevanos et al. ....... 348/88 |
| 5,819,215 A | 10/1998 | Dobson et al. ............. 704/230 |
| 5,821,882 A | 10/1998 | Kazato et al. ................ 341/50 |
| 5,828,849 A | 10/1998 | Lempel et al. ......... 395/200.77 |
| 5,838,377 A | 11/1998 | Greene ....................... 348/398 |
| 6,021,228 A * | 2/2000 | Byrd ........................... 382/240 |
| 6,021,378 A * | 2/2000 | reiter et al. .................... 702/14 |
| 6,211,515 B1 * | 4/2001 | Chen et al. ............... 250/252.1 |
| 6,215,908 B1 * | 4/2001 | Pazmino et al. ............ 382/240 |
| 6,389,176 B1 * | 5/2002 | Hsu et al. ................... 382/254 |

* cited by examiner

METHOD AND APPARATUS FOR PERFORMING LINEAR FILTERING IN WAVELET BASED DOMAIN

RELATED APPLICATIONS

This application claims the benefit of U.S. Provisional Application No. 60/146,063 entitled "Method And Apparatus For Performing Linear Filtering In Wavelet Based Domain" filed on Jul. 28, 1999.

TECHNICAL FIELD OF INVENTION

The present invention relates generally to the field of signal processing and, more particularly, to a method and apparatus for linear filtering with filters of any desired shape and length using the wavelet transform as the computation engine by modifying the basis functions. Specifically, the method and apparatus modify the basis function of the wavelet and/or inverse wavelet transform(s) by convolving it with the desired filter, thereby forming a modified wavelet and/or inverse wavelet transform(s).

BACKGROUND OF THE INVENTION

The present invention method and apparatus are applicable to a variety of signal processing related fields, including, but not limited to the following: radar processing; geophysics processing (e.g., meteorology, oceanography, geodesy, and seismology); audio processing; telephonic processing (e.g., land-line, remote, cellular, digital, and analog); personal digital assistants (PDA) processing; wireless application protocol (WAP) processing; teleconferencing processing; data storage, retrieval and transmission processing; networks and communication processing; facsimile processing; video processing; multi-media processing; still-image processing; medical image processing (e.g., ultrasound, radiology and mammography); computer processing; internet and intranet processing; and/or other sensory data processing. The present invention relates to signal processing and more particularly to the linear filtering of data signals, such as image signals which may be used in image processing methods and apparatuses.

The present invention can be used for linear filtering digital signals and images with desired filters of any shape and length using the forward wavelet/inverse wavelet transform hardware and software as the only computation engine. Except for an initial (one time) modification of the wavelet basis functions all of the computation to perform linear filtering in the present invention can be done either in the forward wavelet transform step, in the inverse wavelet transform step or in both the forward and inverse wavelet transforms. While the present invention is applicable to a myriad of technically related fields, including the ones mentioned above, for purposes solely for illustration, the present invention may be incorporated with data compression and decompression methods and apparatuses, which generally relate to the compression, decompression, transmission, and storage of audio, still-image, video, and multi-media data in digital form in the applicable one, two, and three dimensional signal formats.

1. DFT AND DCT

By way of background, the discrete Fourier transform (DFT) and the discrete cosine transform (DCT) (as discussed in U.S. Pat. No. 5,453,945 to Tucker et al.; U.S. Pat. No. 5,757,974 to Impagliazzo; U.S. Pat. No. 5,706,220 to Vafai et al., and U.S. Pat. No. 5,838,377 to Greene, and herein incorporated by reference) are mathematical algorithms that break down signal data or image into their sine/cosine wave components. The sine/cosine wave components are also known as the transform coefficients. The magnitude of the transform coefficients determines the appropriate amount of the corresponding basis function so when pieced back together, these components reproduce the original signal or image. Heretofore known embodiments of signal or image compression apparatuses often use the DFT or DCT to break signals or images into their sinusoidal components and save only the largest components to compress the data. The rest of the components are discarded or represented with fewer bits. This can result in a significant loss of information since the signal or image's information is spread over all of its sinusoidal components. For example, the sharp details of an X-ray image are smoothed when the image is compressed at high levels, thus reducing the value of the image. If a lower level of compression is used (i.e. less-lossy) data storage requirements are increased and a greater amount of time is required for data transmission. Similar problems occur in other data compression applications.

Conventional image compression techniques that are associated with the Joint Photograph Expert Group (JPEG) or Moving Picture Expert Group (MPEG) standards are widely used in many of the current imaging devices but are unable to meet the increasing demand for higher compression ratios and greater image fidelity needed by many applications. For example, utilizing new communication channels with lower bandwidth. The JPEG technique, based on the DCT, divides the image into a series of 8×8 pixel blocks and the DCT is computed for each block producing an average value and 63 frequency values. These values can be quantized to produce a minimum set representing each 8×8 block. Because the image is divided into 8×8 blocks, the approach tends to mask details, interrupt continuous lines, and cause discontinuities at the borders thereby lowering image fidelity in the reconstructed image.

Thus, DCT based image compression has two serious disadvantages, namely, a blocking effect and a mosquito noise effect (also referred to as corona effect). The blocking effect is attributable principally to a quantization error in the generation of lower frequency coefficients while mosquito noise is attributable to a quantization error in the generation of higher frequency coefficients. As can be appreciated by one skilled in the art, wavelet transform coding was recently introduced and developed to overcome these disadvantages.

2. COMPRESSION

Many different data compression techniques exist in the prior art. Compression techniques can be divided into two broad categories, lossy coding and lossless coding. Lossy coding involves coding that results in the loss of information, such that there is no guarantee of perfect reconstruction of the original data. The goal of lossy compression is that changes to the original data are done in such a way that they are not objectionable or detectable. In lossless compression, all the information is retained and the data is compressed in a manner which allows for perfect reconstruction.

For purpose of illustration, consider an image comprising a gray-scale representation of a photograph displayed by a rectangular array of picture elements ("pixels" or "pels") arranged in 1000 rows by 1000 columns (1,000,000 pixels). Each pixel typically consists of or is represented by 8 bits which are used to encode 256 possible intensity levels at the corresponding point on the photograph. Hence, without compression, transmission of the photograph requires a total of $8\times10^6$ bits (1 million bytes or 1 Megabyte) be sent over the communication link. A typical telephone line is capable of transmitting about 56,000 bits per second (bps); hence the picture transmission would require nearly 2½ minutes. Transmission times of this magnitude are unacceptable.

The bit budget may be a function of a variety of factors, such as the product of the desired bit rate (e.g., 0.25 bits/pel) and the number of coefficients (e.g., 512 by 512 pixel image), the capacity of a modem by which the coded bit stream will be transmitted, or the capacity of a disk or tape used to store the coded bit stream. For instance, a single, relatively modest-sized image, having 640 by 480 pixels and a full-color resolution of 24 bits per pixel (three 8-bit bytes per pixel), occupies nearly a megabyte of data. At a resolution of 1024 by 768 pixels, a 24-bit color screen requires 2.3 megabytes of memory to represent. A 24-bit color picture of an 8.5 inch by 11 inch page, at 300 dots per inch, requires as much as 25 megabytes to represent.

As mentioned above, an image may be compressed during transmission to reduce the bit rate of an input image or to increase the efficiency of a storage device for storing image data. In most cases, however, picture quality deteriorates since the integrity of the image data is degraded by the image compression. The ultimate object of image compression is to maintain picture quality by eliminating any appreciable viewing difference between original and compressed images, while maintaining a high compression rate.

3. WAVELET TRANSFORM (WT)

More by way of background, the wavelet transform was recently developed as an improvement over the DFT and DCT to better represent signals having sharp changes or discontinuities. The basis functions of the wavelet transform are small waves or wavelets, developed by mathematicians to better match signal discontinuities. In addition, researchers and engineers that were working in computer vision had also studied some aspects of wavelet theory such as multi-resolution and pyramid representation. With great simplification, the major contributions of each community to the field of wavelets can be summarized; mathematicians developed a solid and unifying framework for wavelet theory and engineers/researchers provided the means to implement the wavelet transform using their filter banks and applied the wavelet theory to different applications such as image coding, segmentation, enhancement, and speech processing. Also, psycho-physicists have provided evidence that wavelet analysis and its multiresolution property are suitable to approximate the human visual system.

The wavelet basis functions of a wavelet transform are such that basis functions in each wavelet has finite support of a different width. The wider wavelets examine larger regions of the signal and resolve low frequency details accurately, while the narrower wavelets examine a small region of the signal and resolve spatial details accurately. Wavelet-based compression has the potential for better compression ratios and less complexity than sinusoidal-based compression. Wavelet transform properties make them well suited for signal processing in conjunction with other filters, such as for video and still-image compression applications due at least in part to the bound nature of the reference wavelet basis, as well as to the orthoganality of the wavelet basis at different frequency scales. As a result, near-perfect reconstruction of a compressed video or still-image signal can be achieved. In addition, relatively simple and compact filter banks can be constructed to implement the "near perfect" wavelet-based decomposition/reconstruction.

Typically, during wavelet-based decomposition, a frequency band of an image signal is decomposed into a number of sub-bands by a bank of bandpass filters. Each sub-band then is translated to a lower frequency band (baseband, for example) by decimating (down-sampling) it and thereafter encoding it. During corresponding reconstruction, each encoded sub-band is decoded and then interpolated (up-sampled) back to its original frequency band. The bands then are summed to provide a replica of the original image signal. As such, data wavelet-based compression is an extremely useful tool for storing and transmitting large amounts of data. For example, the time required to transmit an image, such as a digital reproduction of a photograph or facsimile transmission of a document, is reduced drastically when wavelet-based compression is used to decrease the number of bits required to recreate the image.

The main difference between a wavelet transform and the DCT is the way decomposition and reconstruction is accomplished. Instead of using cosine waves as with DCT, the wavelet transform uses short waves that start and stop with different spatial resolutions. However, all these small waves come from the same "mother wavelet" that meets a set of conditions. While the DCT or the fast Fourier transform (FFT) have a set of fixed and well defined basis functions for a specified transform size, for wavelets, on the other hand, it is the opposite case. For wavelets, there does not exist a specific formula for the basis function but rather a set of mathematical requirements that the wavelet functions need to satisfy. Thus, the first step in wavelet analysis is to determine and designate the appropriate wavelet bases to use and that depends on the specific application. For instance, in image compression one can design the wavelet basis functions and tune them to a specific class of images such as color photographic images, finger print images, or medical images. Designing and finding such wavelet bases to be designated for use is not a trivial task because it is mathematically involved. Fortunately, numerous researchers have designed a number of specific wavelet functions, of which these wavelet bases are identified by the namesake of the respective researcher (e.g., Daubechies, Coffman, Chui, Mallat, etc.). The most famous and widely used wavelet bases are the Daubechies wavelets which are named after its founder, Ingrid Daubechies. She was the first researcher to design a non-trivial finite length discrete (compact support) wavelet basis function. Her class or family of wavelets are effective for representing polynomial behavior.

A number of apparatuses and methods for signal processing using wavelets and inverse wavelets are known in the art. Some typical examples of wavelet and inverse wavelet transformers and related art are disclosed in the following list of U.S. Patents, and are herein incorporated by reference:

| | |
|---|---|
| Lawton et al. - 5,014,134; | Miyazaki - 5,347,479; |
| Shapiro - 5,412,741; | Kojima - 5,420,636; |
| Tucker et al. - 5,453,945; | Knowles et al. - 5,546,477; |
| Nishikawa et al. - 5,598,481 | Chui et al. - 5,600,373; |
| Vishwanath et al. - 5,602,589; | Chui et al. - 5,604,824; |
| Fu et al. - 5,703,965; | Vafai et al. - 5,706,220; |
| Bradley - 5,710,835; | Zandi et al. - 5,748,786; |
| Eom et al. - 5,754,793; | Impagliazzo et al. - 5,757,974; |
| Ganesh et al. - 5,802,369; | Vachtsevanos et al. - 5,815,198; |
| Dobson et al. - 5,819,215; | Kazato et al. - 5,821,882; |
| Lempel et al. - 5,828,849; and | Greene - 5,838,377. |

In view of the large amount of memory required to store or transmit a single image in uncompressed digital form, it would be desirable to compress the digital image data before storage or transmission in such a way that the compressed digital data could later be decompressed to recover the original image data for viewing. In this way, a smaller amount of compressed digital data could be stored or transmitted. Accordingly, numerous digital image compression and decompression methods have been developed.

As shown in FIGS. 1(A) and (B), a non-wavelet linear filter 310, e.g., noise-reduction process, may be performed in the non-wavelet transform domain on the signal prior to or after the wavelet transform 301, i.e., performed without the wavelet as a computation engine. Similarly, as shown in FIGS. 1(C) and (D), a non-inverse wavelet linear filter 410, e.g. enhancement process, may be performed in the non-inverse wavelet domain on the signal after or prior to the inverse wavelet transform 401, i.e., performed without the inverse wavelet as a computation engine. As one skilled in the art would appreciate, the non-wavelet and non-inverse wavelet linear filtering of FIG. 1 are performed in the frequency domain or the time domain.

Neither the patents nor the prior art cited herein realize the important advantages that are attributed to modifying the basis function of the discrete wavelet or inverse wavelet transform by convolving it with desired filter. This modification forms a modified wavelet transform (MWT) or modified inverse wavelet transform (MIWT) to perform linear filtering. An advantage of the present invention MWT or MIWT is that the linear filtering is accomplished using the wavelet or inverse wavelet transform as the computation engine. Therefore, the linear filtering of the present invention is performed without incurring extra cost in terms of software and algorithm computations or apparatus/hardware modifications relative to the prior art.

Generally, as understood by those skilled in the art, a digital image can be linear filtered using a number of techniques. A well known technique, as understood by those skilled in the art, is in the spatial domain where the pixels in the image are multiplied by the appropriate weights of the desired filter coefficients and the results are then summed over the appropriate limits. Because the linear filtering operations are important in digital image processing and are widely used, there has been significant work to perform the linear filtering operation using different methods other than the spatial domain. One such method of performing linear filtering using the DFT or FFT instead of the direct linear convolution in the spatial domain is disclosed in the book entitled "Two-Dimensional Signal and Image Processing" by Jae S. Lim (pgs. 145–148), whereby it is demonstrated in many cases that it is faster to perform linear filtering indirectly using the DFT or FFT instead of the direct spatial domain. Another technique as disclosed in the U.S. Pat. No. 5,740,284 to Wober et al. and U.S. Pat. No. 5,168,375 to Reisch et al (both commonly assigned to the assignee of the present patent application) discloses how to perform the linear filtering operation in the DCT domain.

In the present invention, linear filtering is performed using the wavelet transform in a method that is mathematically equivalent to the filtering operation in the spatial domain. The application of wavelet transforms to perform linear filtering is not well known and offers an opportunity to conveniently utilize available custom hardware or general purpose computers to achieve linear filtering. This is an important advantage to digital signal processing and image processing because the wavelet transform is becoming an integral part of various signal processing and imaging processing devices, as well as their related industry standards.

Neither the patents nor the prior art cited herein discloses the implementation of the present invention for performing the equivalent of the linear filtering using either the forward wavelet transform, the inverse wavelet transform or both the forward and inverse wavelet transform.

In addition, as the availability and use of wavelet related technologies continue to rise in both hardware and software it is the crucial part of compression standards in JPEG 2000, DICOM medical image coding, and other related fields.

A number of prior art methods and apparatuses have been developed using non-wavelet linear filtering and non-inverse wavelet linear filtering. However, one of the drawbacks associated with the prior art is that its non-wavelet and non-inverse wavelet linear filtering are performed as a separate step, thus requiring additional hardware or software. Therefore, the prior art teachings do not harness or leverage the wavelet (and/or inverse wavelet) basis function of the hardware or software to perform the desired linear filtering of the digital signals.

For instance, U.S. Pat. No. 5,703,965 to Fu et al., discloses still and moving image compression techniques whereby the compression algorithm could involve, according to the disclosure, a wavelet technique which allows the compressed or reduced image to be transmitted over the limited bandwidth transmission medium. The image is then decompressed using an inverse wavelet algorithm and interpolated back to its original array size. Thereafter, edges (contours) in the image are sharpened to enhance the perceptual quality of the reconstructed image, typically with a high-pass filter. The Fu et al. sharpening/enhancement filtering is performed in the non-wavelet domain, i.e., in the time domain or frequency domain. As a result, the Fu et al. linear filtering requires additional software and/or hardware support besides the inverse wavelet basis function to accomplish its desired filtered effect through non-inverse wavelet linear filtering, i.e. the Fu et al. linear filtering is accomplished in a basis function other than the inverse wavelet basis function. Similarly, Fu et al. also teach that the input image array may be non-wavelet filtered to minimize or reduce the noise. Again, this desired filtering requires additional software and/or hardware support beyond the wavelet basis function.

Next, U.S. Pat. No. 5,815,198 to Vachtsevanos et al., discloses a method and apparatus which analyzes an image or an object to detect and identify defects in the object using a wavelet transform to extract relevant features from a scanned image. The input signal to the Vachtsevanos detection and identification method/apparatus first undergoes non-wavelet linear filtering and, thereafter, features are extracted using the wavelet transform. Vachtesevanos further discloses that the non-wavelet linear filtering reduces the noise content and increases usability, and that various non-wavelet linear filtering techniques can be applied which depend upon the particular application. However, the drawback associated with the Vachtesevanos non-wavelet filtering technique is that the filtering requires additional software and/or hardware support besides the wavelet basis function to accomplish its desired filtered effect or non-wavelet linear filtering, i.e. the Vachtesevanos et al. linear filtering is accomplished in a basis function other than the wavelet basis function. The Vachtesevanos non-wavelet linear filtering is performed in the non-wavelet domain, i.e., in the time or frequency domain.

Similarly, U.S. Pat. No. 5,598,481 to Nishikawa et al., discloses a method for automated detection of abnormal anatomic regions, wherein a mammogram is digitized to produce a digital image and the digital image is processed using local edge gradient analysis and linear pattern analysis in addition to feature extraction routines to identify abnormal anatomic regions. Nishikawa discloses that the digital image is first linearly filtered prior to performing a wavelet decomposition or reconstruction of the first filtered digital image. Similar to the aforementioned techniques, the drawback with Nishikawa is that the initial filtering is required to be performed as a separate step without using the wavelet or inverse wavelet basis function.

None of the patents described above provides the important advantages of present invention whereby the wavelet basis function is harnessed and leveraged so as to use the wavelet transform as the computation engine of the linear filtering method/apparatus, thereby being able to perform linear filtering without incurring extra cost in terms of software computations or hardware modifications.

SUMMARY OF THE INVENTION

A novel approach for modifying the wavelet (inverse wavelet) basis function of the wavelet (inverse wavelet) transform in accordance to a desired linear filtering effect has now been discovered. The present invention convolves the wavelet (inverse wavelet) basis function of the wavelet transform with a desired filter to form a modified wavelet (inverse wavelet) transform. By practicing the invention, the skilled practitioner can now perform linear filtering using the wavelet (inverse wavelet) transform as the computation engine. Thus the teachings of the present invention overcome the limitations of the prior art modes that linear filter is performed as a separate step in the spatial domain, frequency domain or time domain, rather than in the wavelet (inverse wavelet) domain.

As the present invention teaches linear filtering using the wavelet (inverse wavelet) transform as the computation engine, an advantage of the present invention is that the linear filtering is performed without incurring extra cost in terms of software/algorithm computations or apparatus/ hardware modifications relative to the prior art.

As the present invention is able to use the wavelet (inverse wavelet) transform as the computation engine of the linear filtering method/apparatus, the present invention harnesses and leverages the wavelet (inverse wavelet) transform so as to perform the desired linear filtering of the digital or analog signals, without incurring extra cost in terms of software computations or hardware modifications. As a result, the present invention eliminates the need for another program for software support or additional silicon area or real estate to accommodate more functions in hardware. For instance, in a given system the existing software programs or subroutines and the existing digital signal processing (DSP) chips or computer processors that would already be in place will be adequate to perform the desired linear filtering.

In one aspect, the present invention features a method for linear filtering digital signals from a data source using desired filters of various shape and length to establish a desired filtered effect. The filtering method comprising the steps of: wavelet transforming the digital signals in a respective wavelet basis function during a wavelet decomposition analysis using the wavelet transform as a computation engine; and modifying the wavelet basis function of the wavelet transform in accordance with the desired filtering effect. The modification of the wavelet basis function comprises convolving each of the wavelet basis function of the wavelet transform with the desired filter, thereby forming a modified wavelet transform.

In a second aspect, the present invention features a filtering method comprising the steps of: inverse wavelet transforming the digital signals in a respective inverse wavelet basis function during an inverse wavelet reconstruction synthesis using the inverse wavelet transform as a computation engine; and modifying the inverse wavelet basis function of the inverse wavelet transform in accordance with the desired filtering effect. The modification of the inverse wavelet basis function comprises convolving each of the inverse wavelet basis function of the inverse wavelet transform with the desired filter, thereby forming a modified inverse wavelet transform.

In another aspect, the present invention features a linear filtering apparatus for linear filtering digital signals using desired filters of various shape and length to establish a desired filtered effect on the digital signals. The apparatus includes a control means for controlling the operation of the linear filtering apparatus, and a signal sensing means that receives the digital signals from a signal data source. The linear filtering apparatus also comprises: a wavelet transform means for wavelet transforming the digital signals in a respective wavelet basis function using the wavelet transform as a computation engine, wherein the wavelet transform means modifies the wavelet basis function of the wavelet transform in accordance with the desired filtering effect. The modification is effected by convolving each of the wavelet basis function of the wavelet transform with the desired filter, thereby forming a modified wavelet transform.

In yet another aspect, the present invention features a linear filtering apparatus comprising an inverse wavelet transform means for inverse wavelet transforming the digital signals in a respective inverse wavelet basis function during an inverse wavelet reconstruction synthesis using the inverse wavelet transform as a computation engine. The inverse wavelet transform means modifies the inverse wavelet basis function of the inverse wavelet transform in accordance with the desired filtering effect, wherein the modification is effected by convolving the inverse wavelet basis function of the inverse wavelet transform with the desired filter, thereby forming a modified inverse wavelet transform.

A still further aspect of the present invention features a computer usable medium having computer readable program code thereon for linear filtering digital signals using a desired filter means of various shape and length to establish a desired filtered effect on the digital signals. The computer usable medium may be for use in a computer being controlled by a control means for operating the computer, and whereby the computer usable medium is also for use with a signal sensing means that receives the digital signals from a signal data source. The computer usable medium comprises a wavelet transform means for wavelet transforming the digital signals in a respective wavelet basis function using the wavelet transform as a computation engine, wherein the digital signals being at least one-dimensional. The wavelet transform means modifies each of the wavelet basis functions of the wavelet transform in accordance with the desired filtering effect, wherein the modification is effected by convolving the wavelet basis function of the wavelet transform with the desired filter, thereby forming a modified wavelet transform.

Yet another aspect of the present invention features a computer usable medium comprising an inverse wavelet transform means for inverse wavelet transforming the digital signals in a respective inverse wavelet basis function during an inverse wavelet reconstruction synthesis using the inverse wavelet transform as a computation engine. The inverse wavelet transform means modifies the inverse wavelet basis function of the inverse wavelet transform in accordance with the desired filtering effect, wherein the modification is effected by convolving the inverse wavelet basis function of the inverse wavelet transform with the desired filter, thereby forming a modified inverse wavelet transform.

Furthermore, an additional aspect of the present invention features a method for electronically sending digital signals over a communication network from a source acquisition system for use at a remote destination rendering system. The method comprising the steps of: establishing electronics communications link between the source acquisition system and the remote destination rendering system over the network; operating the source acquisition system to transmit the digital signals over the network for use in a rendering device or output device at the remote destination rendering system; and linear filtering at the source acquisition system the digital signals using a desired filter of various shape and length to establish a desired filtered effect. The linear filtering method comprising the steps of: wavelet transforming the digital signals in a respective wavelet basis function using the wavelet transform as a computation engine; and modifying the wavelet basis function of the wavelet transform in accordance with the desired filtering effect, wherein the wavelet modification is effected by convolving the wavelet basis function of the wavelet transform with the desired filter, thereby forming a modified wavelet transform.

Finally, another aspect of the present invention features a method for electronically rendering digital signals at a destination rendering system, wherein the signals is being transmitted over a communication network that originates from a source acquisition system. The method comprising the steps of: establishing an electronic communications link between the source acquisition system and the destination rendering system over the network; operating the destination rendering system to receive the digital signals over the network for use in a rendering device or output device at the destination rendering system; and linear filtering at the destination rendering system the digital signals transmitted from the source acquisition system using a desired filter of various shape and length to establish a desired filtered effect. The linear filtering method comprising the steps of: inverse wavelet transforming the digital signals in a respective inverse wavelet basis function using the inverse wavelet transform as a computation engine; and modifying the inverse wavelet basis function of the inverse wavelet transform in accordance with the desired filtering effect, wherein the inverse wavelet modification is effected by convolving the inverse wavelet basis function of the inverse wavelet transform with the desired filter, thereby forming a modified inverse wavelet transform.

These and other objects, along with advantages and features of the invention disclosed herein, will be made more apparent from the description, drawings, and claims that follow.

BRIEF DESCRIPTION OF THE DRAWINGS

The foregoing and other objects, features and advantages of the present invention, as well as the invention itself, will be more fully understood from the following description of preferred embodiments, when read together with the accompanying drawings, in which.

DETAILED DESCRIPTION OF THE INVENTION

The present invention relates generally to the field of signal processing and, more particularly, to a method and apparatus for linear filtering with filters of any desired shape and length using the discrete wavelet transform as the computation engine by modifying the wavelet basis functions. Specifically, the method and apparatus modifies the wavelet basis function of the discrete wavelet and/or inverse wavelet transform(s) by convolving the basis functions with the desired filter, thereby forming a modified discrete wavelet and/or inverse wavelet transform(s). The present invention can be utilized with various applications that require linear filtering. An advantage of the present invention is that the linear filtering and wavelet transformation are combined without requiring additional hardware or software. For illustrative purposes, the present invention is applicable to a variety of signal processing related fields, including, but are not limited to, the following: radar processing; geophysics processing (e.g., meteorology, oceanography, geodesy, and seismology); audio processing; telephonic processing (e.g., land-line, remote, cellular, digital, and analog); personal digital assistants (PDA) processing; wireless application protocol (WAP) processing; teleconferencing processing; data storage, retrieval and transmission processing; networks and communication processing; facsimile processing; video processing; multi-media processing; still-image processing; medical image processing (e.g., ultrasound, radiology and mammography); computer processing; internet and intranet processing; or other sensory data processing.

In the present invention, linear filtering is performed using the wavelet transform in a method and system that produce results which are identical to results obtained using the filtering operation in the spatial domain. The present invention method and system provide an important advantage to digital signal processing and image processing because the wavelet transform is becoming an integral part of various signal processing and imaging processing devices, as well as their related industry standards.

Figure 1B:
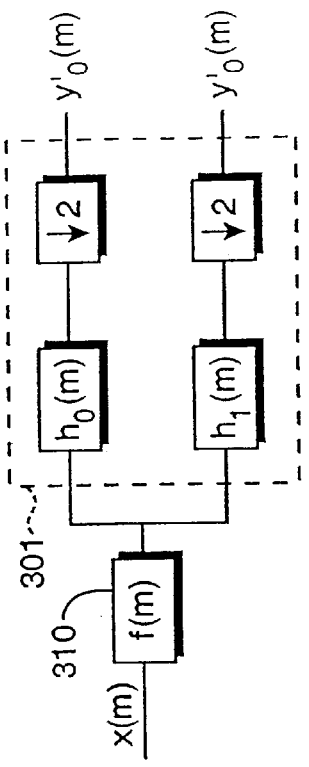
FIGS. 1(A) and 1(B) are schematic diagrams of a non-wavelet filtering process with a wavelet transform process.
Figure 1D:
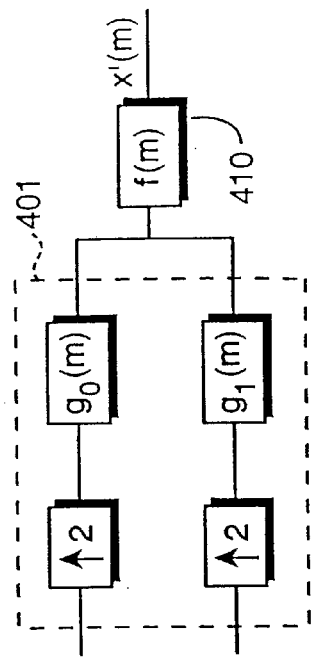
FIGS. 1(C) and 1(D) are schematic diagrams of a non-inverse wavelet filtering process with an inverse wavelet transform process.
Figure 1A:
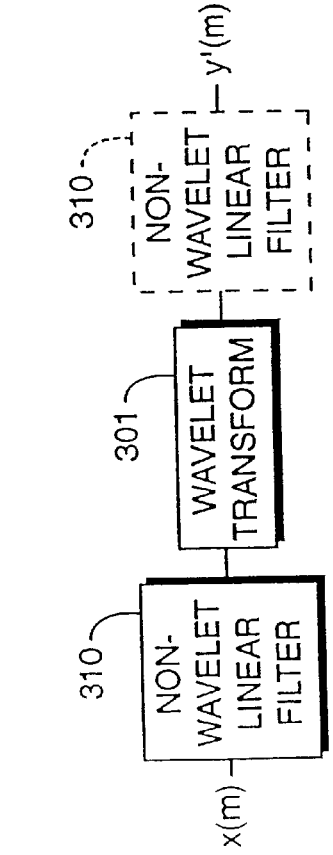
Figure 1C:
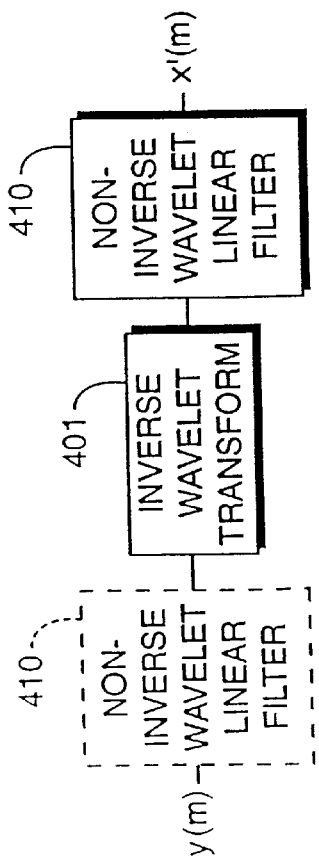
Figure 2A:
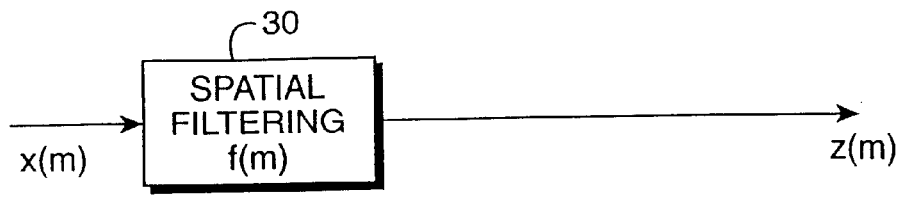
FIG. 2(A) is a schematic diagram of a filtering operation in the spatial domain.
Figure 2B:
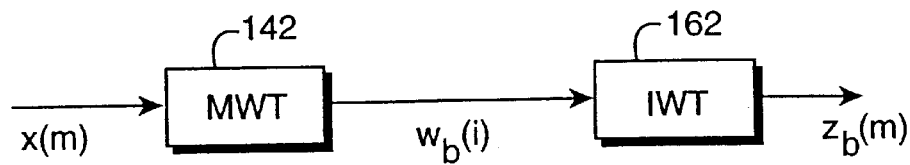
FIG. 2(B) is a schematic diagram of a linear filtering operation using the modified wavelet transform (MWT).

FIGS. 2(A)–(D) are helpful for illustrating some of the basic principles of the present invention. FIG. 2(A) shows the filtering operation in the spatial domain where the input signal x(n) goes through the filtering block 30 with the filter f(n) to obtain the desired result z(n). FIGS. 2(B), (C) and (D) show three possible implementations of the present invention for performing the equivalent of the linear filtering using any one of the following: forward wavelet transform; inverse wavelet transform; or both the forward and inverse wavelet transforms.

FIG. 2(B) shows the input signal x(n) going through the modified wavelet transform (MWT) 142 to obtain $w_b(i)$. The MWT 142 is identical to a conventional (i.e. or designated) wavelet transform (WT) in every aspect except for the fact that their respective wavelet basis functions are modified in accordance to the teachings of the present invention. The signal $w_b(i)$ is then passed through the inverse wavelet transform (IWT) 162. The resulting signal $z_b(n)$ is identical to the resulting signal z(n) that would be obtained using the spatial filtering according to FIG. 2(A).

Figure 2C:
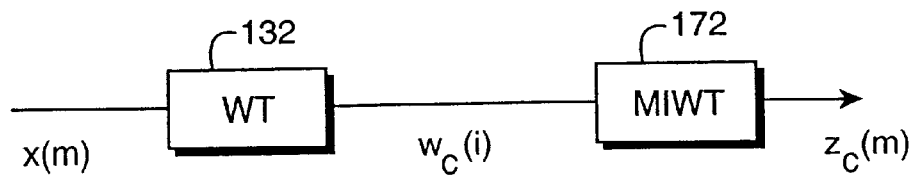
FIG. 2(C) is a schematic diagram of a linear filtering operation using the modified inverse wavelet transform (MIWT).

FIG. 2(C) shows the input signal x(n) going through the conventional or designated WT 132 to obtain $w_c(i)$. The signal $w_c(i)$ is then passed through the modified inverse wavelet transform (MIWT) 172. The MIWT 172 is identical to a conventional (i.e., designated) IWT in every aspect except for the fact that their respective inverse wavelet basis functions are modified in accordance to the teachings of the present invention. The resulting signal $z_c(n)$ is identical to the resulting signal z(n) that would be obtained using the spatial filtering according to FIG. 2(A).

Figure 2D:
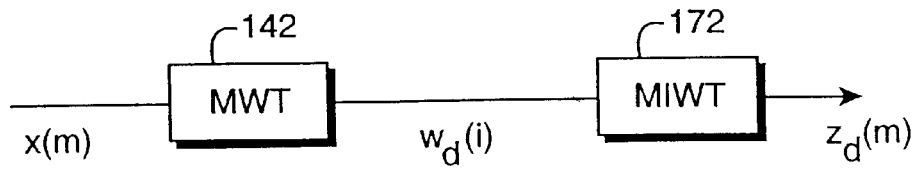
FIG. 2(D) is a schematic diagram of a linear filtering operation using the modified wavelet transform (MWT) and the modified inverse wavelet transform (MIWT).

FIG. 2(D) shows the input signal x(n) going through the MWT 142 to obtain $w_d(i)$. The signal $w_d(i)$ is then passed through the MIWT 172. The resulting signal $z_d(n)$ is identical to the resulting signal z(n) that would be obtained using the spatial filtering according to FIG. 2(A).

In the present invention, elements used for linear filtering in the wavelet analysis decomposition and/or in the inverse wavelet synthesis reconstruction may be implemented in hardware or software, such as that used on a computer system.

1. DISCRETE WAVELET TRANSFORM (DWT)

In general, linear filtering using the discrete wavelet transform is becoming an increasingly important functionality as efficient hardware and software implementations for the wavelet transform become increasingly available. Also the wavelet transform is becoming the transform of choice in newly adapted or proposed image coding standards. For instance, the FBI has decided to use a wavelet-based image coding apparatus to compress their large database of fingerprints. Also, the baseline for next generation still-image coding standards (JPEG 2000) and DICOM medical image coding are based on the wavelet transform.

One of the interesting properties of the wavelet transform that is worth further explanation is that all the wavelet basis functions are obtained from one wavelet, i.e., the "mother" or prototype wavelet. This is done by performing dilation and shifting. Equation 1, below, shows how any signal, f(t), can be represented using the wavelet basis functions, $W_{jk}$, by using different amounts, $b_{jk}$, of each basis function. Equation 2 shows how the different basis functions are reconstructed from the mother wavelet, W(t), where $2^j$ is performing the dilation operation and k is performing the shifting operation.

$$f(t) = \sum_{j,k} b_{jk} W_{jk}(t) \quad (1)$$

$$W_{jk}(t) = W(2^j t - k) \quad (2)$$

Therefore, the wavelet basis functions have self-similarity at different resolutions. Also, the dilation enables wavelets to obtain shorter wavelet bases for high-frequency components and longer wavelet bases for low-frequency ones, whereby the wavelet decomposition has variable length windows for analyzing the signal. Thus making different spatial-frequency tradeoffs as compared to the fixed-size block DCT.

For digital signal or image signal processing, wavelets are easier to effect using digital signals, as opposed to analog, since the mother wavelet is able to specify a set of filters, i.e., the low-pass filter $h_0$ and the high-pass filter $h_1$. The result of filtering the image with the low-pass filter $h_0$ is that the low-frequency content of the image is described, while filtering the image with the high-pass filter $h_1$ the high-frequency (details) content of the image is described.

There is a simple relationship between the low-pass/high-pass filters and the scaling function and the wavelet function, as illustrated below in Equations 3 and 4, below.

$$\phi(t) = 2\sum_{k=0}^{N} h_0(k)\phi(2t - k) \quad (3)$$

$$W(t) = 2\sum_{k=0}^{N} h_1(k)\phi(2t - k) \quad (4)$$

By a natural limiting process, iteration of the low-pass filter leads to the scaling function where one high-pass filter then produces a wavelet.

The digital signal processing (DSP) engineer Mallat and the mathematician Daubechies found a one-to-one relationship between the properties of the filter coefficients in the filter bank and those of the wavelet and scaling functions. In the course of designing the two filters, $h_0$ and $h_1$, the filters were designed so that the wavelet functions may satisfy some particular properties (e.g., perfect reconstruction, orthonormal, discrete, smooth, compact support, symmetric, etc.). The contributions of Mallat and Daubechies were critical to the development to the field of digital signal and image processing. As Mallat, the DSP engineer, and Daubechies, the mathematician, came from diverse backgrounds their individual contributions actually complemented each other's as they discovered a useful link between wavelet theory and implementation thereof, i.e., filters with special properties are required in order to produce valid wavelets.

Figure 6A:
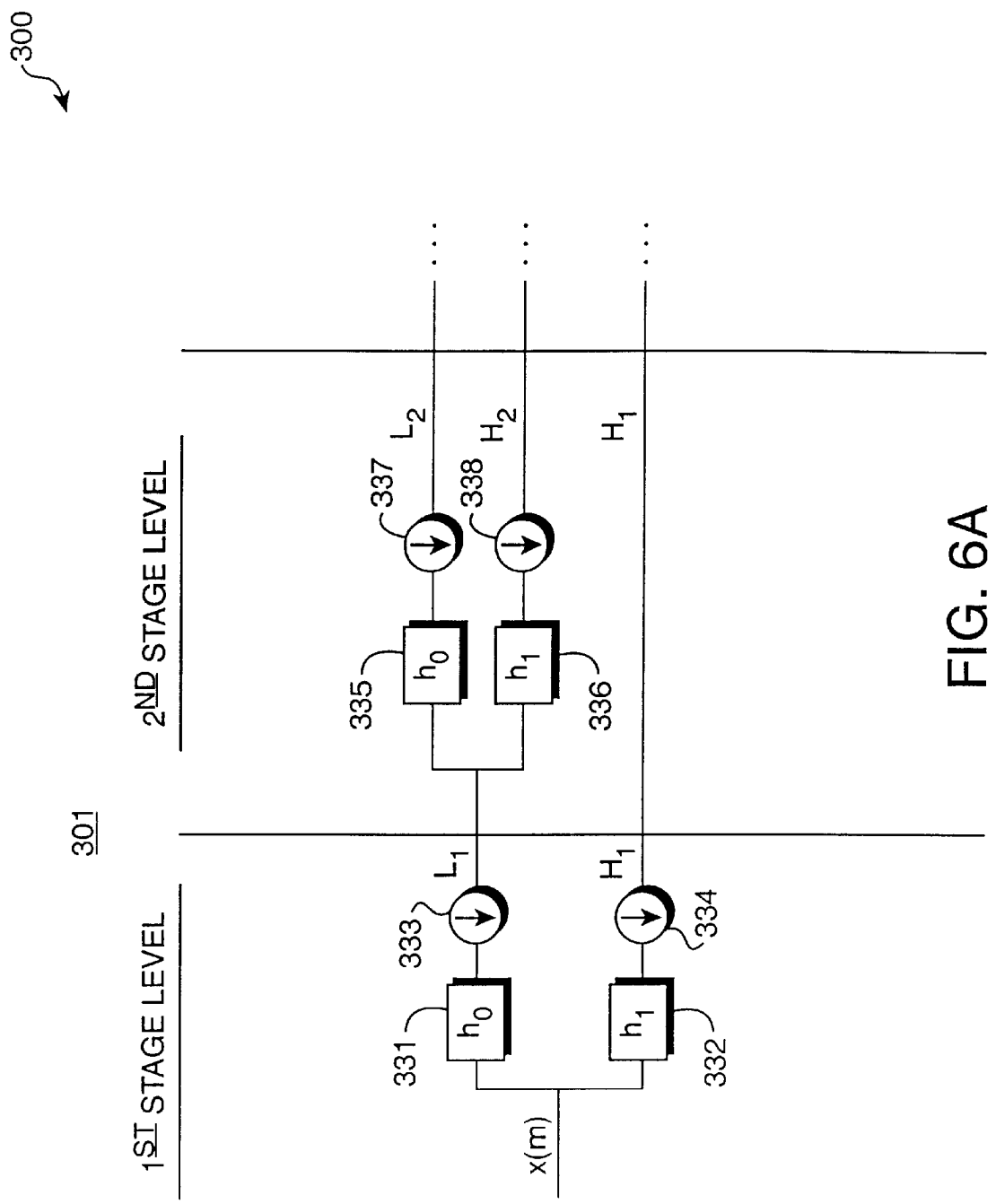
FIG. 6(A) is a schematic diagram of a decomposition tree illustrating one-dimensional decomposition using a wavelet transform apparatus.
Figure 7A:
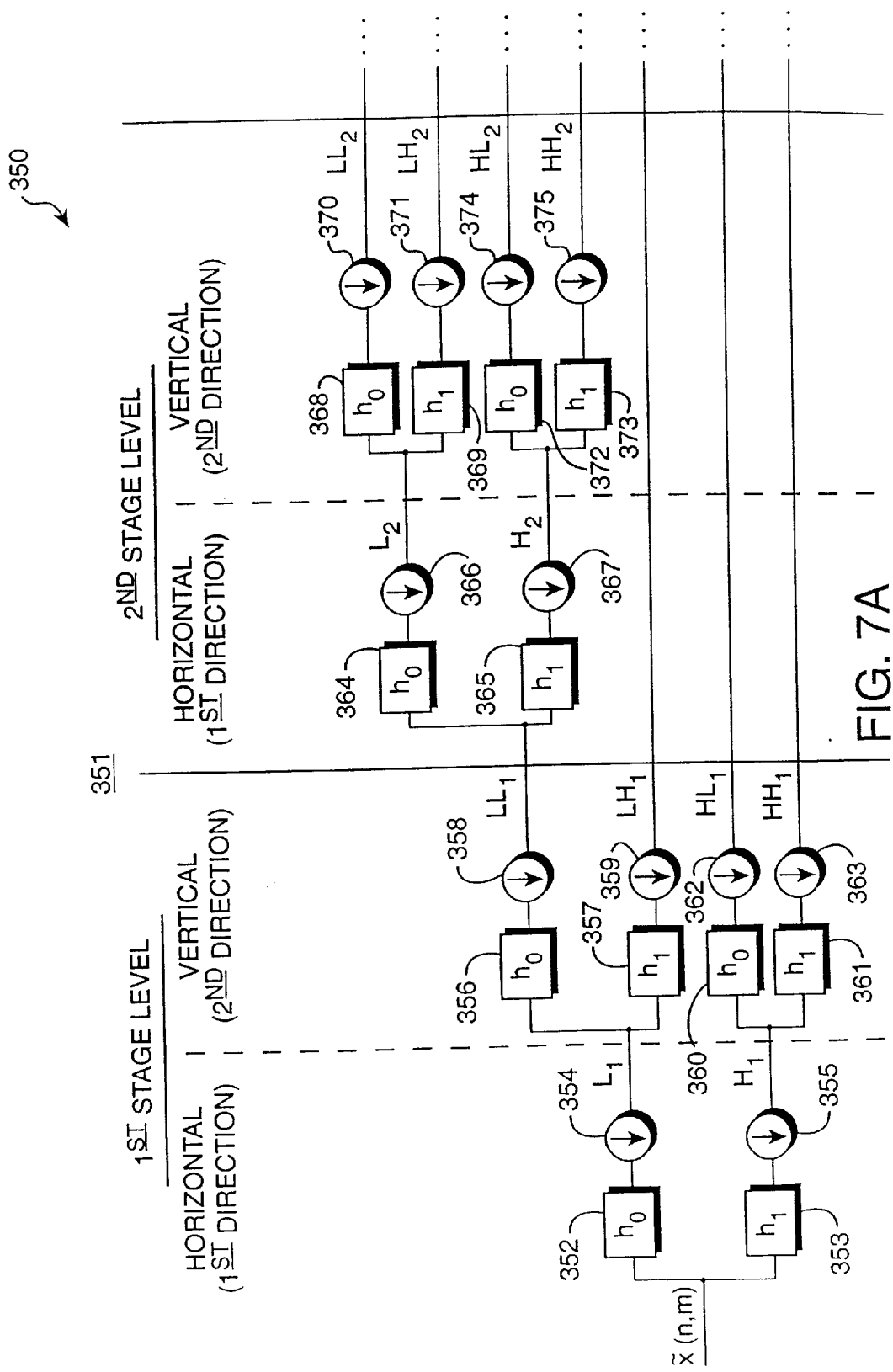
FIG. 7(A) is a schematic diagram of a decomposition tree illustrating two-dimensional decomposition using a wavelet transform apparatus.

The wavelets coefficients can be determined by iterating the filtering step, with a cascade-like fashion, in the filter bank. As illustrated in FIGS. 6(A) and 7(A), and what became known as the Mallat decomposition, filtering steps on the low-frequency band are repeatedly (i.e., sequentially or recursively) applied to a signal. FIG. 6(A) shows an example of a conventional discrete wavelet transform 301 in one-dimension which was implemented by cascading (two times) the two-band filter bank structure. The number of stage levels in the wavelet decomposition, meaning the number of times the two-band analysis is repeated, can be changed depending on the application. FIG. 7(A) illustrates two levels of filter banks associated with processing two-dimensional signals. FIGS. 6(A) and 7(A) will be discussed later in greater detail.

However, it should be noted that it is widely recognized that there are other variations to implement fast algorithm wavelets and inverse wavelets in addition to the cascade-like fashion filter banks (reconstruction and decomposition trees) as illustrated in FIGS. 6 and 7. The reconstruction and decomposition trees are merely a symbol of wavelet algorithms since such trees are intended to be exemplary rather than limiting. For example, lattice-like structures, lifting, or other embodiments both presently known or variations and modifications thereof would be applicable to the linear filtering of the present invention.

Figure 3A:
FIGS. 3(A) and (B) illustrate the Lena image that has been decomposed using the wavelet transform (i.e., "Daubechies 6 Wavelet") using four levels of decomposition.
Figure 3B:

FIGS. 3(A) and (B) show an original image of Lena and the amplitude of its wavelet transform coefficients, respectively. Moreover, FIGS. 3(A) and (B) illustrate the Lena image that has been decomposed using the wavelet transform (i.e., "Daubechies 6 Wavelet") using three repeated decompositions of the filter bank for each of the rows (e.g. first direction) and the columns (e.g. second direction). As is commonly known, the number of iterations in the wavelet transform are referred to as stage levels. Typically, in the practice of image coding or noise reduction, four stage levels of decomposition are useful with images in the range of 700×500 pixels or greater. The resulting band at the highest level of the wavelet transform resembles a small version of the original image and contains its low-frequency component, $y_0$. To obtain the low-frequency component, $y_0$, the filter bank structure is applied for both the rows (e.g., first direction) and columns (e.g. second direction) of the image, and the process of filtering the image with the low-pass filter, $h_0$, is repeated and down-sampled three times. The resulting image is called the low-frequency band in the wavelet transform.

2. WAVELET TREE AND IMAGE PIXEL ARRAY

Figure 4:
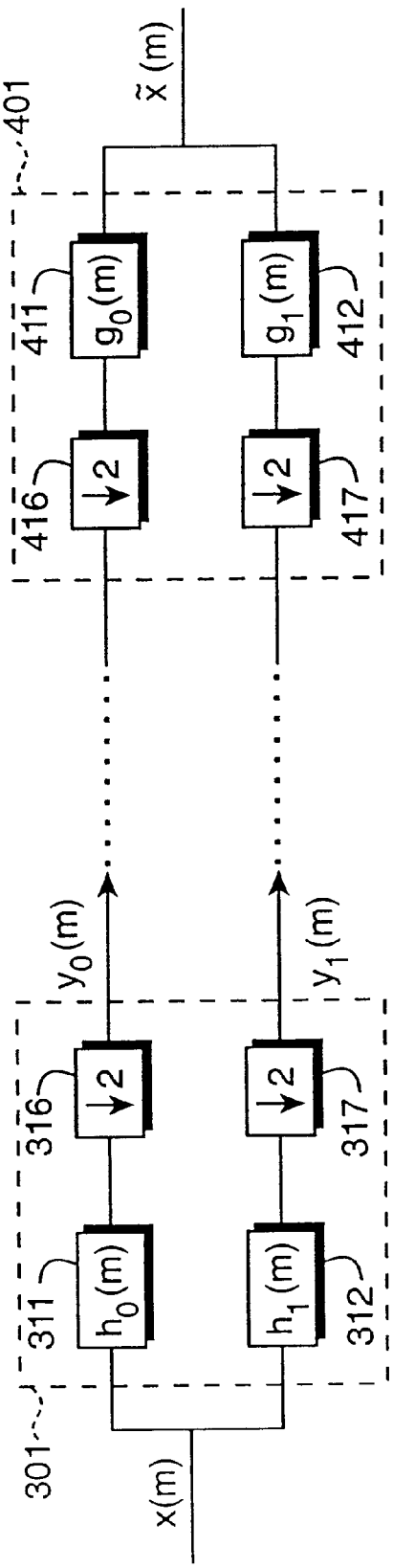
FIG. 4 is a block diagram of a wavelet/inverse wavelet transform two-band filter bank where the left side is the analysis section and the right side is the synthesis section.

FIG. 4 shows the block diagram for a wavelet/inverse wavelet transform two-band filter bank where the left side is the analysis section 300 and the right side is the synthesis section 400. Further, a wavelet transform apparatus 301 is defined by a pair of analysis filters having a low-pass filter $h_0(n)$ 311 and high-pass filter $h_1(n)$ 312. The wavelet analysis low-pass filter $h_0(n)$ 311 and high-pass filter $h_1(n)$ 312 are applied to an input signal x(n), and the outputs are decimated by 2 (critically sub-sampled) by the down-samplers (decimators) 316 and 317, respectively, to generate the transformed signals $y_0(n)$ and $y_1(n)$, referred to herein as low-passed and high-passed coefficients (portions) respectively. Moreover, it is well known that the down-samplers 316 and 317 may be applied prior to the low-pass filter $h_0(n)$ 311 and high-pass filter $h_1(n)$ 312, as the wavelet filter bank is merely a symbol for fast wavelet algorithms. The wavelet transform apparatus 301 as shown in FIG. 4, is connected to an inverse wavelet apparatus 401 of the synthesis section 400. The transformed signals $y_0(n)$ and $y_1(n)$ are up-sampled by 2 (i.e., a zero is inserted after every term) using the up-samplers (interpolators) 416 and 417, respectively, and then passed through the low-pass filter $g_1(n)$ 411 and high-pass filter $g_1(n)$ 412. Again, it is well known that the up-samplers 416 and 417 may be applied after the low-pass filter $g_0(n)$ 411 and high-pass filter $g_1(n)$ 412, as the inverse wavelet filter bank is merely a symbol for fast inverse wavelet algorithms. The output of the synthesis filters $g_1(n)$ 411 and $g_1(n)$ 412 recombines the signal into a full band to produce $\tilde{x}(n)$. The above described low-pass and high-pass filters performs a multi-resolution decomposition. The number of levels of composition is variable and may be any number; however, typically the number of decomposition levels equals from one to five levels.

Figure 5A:
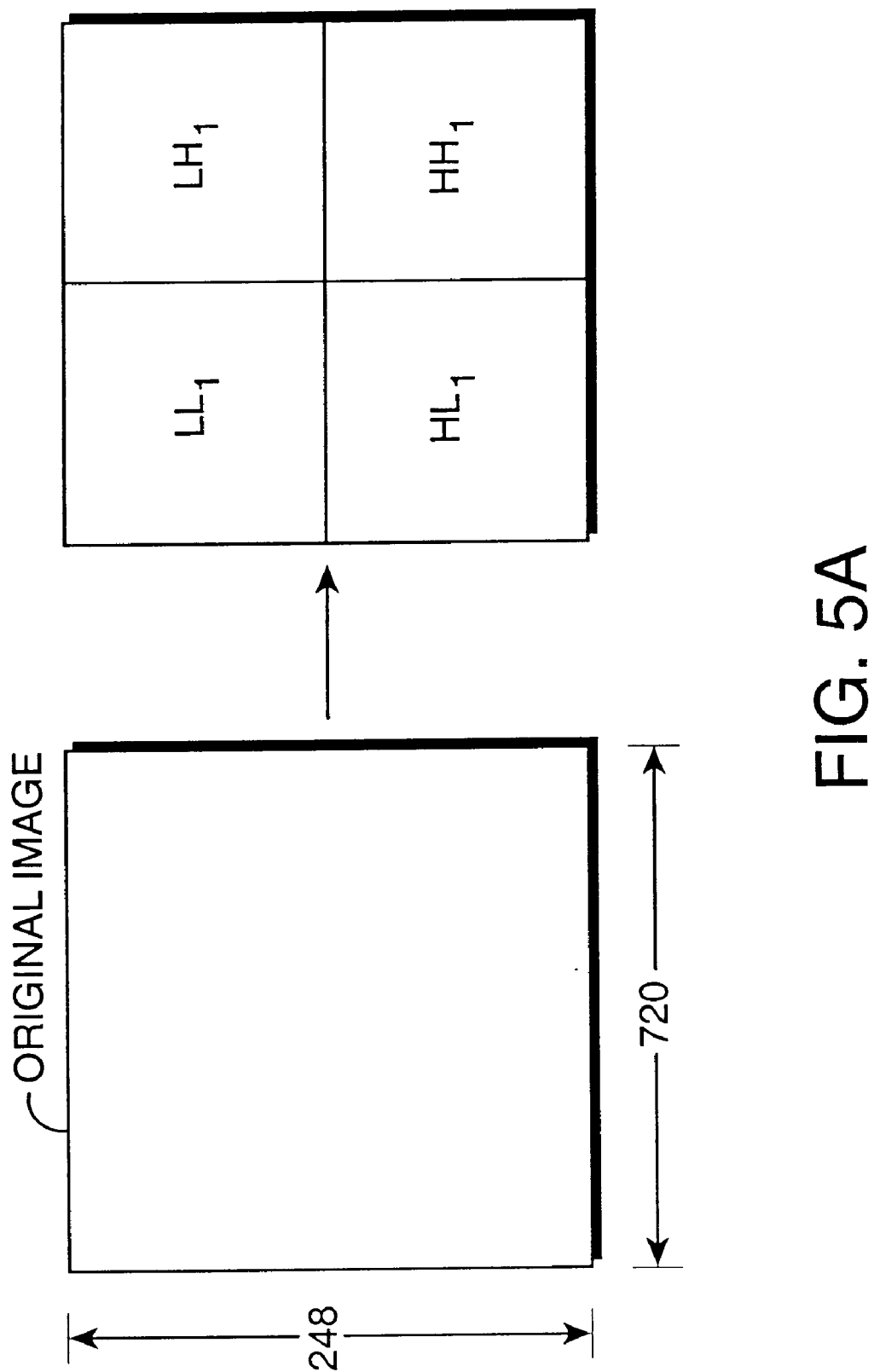
FIGS. 5(A), 5(B), and 5(C) are schematic diagrams for explanation of two-dimensional dividing of the signal based on the wavelet transform using one stage and three stage decomposition.
Figure 5B:
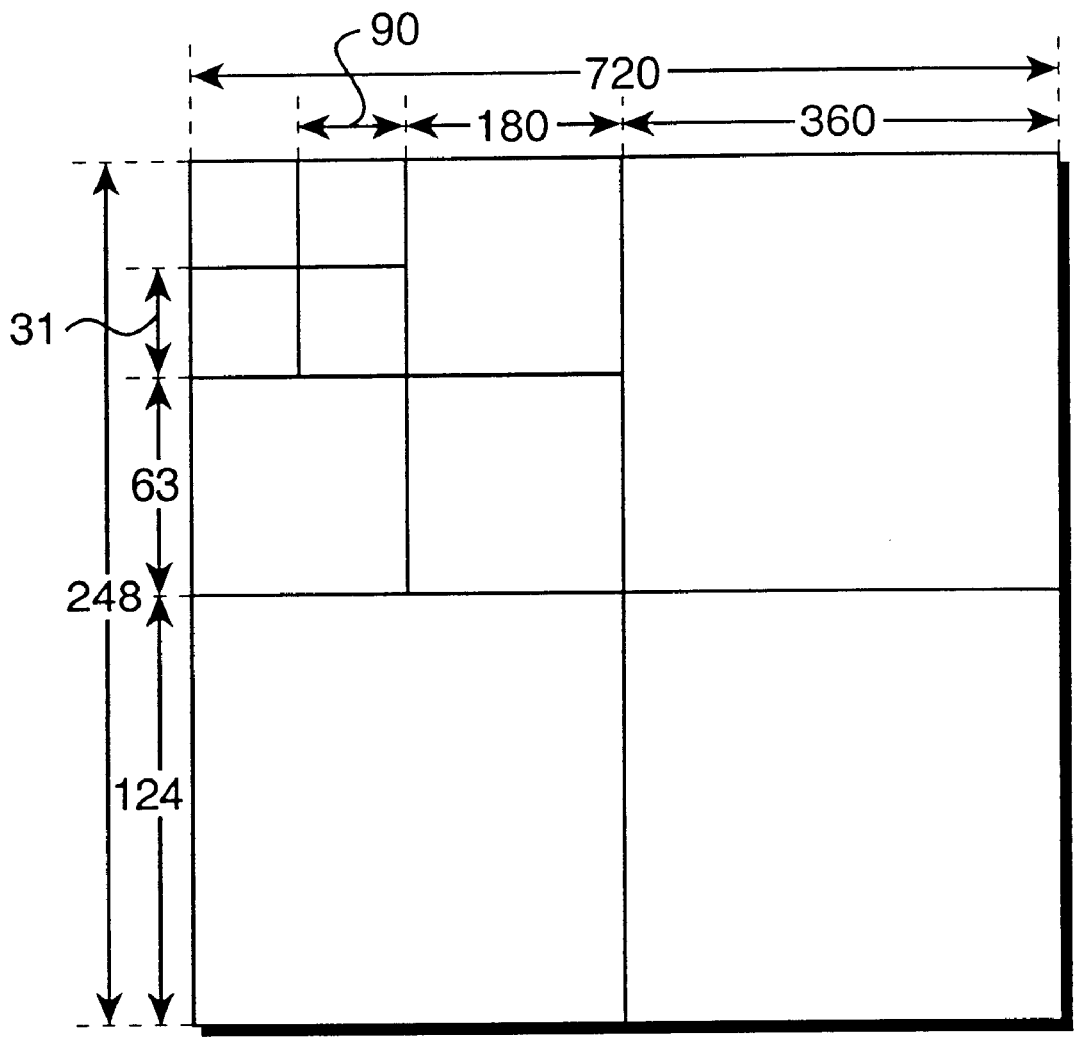
Figure 5C:
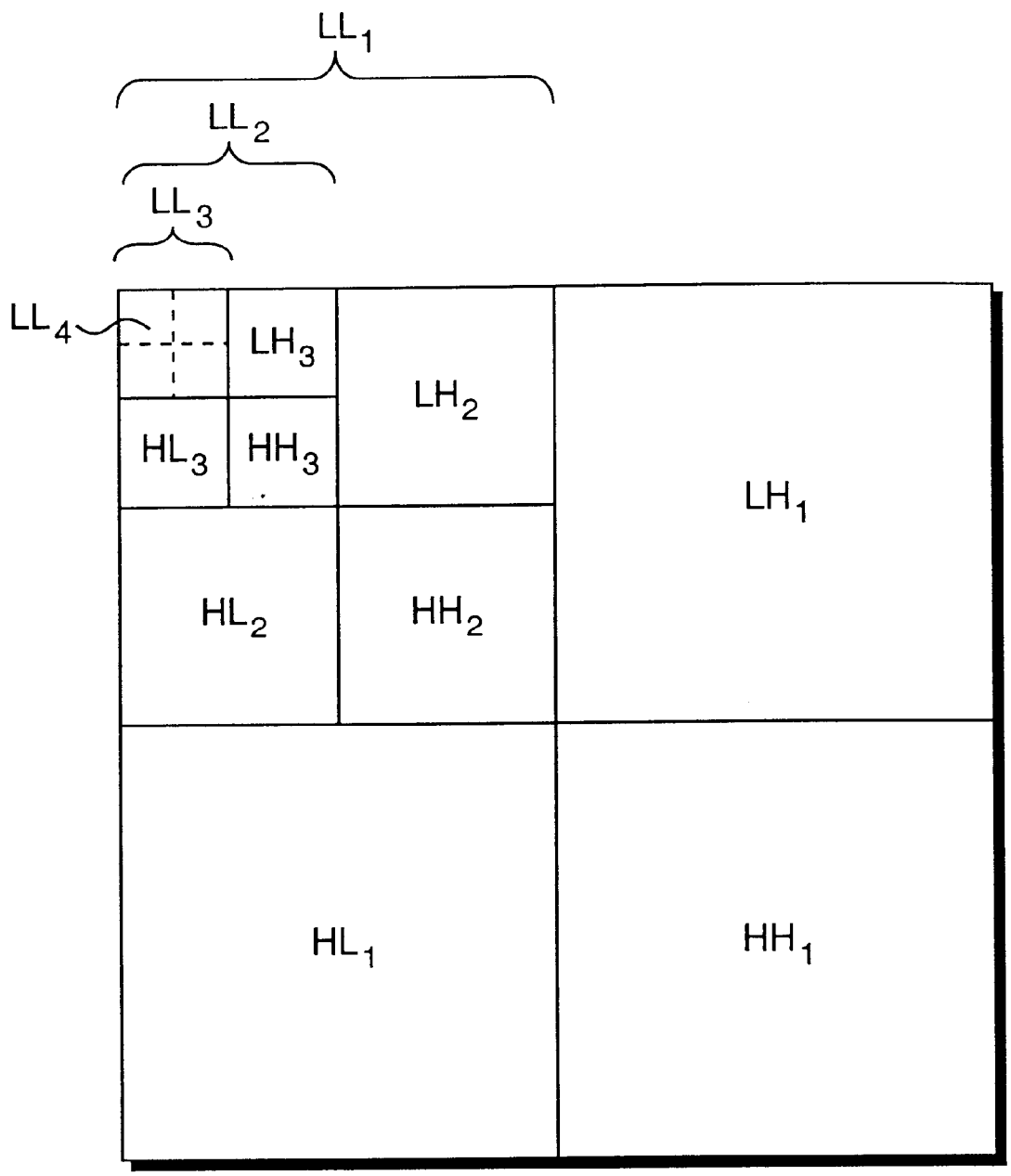

Turning to FIGS. 5(A)–(C), if the wavelet transform is recursively applied to an image, the first level of decomposition operates on the finest detail. As illustrated in FIGS. 5(A)–(C), an image signal for one field of 720 pixels×248 lines is recursively divided into four layers sequentially in horizontal and vertical directions (i.e., the first and second directions), thereby obtaining the pieces of coefficient data. At a first decomposition level, the image is decomposed into four sub-images wherein each sub-band represents a band of spatial frequencies. The first level sub-bands are designated $LL_1$, $LH_1$, $HL_1$ and $HH_1$. The process of decomposing the original image (i.e., two-dimensional signal) involves sub-sampling by two in both horizontal (e.g., first) and vertical (e.g., second) directions, such that the first level sub-bands $LL_1$, $LH_1$, $HL_1$ and $HH_1$ each have one-fourth as many coefficients as the input has pixels (or coefficients) of the original image. Of course it is well known that two-dimensional processing constitutes one-dimensional processing in two directions, a horizontal direction and a vertical direction; or said differently, in a first direction and a second direction. Similarly, a three-dimensional processing case would require performing one additional directional processing beyond the two-dimensional signal processing case.

Sub-band $LL_1$ contains simultaneously low-frequency horizontal (first direction) and low-frequency vertical (second direction) information. Typically a large portion of the image energy is concentrated in this sub-band. Sub-band $LH_1$ contains low-frequency horizontal (first direction) and high-frequency vertical (second direction) information (e.g., horizontal edge information). Sub-band $HL_1$ contains high-frequency horizontal (first direction) information and low-frequency vertical (second direction) information (e.g., vertical edge information). Sub-band $HH_1$ contains high-frequency horizontal (first direction) information and high-frequency vertical (second direction) information (e.g., texture or diagonal edge information).

As shown in FIGS. 5(A)–(C), each of the succeeding second, third and fourth lower decomposition levels is produced by decomposing the low-frequency LL sub-band of the preceding level. Or said differently, the wavelet transform comprises recursively ascending, in a cascade-like fashion, decomposition analysis stage levels. This sub-band $LL_1$ of the first stage level is decomposed to produce sub-bands $LL_2$, $LH_2$, $HL_2$ and $HH_2$ of the moderate detail second stage level. Similarly, sub-band $LL_2$ is decomposed to produce coarse detail sub-bands $LL_3$, $LH_3$, $HL_3$ and $HH_3$ of the third stage level. Also, sub-band $LL_3$ may also be decomposed to produce coarser detail sub-bands $LL_4$, $LH_4$, $HL_4$ and $HH_4$ of the fourth stage level (shown in phantom lines in FIG. 5(C)). Due to sub-sampling by two, each succeeding level sub-band is one-fourth the size of the original image or parent image.

One skilled in the art recognizes that FIGS. 5(A)–(C) are merely intended to be illustrative representations of a wavelet decomposition. In particular, the wavelet decomposition shown in FIG. 5 is a Mallat type wavelet whereby the low frequency component always gets decomposed. Alternatively, many other wavelet types exist wherein just the high frequency component is decomposed, both the low and the high frequency components are decomposed, or a combination of the low and high components.

Each sample (e.g., pixel or pel) at the first stage level represents moderate detail in the original image at the same location having a sub-band that is ¼ the size of the original image. Similarly, each second stage level sub-band is 1/16 the size of the original image. Each pixel or pel at this second stage level corresponds to relatively coarse detail in the original image at the same location. Also, each third stage level and fourth stage level sub-band is 1/64 and 1/256 the size of the original image, respectively.

A parent-child relationship exists between a sub-band component representative of coarse detail relative to a corresponding sub-band component at the next finer detail level; each parent has four corresponding children. Although only four sub-band decomposition levels are shown in FIG. 5(C), additional levels could be developed in accordance with the requirements of a particular apparatus or method.

Referring to FIG. 6(A), the decomposition tree illustrates a one-dimensional multi-resolution decomposition using a wavelet transform apparatus 301 as part of the analysis section 300. An input signal x(n) represented by a one-dimensional signal array is low-pass and high-pass filtered by wavelet filters 331 and 332 before being sub-sampled by two via decimators 333 and 334. A sub-sampled output signal $L_1$ from wavelet filter 333 is low-pass and high-pass filtered by wavelet filters 335 and 336 in the second stage level before being sub-sampled by two via decimators 337 and 338, respectively. Sub-band components $L_2$ and $H_2$ appear at respective outputs of the second stage level decimators 337 and 338.

Similarly, referring to FIG. 7(A), the decomposition tree illustrates a wavelet transform apparatus 351 in the wavelet analysis section 350 wherein the wavelet filtering is performed on a two-dimensional signal x(n, m), e.g., a two-dimensional image signal array. The principles of the wavelet transform apparatus 351 are the same as discussed for the one-dimensional application in FIG. 6(A), as it is well known that two-dimensional processing can be achieved by one-dimensional processing in two directions—a horizontal direction and a vertical direction; or said differently, in a first direction and a second direction. The wavelet transform apparatus 351 represented by FIG. 7(A) includes two cascading stage levels (i.e., two recursively or sequentially ascending decomposition analysis stage levels) of four-band analysis filter circuits. At the first stage level, an input signal x(n, m) representing a two-dimensional signal is low-pass and high-pass filtered in the first direction (e.g., horizontal direction) by wavelet filters 352 and 353 before being sub-sampled by two via decimators 354 and 355, respectively, to generate a first direction low ($L_1$) frequency component signal (portion or coefficient) and a first direction high ($H_1$) frequency component signal (portion or coefficient). The first direction low ($L_1$) frequency component signal is then low-pass and high-pass filtered in a second direction by wavelet filters 356 and 357 before being sub-sampled by two via decimators 358 and 359 to generate a horizontal low vertical low ($LL_1$) wavelet frequency component signal (portion or coefficient) and a horizontal low and vertical high ($LH_1$) wavelet frequency component signal (portion or coefficient). Similarly, the first direction high ($H_1$) frequency component signal is then low-pass and high-pass filtered in a second direction by wavelet filters 360 and 361 before being sub-sampled by two via decimators 362 and 363 to generate a horizontal high vertical low ($HL_1$) wavelet frequency component signal (portion or coefficient) and a horizontal high vertical high ($HH_1$) wavelet frequency component signal (portion or coefficient).

Next, at the second stage level (herein being the last stage level or Nth stage level in this particular illustration) a sub-sampled output signal $LL_1$ that is received from wavelet filter 356 is low-pass and high-pass filtered in the first direction by wavelet filters 364 and 365 in the second stage level before being sub-sampled by two via decimators 366 and 367, respectively, to generate a first direction low ($L_2$) frequency component signal and a first direction high ($H_2$) frequency component signal. The first direction low ($L_2$) frequency component signal is then low-pass and high-pass filtered in a second direction by wavelet filters 368 and 369 before being sub-sampled by two via decimators 370 and 371 to generate a horizontal low vertical low ($LL_2$) wavelet frequency component signal and a horizontal low and vertical high ($LH_2$) wavelet frequency component signal. Similarly, the first direction high ($H_2$) frequency component signal is then low-pass and high-pass filtered in a second direction by wavelet filters 372 and 373 before being sub-sampled by two via decimators 374 and 375 to generate a horizontal high vertical low ($HL_2$) wavelet frequency component signal and a horizontal high vertical high ($HH_2$) wavelet frequency component signal.

Figure 7B:
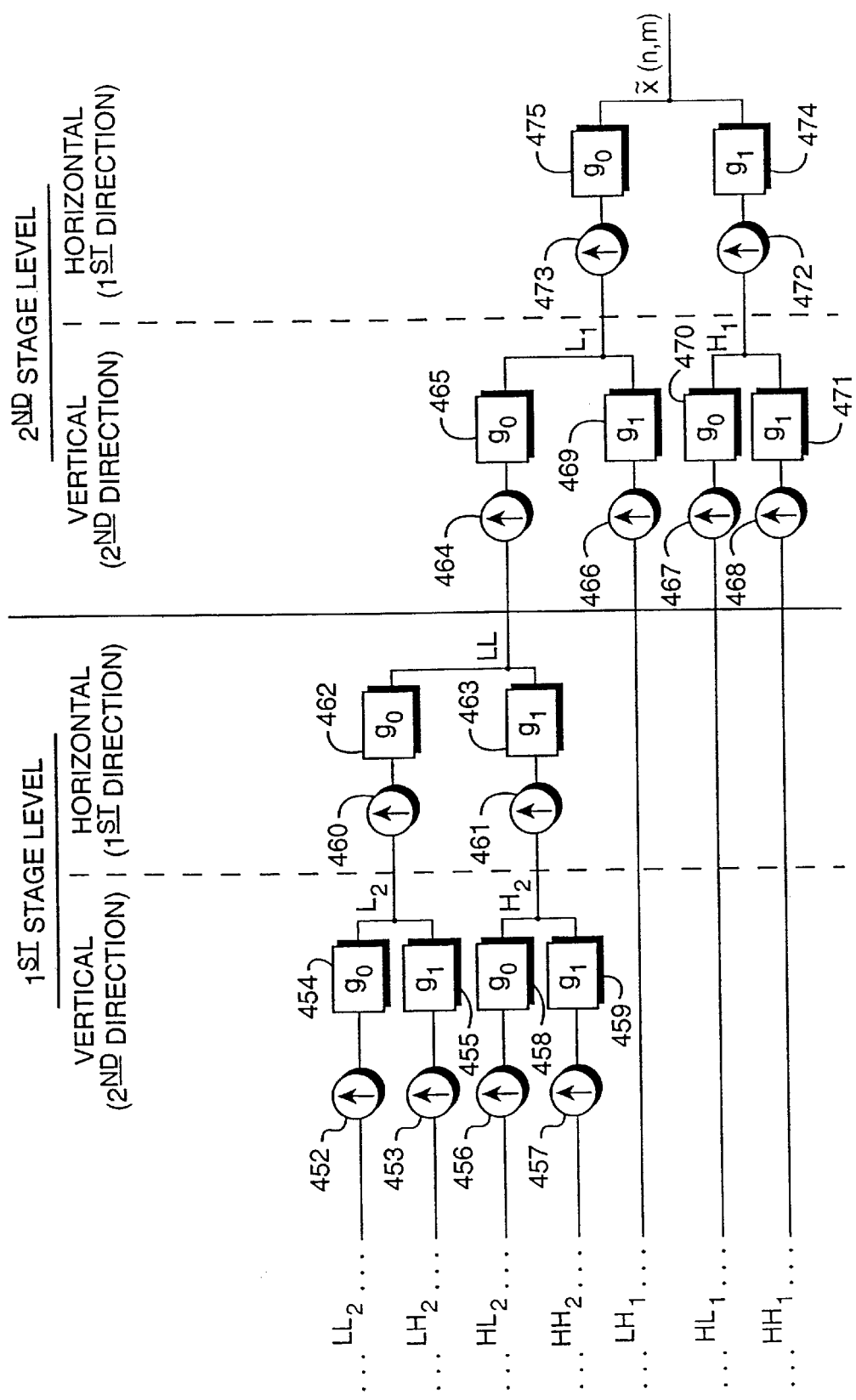
FIG. 7(B) is a schematic diagram of a reconstruction tree illustrating two-dimensional recomposition using an inverse wavelet transform apparatus.

As discussed in FIGS. 7(A)–(B), the wavelet transform performed on the two-dimensional signal x(n, m) can be implemented in the row-column fashion. Alternatively, as one skilled in the art appreciates, the two-dimensional signal x(n, m) could be transformed using a direct or true two-dimensional wavelet basis function, i.e., using a wavelet filter which is itself two-dimensional.

Figure 6B:
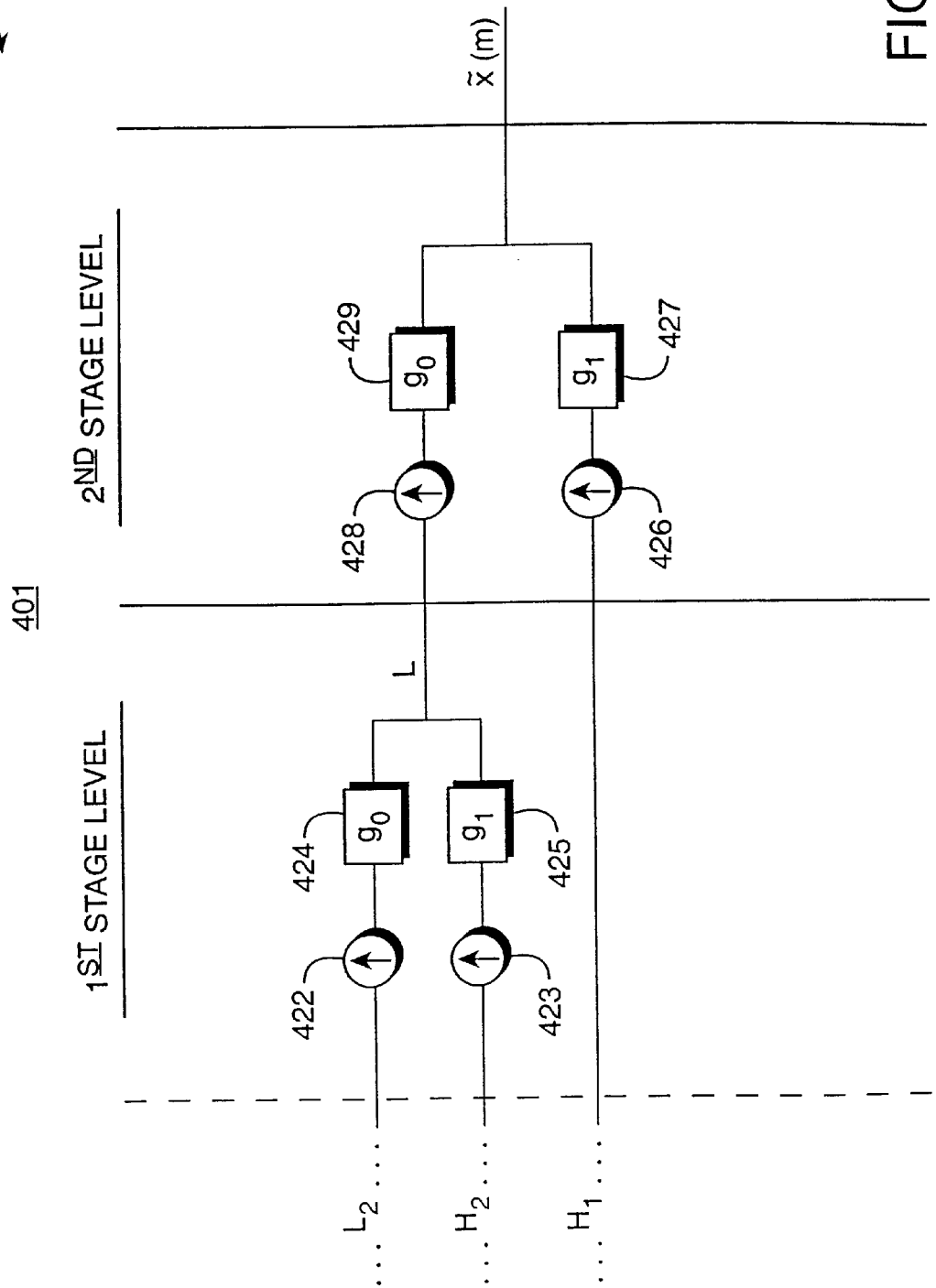
FIG. 6(B) is a schematic diagram of a reconstruction tree illustrating one-dimensional recomposition using an inverse wavelet transform apparatus.

Next, FIGS. 6(B) and 7(B) show inverse wavelet transform apparatuses depicted as 401 and 451, respectively, for synthesis reconstruction of one-dimensional and two dimensional signals, respectively. Reversing the wavelet decomposition analysis process (and compression process where applicable) requires the reconstruction inverse wavelet synthesis process (or decompression process where applicable) side of the scheme. Essentially, the same steps used for decomposition are used in reverse order to accomplish the reconstruction. The operations of the wavelet analysis apparatuses 301 and 351, shown in FIGS. 6(A) and 7(A), are inverted to form the inverse wavelet synthesis apparatuses depicted as 401 and 451.

For example, the IWT reconstruction apparatus 401 as shown by the reconstruction tree in FIG. 6(B), utilizes the same number of stage levels (two) as present in the wavelet transform apparatus 301 illustrated in FIG. 6(A). The first inverse wavelet synthesis stage level receives from the last analysis stage level, i.e., the corresponding analysis stage level, of FIG. 6(A) of the wavelet transform 301 two sub-signals (portions or coefficients), including one high-pass filtered $H_2$ and one low-pass filtered $L_2$. These two sub-signals correspond to the sub-signals output by the second wavelet analysis stage of the wavelet filtering apparatus 301. Each sub-signal has ¼ the number of coefficients as the original one-dimensional signal, x(n). In particular, the wavelet coefficients $L_2$ and $H_2$ are up-sampled by interpolators 422 and 423 before being recombined by an inverse wavelet low-pass filter 424 and high-pass filter 425.

Next, still referring to FIG. 6(B), the image received by the second inverse wavelet synthesis stage level (herein being the last stage level or Nth stage level in this particular illustration) has ½ the number coefficients of the original one-dimensional signal. The second inverse wavelet synthesis stage level of the IWT reconstruction apparatus 401 receives from the corresponding first wavelet analysis stage level of the wavelet transform 301 (as shown in FIG. 6(A)) a sub-signal including the high-pass $H_1$ filtered wavelet coefficient. The high-pass $H_1$ filtered wavelet coefficient is up-sampled by the interpolator 426 before being filtered by the inverse wavelet high-pass filter 427. Also, the low-pass L wavelet coefficient that is output by the first inverse wavelet synthesis stage level is received by the second stage level of the inverse wavelet synthesis and is up-sampled by interpolator 428 before being filtered by the inverse wavelet low-pass filter 429. The resulting signal after the inverse wavelet low-pass filter 429 and high-pass filter 427 are recombined to form the original one-dimensional signal $\tilde{x}(n)$.

With regards to two-dimensional processing, the IWT reconstruction apparatus 451, as shown in FIG. 7(B), utilizes the same number of stage levels (two) as present in the wavelet transform apparatus 351 illustrated in FIG. 7(A). The first inverse wavelet synthesis stage level receives from the last analysis stage level, i.e., the corresponding analysis stage level, of FIG. 7(A) of the wavelet transform 351 four sub-images (portions or coefficients), including: one high-pass filtered in both horizontal and vertical directions ($HH_2$); one high-pass filtered in the horizontal direction and low-pass filtered in the vertical direction ($HL_2$); one low-pass filtered in the horizontal direction and high-pass filtered in the vertical direction ($LH_2$); and one low-pass filtered in both horizontal and vertical directions ($LL_2$). Each sub-image has ¼ the height and ¼ the width of the original image and therefore has 1/16 the number of pixels as the original image. These four sub-images correspond to the four sub-images output by the second wavelet analysis stage level of the wavelet transform filtering apparatus 351.

In particular, the wavelet coefficients $LL_2$ and $LH_2$ are up-sampled by interpolators 452 and 453 before being recombined in the second direction by an inverse wavelet low-pass filter 454 and high-pass filter 455. Similarly, the wavelet coefficients $HL_2$ and $HH_2$ are up-sampled by interpolators 456 and 457 before being recombined in the second direction by the inverse wavelet low-pass filter 458 and high-pass filter 459.

Still in the first inverse wavelet synthesis stage level, the recombined wavelet coefficients in the second direction ($L_2$ and $H_2$) are then up-sampled by interpolators 460 and 461 before being recombined in the first direction by the inverse wavelet low-pass filter 462 and high-pass filter 463.

Next, as shown in FIG. 7(B), the image received in the second inverse wavelet synthesis stage level (herein being the last stage level or Nth stage level) has ½ the height and ½ the width of the original image and therefore has ¼ the number of pixels as the original image. The second synthesis stage level of the IWT reconstruction apparatus 451 receives from the corresponding second wavelet analysis stage level of the wavelet transform 351 (as shown in FIG. 7(A)) three sub-images including: one high-pass filtered in both horizontal and vertical directions ($HH_1$); one high-pass filtered in the horizontal direction and low-pass filtered in the vertical direction ($HL_1$); and one low-pass filtered in the horizontal direction and high-pass filtered in the vertical direction ($LH_1$), as well as receiving one combined sub-image LL from the output of the first inverse wavelet synthesis stage level.

In particular, as shown in FIG. 7(B), at the second stage level of the inverse wavelet synthesis 450 the recombined wavelet coefficients (LL), i.e., portions or sub-images, are received from the first inverse wavelet synthesis stage level and are up-sampled by interpolator 464 before being filtered in the second direction by the inverse wavelet low-pass filter 465. Also, the horizontal direction low vertical direction high ($LH_1$) wavelet coefficients, the-horizontal direction high vertical direction low ($HL_1$) wavelet coefficients, and the horizontal direction high vertical direction high ($HH_1$) wavelet coefficients output by the corresponding (first) wavelet analysis stage level are received by the second stage level of the inverse wavelet synthesis 450 and are up-sampled by interpolators 466, 467, and 468, respectively, before being recombined in the vertical direction by the inverse wavelet high-pass filter 469, and the low-pass and high-pass filters 470 and 471, respectively.

Thereafter, in the horizontal direction (first direction) of the second inverse wavelet synthesis stage level, the two sub-images, $L_1$ and $H_1$, received from the vertical direction (second direction) of the second inverse wavelet synthesis stage level are combined as the reconstructed image. In particular, the recombined inverse wavelet coefficients in the vertical direction ($L_1$ and $H_1$) are up-sampled by interpolators 472 and 473 before being recombined in the horizontal direction by the inverse wavelet low-pass filter 474 and high-pass filter 475, respectively. The reconstructed image $\tilde{x}(n, m)$ has the same height and the same width of the original image, i.e., it has the same number of pixels as the original image.

3. PRESENT INVENTION OVERVIEW

Figure 8:
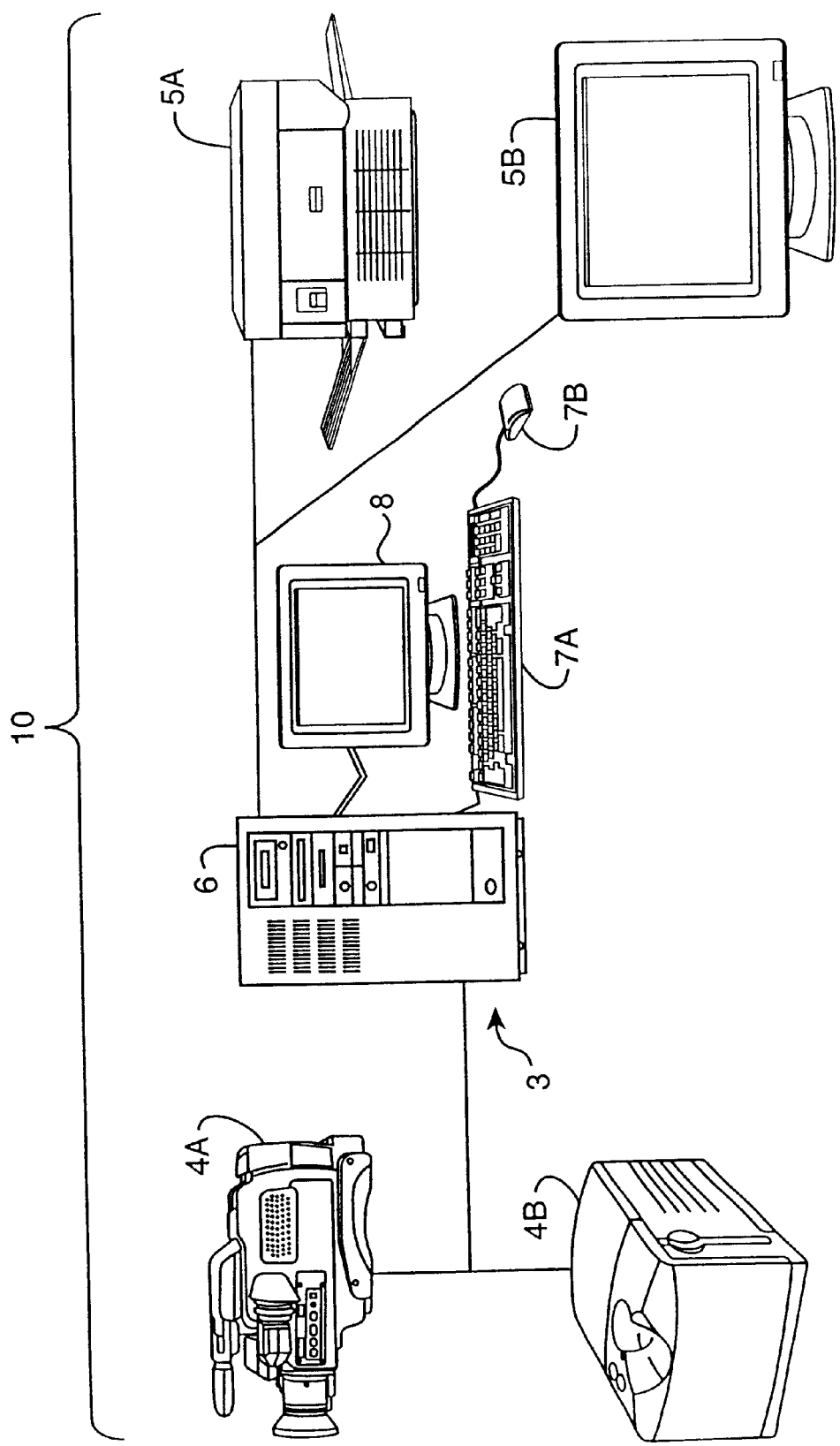
FIG. 8 is a block diagram of a basic digital signal processing system that includes an image acquisition and rendering apparatus.

Various applications of the present invention are possible. For example, FIG. 8 is a diagram of an image acquisition and rendering apparatus 10 that could include the linear filtering apparatus 9 which linear filters with filters of any desired shape or length using the wavelet and inverse wavelet transform as the computation engine by modifying the wavelet basis function; and is constructed in accordance with the principles of the invention. The linear filtering apparatus 9 could be housed completely, or in part, in an image acquisition device 4A or 4B, in a processor module 6, in a video display device 8, or in an image rendering device 5A or 5B. With reference to FIG. 8, the image acquisition and rendering apparatus 10 in one embodiment includes: a computer 3; one or more image acquisition devices represented by a camera 4A (e.g., photographic, video, ultrasound, CCD or radiographic devices) and a document or page scanner 4B (generally identified by reference numeral 4), for acquiring or sensing an image and converting it to digital image data, signal, or array; and one or more image rendering devices represented by a printer 5A and a video output or monitor 5B (generally identified by reference numeral 5) for generating an output image. The computer 3, which in one embodiment is a general-purpose stored-program digital computer which comprises the linear filtering apparatus 9, receives the digital image data or signal and processes it, for example, as described below in connection with FIGS. 9–14 for rendering by an image rendering device 5.

It will be apparent to those skilled in the art that the image acquisition and rendering apparatus 10 described above could be substituted with other apparatuses for processing other types of digital signals other than imaging, such as, for example, processing audio signal data, video signal data, or multi-media signal data.

As is conventional, the computer 3 includes: a processor module 6; operator interface elements comprising operator input components such as a keyboard 7A and/or a mouse 7B (generally identified by reference numeral 7); and operator output elements such as a video display device 8. The processor module 6 includes, for example, processor, memory and mass storage devices such as magnetic disk, CD-ROM and/or tape storage elements (not separately shown in FIG. 8) which perform processing and storage operations in connection with digital signal data provided thereto. When operating as the linear filtering apparatus 9, the computer 3 will generally be executing programs which enable it to perform selected linear filtering operations in the wavelet and inverse wavelet domains as described below in connection with FIGS. 9–14, to process digital image or digital signal data. The operator input elements 7 are provided to permit an operator to input information for processing. The video display device 8 is provided to display output information to the operator. Although the computer 3 is shown as comprising particular components, such as the keyboard and mouse for receiving input information from an operator, and a video display device 8 for displaying output information to the operator, it will be appreciated that the computer 3 may include a variety of components in addition to or instead of those depicted in FIG. 8.

Although one embodiment of the linear filtering apparatus 9 has been indicated as comprising elements of a general-purpose stored-program computer 3, it will be apparent to those skilled in the art that the linear filtering apparatus 9 may alternatively include special-purpose hardware and/or program components, or a combination of a computer 3 with special-purpose hardware and/or program components.

Computer useable medium having computer readable code means embedded or encoded thereon is also contemplated. In such an article of manufacture, the computer readable program code means will comprise various means for implementing the method disclosed herein. By way of example, and not limitation, suitable computer useable media include magnetic disks (both fixed and removable), optical disks, compact disks, magnetic tape, volatile memory, nonvolatile memory, and the like. In these articles of manufacture the term "embedded thereon" should be read to include the various methods of encoding computer readable program code means so they are contained on or in the computer usable media.

Throughout this application, the present invention is described, most often, in relation to image or visual signal data. However, the present invention is not so limited and references to image or visual signal data should not be construed as limiting the scope of this invention. The invention will also work with audio or other data perceived by the human or artificial senses. Thus, references to image or visual signal data are to be considered as illustrative examples.

Figure 9:
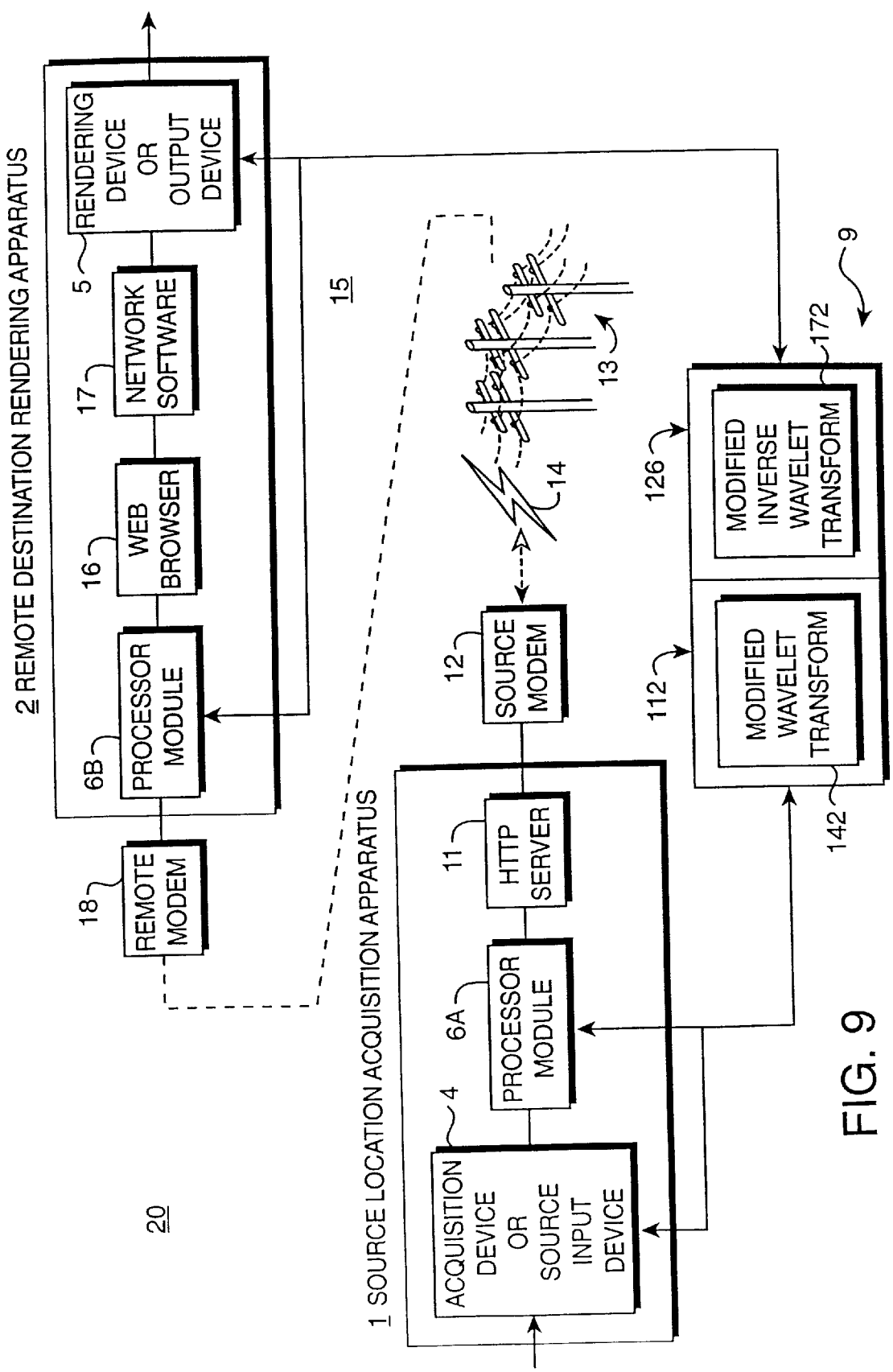
FIG. 9 is a block diagram of the linear filtering apparatus, using the wavelet/inverse wavelet transform, as part of a networked image acquisition arid rendering apparatus.

For illustration purposes, another application of the present invention is shown in FIG. 9. FIG. 9 shows the linear filtering apparatus 9, using the wavelet/inverse wavelet transform, as part of a networked image acquisition and rendering apparatus 20 which can process the signal data with its acquisition apparatus 1 at a source location and/or with its rendering apparatus 2 at a remote destination location. The application of a networked imaging system is disclosed in U.S. Pat. No. 5,851,186 to Wood et al., and is herein incorporated by reference. Referring to the present invention, the networked apparatus 9 includes a number of conventional components including the acquisition device 4 (or source input device), the processor module 6A, which includes, for example, processor, memory, and storage devices such as disk and/or tape storage element, (not separately shown in FIG. 9) which perform processing in connection with the digital or analog data provided thereto. Further, in accordance with the principles of the present invention the processor module 6A at the source location further includes a Hyper Text Transport Protocol (HTTP) server 11. The HTTP server 11 is connected to access the transformed images or signals output from the wavelet transform apparatus 112 of the linear filter apparatus 9 and makes the transformed images or signals accessible to a remote destination, such as the rendering apparatus 2.

The wavelet transform device 112 with the modified wavelet transform (MWT) 142 and the inverse wavelet transform device 126 with the modified inverse wavelet transform (MIWT) 172 of the linear filtering apparatus 9 may be located independent of each other at the source location apparatus 1 and at the remote destination location apparatus 2, respectively. Alternatively, the wavelet transform device 112 and the inverse wavelet transform device 126 may be located together at either the source location apparatus 1 or the remote destination location apparatus 2.

Still referring to FIG. 9, located at a remote destination is the rendering device 5 and a processor module 6B, which includes, for example, processor, memory, and storage devices such as disk and/or tape storage element, (not separately shown in FIG. 9), which performs processing in connection with the digital or analog data provided thereto from a source device. The server 11 is connected by a source modem 12 which is connected to a remote modem 18 via a wire 13 or a wireless 14 communication network 15. The server 11 provides the output from the wavelet transform device 112 to users connected to access the image filtering apparatus 9 through the communication network 15.

At the remote destination rendering apparatus 2, a user has the commercially available computer 3, including a display device 8, a keyboard 7A and/or a mouse 7B and one or more image rendering devices or output devices 5. Typically, installed on the computer 3 is a commercially available web browser 16 and network software 17, which enable the user to access the World Wide Web of the Internet through the remote modem 18. The user is then able to use the commercially available computer hardware and software to communicate over the Internet with the linear filter apparatus 9 through the communication network 15 to access the images or signals output from the inverse wavelet transform device 126. It is well understood in the art, that the source acquisition apparatus 1 and remote destination apparatus 2 could be applicable to a number of devices and apparatuses, such as, for example, audio, still-image, video, multi-media, ultrasound, or radiology.

Figure 10:
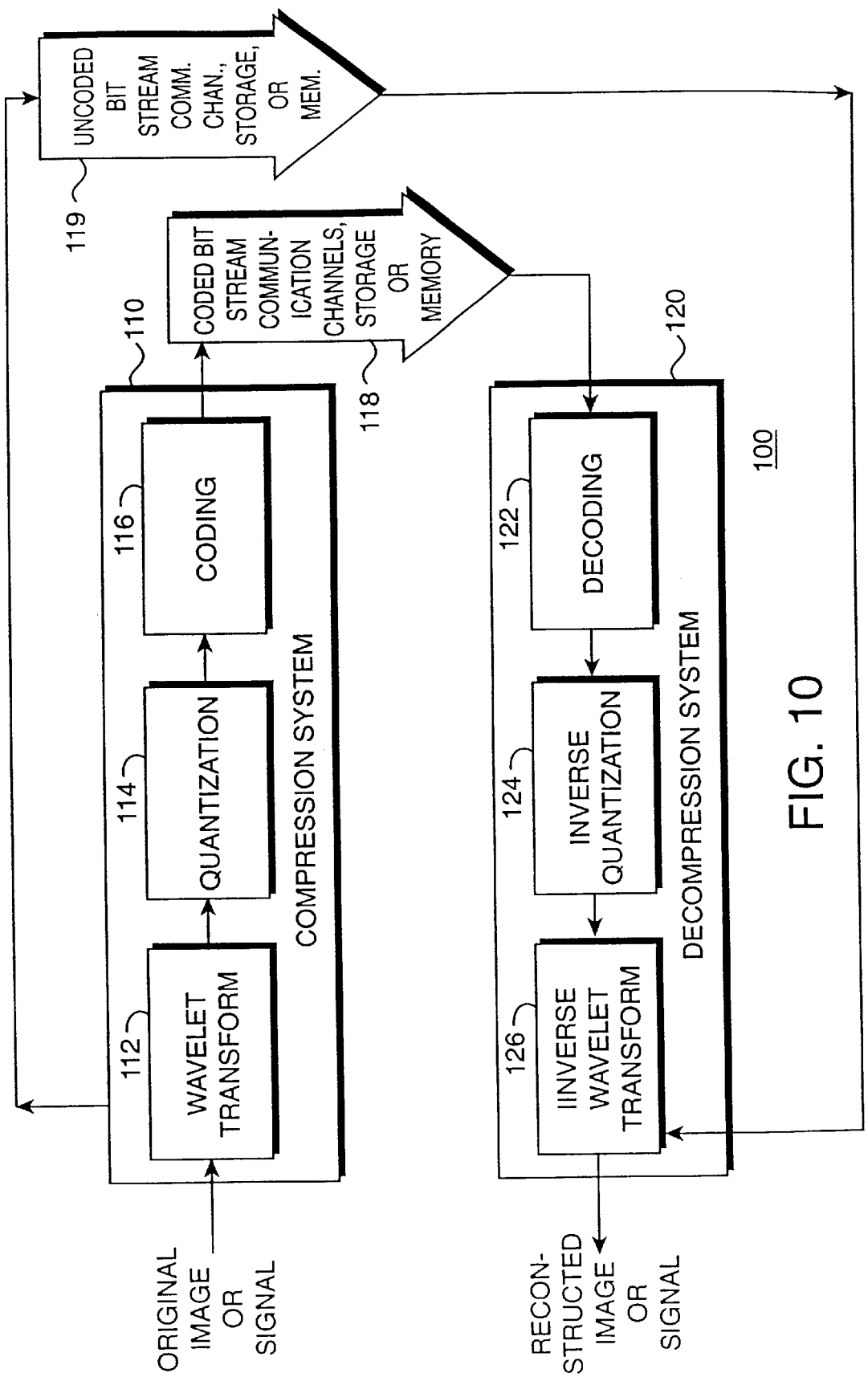
FIG. 10 is a high level block diagram illustrating a wavelet and inverse wavelet transform process and a wavelet-based image compression/decompression system.

FIG. 10 is a block diagram illustrating a wavelet and an inverse wavelet system 100 that could utilize the present invention MWT 142 and MIWT 172. As shown in the upper part of FIG. 10, a wavelet-based image compression system 110 generally has three main components: a wavelet transform (WT) device 112 to derive select subimages from the image; a quanitzation device 114 to quantize the resulting transform coefficients; and a coding device 116 to encode the quantized values into a coded bit stream 118 (or alternatively communication links, storage or memory), which is transmitted over a network or stored in memory. Alternatively, also shown in the upper part of FIG. 10, the wavelet transform coefficients may be transmitted over a network or stored in memory in an uncoded bit stream 119.

Referring to the lower part of FIG. 10, image reconstruction by an inverse wavelet-based decompression system 120 is accomplished by inverting the compression operations. The three main components are: a decoding device 122 to determine the quantized values from the coded bit stream, an inverse quantizing device 124 to form the sub-images from the quantized values, and an inverse wavelet transform (IWT) device 126 to reconstruct the image from the sub-images. Alternatively, also shown in the lower part of FIG. 10, the data received from the uncoded bit stream 119 can be reconstructed by the inverse wavelet transform (IWT) device 126.

The system arrangements of FIGS. 8, 9, and 10 are, of course, presented by way of example only. It is contemplated that many variations upon these examples will become readily apparent to those of ordinary skill in the art having reference to this description. For example, it is contemplated that the computer may serve as a wavelet analysis decomposition or compression for certain uses, and as an inverse wavelet synthesis reconstruction or decompression for others. For example, a home computer system may serve as a wavelet decomposition or compression system in uploading still images, videos, multi-media (or other types of signals having one to three dimensions) to the internet server, while serving as an inverse wavelet reconstruction or decompression system in receiving still images, videos, multimedia, (or other types of signals having one to three dimensions) from a still image, video, multi-media on demand service. In each case, the computational wavelets and inverse wavelets may be located in the servers, rather than in the home computer system.

4. PRESENT INVENTION LINEAR FILTERING IN WAVELET DOMAIN

In signal processing applications, e.g., image processing applications, in addition to the basic functions, a need arises to perform some type of additional processing on the signal or image. For instance, it may be desirable to low-pass filter a signal or an image for purposes of noise suppression prior to or after image compression or image segmentation. The disclosed embodiments of the novel methods and systems of the modified wavelet transform (MWT) 142 are preferred examples of the many variations and modifications which would be appreciated by one of ordinary skill in the art in keeping with the present invention, i.e., they are exemplary embodiments rather than limiting.

Figure 11A:
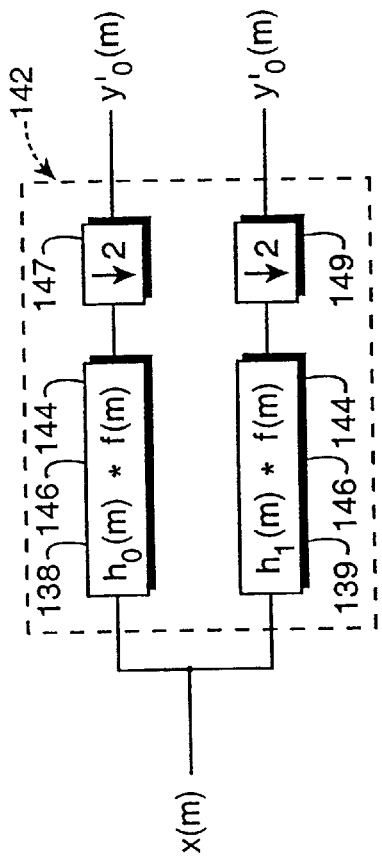
FIG. 11(A) is a schematic diagram of a linear filtering process in the analysis stage using the wavelet transform as the computation engine by modifying the wavelet basis function of the discrete wavelet transform forming a modified wavelet transform (MWT).

Turning to FIGS. 11(A) and (B), one embodiment of the present invention is illustrated wherein linear filtering in the analysis stage is accomplished by using the wavelet transform as the computation engine by modifying the wavelet basis function of the discrete wavelet transform to form a modified wavelet transform (MWT) 142. To accomplish this modification, the basis function is modified by convolving 146 the conventional wavelet analysis low-pass filter $h_0(n)$ 138 with a desired filter f(n) 144 (e.g., noise-reduction), and similarly the conventional wavelet analysis high-pass filter $h_1(n)$ 139 is convolved 146 with the desired filter f(n) 144 in the first stage level, i.e., the convolution operation of $h_0(n)$ *f(n), and $h_1(n)$*f(n). The results of the convolution is down-sampled by the decimators 147 and 149, thereby, generating wavelet transformed signals $y'_0(n)$ and $y'_1(n)$ that have been linear filtered in the wavelet domain. One skilled in the art would appreciate that the down-sampling may be performed prior to the wavelet analysis.

Particularly, referring to FIGS. 11(A) and (B), the modified wavelet analysis filters are formed by convolving 146 the conventional wavelet analysis filter $h_0(n)$ 138 and $h_1(n)$ 139 with the desired filter f(n) 144 at the first stage level.

Generally, as one skilled in the art would appreciate, convolution of two functions is mathematically expressed as provided below in Equation 5, wherein y(n) is the result of convolution of x(n) with h(n).

$$y(n) = \sum_{k=-\infty}^{k=+\infty} x(k)h(n-k) \quad (5)$$

While the MWT filtering method as discussed immediately above was done for one-level decomposition, the same MWT filtering method can also be applied for a wavelet transform with any number of decomposition stage levels. In one embodiment, the analysis decomposition having multiple decomposition stage levels initially requires MWT filtering in the first analysis stage level. Thereafter, for the remaining N−1 stage levels (i.e., spanning second through $N^{th}$ stage levels) of the analysis decomposition, conventional or designated inverse wavelet transformation is performed, without any modification.

One embodiment of the present invention, entails combining the aforementioned modified wavelet decomposition with a conventional or designated reconstruction inverse wavelet synthesis. As one skilled in the art would appreciate, there exist various types of conventional or designated inverse wavelet transforms. Some examples are, but not limited to, Daubechies, Mallat, Battle-Lemarie, Morlet, Coffman and Chui inverse wavelet transforms (and wavelet transforms).

Figure 11B:
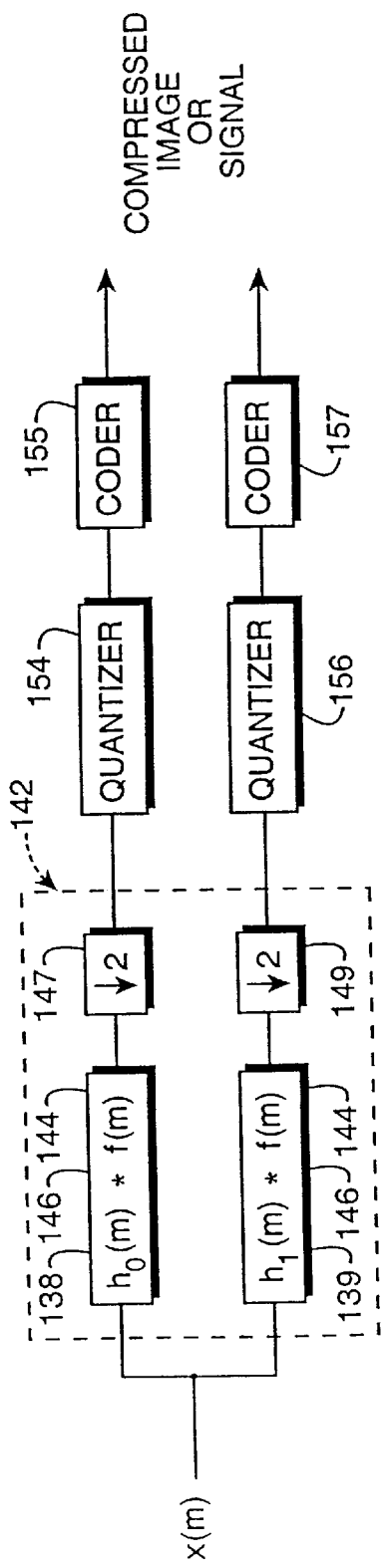
FIG. 11(B) is a schematic diagram of the MWT of FIG. 11(A) in a wavelet-based compression system.

Another embodiment of the present invention combines the MWT 142 filtering method with quantizers 154 and 156 and/or encoders 155 and 157 to achieve compression, as shown in FIG. 11(B).

Another embodiment of the present invention may involve performing the MWT filtering at each of the recursively ascending or succeeding decomposition analysis stage levels; or performing the MWT filtering at a predetermined selection of stage levels. While another embodiment of the present invention may involve performing the MWT filtering at the first stage level and performing the designated or conventional WT at the remaining recursively ascending or succeeding decomposition analysis stage levels.

Figure 12:
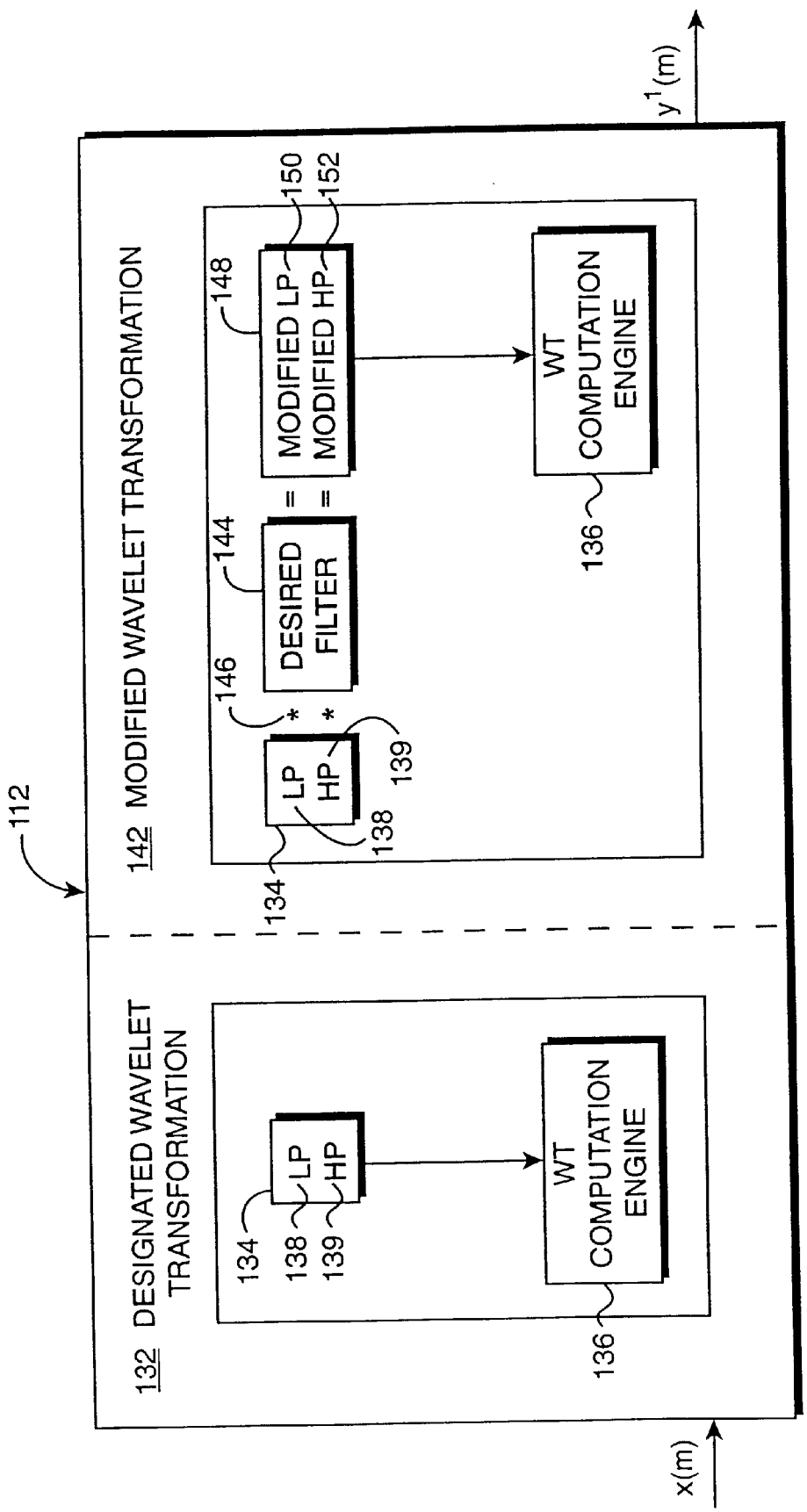
FIG. 12 is a block diagram illustrating an embodiment of the present invention wavelet transform apparatus to perform linear filtering.

FIG. 12 is a block diagram illustrating an embodiment of the present invention of the wavelet transform apparatus 112. Referring to the left side of FIG. 12, the wavelet transform apparatus 112 performs the designated or conventional wavelet transformation 132 on the input signal x(n), and referring to the right side, the wavelet transform apparatus 112 performs the present invention modified wavelet transformation 142 on the input signal x(n).

Referring to the left side of FIG. 12, the wavelet transform apparatus 112 wavelet transforms the digital signals x(n) with a wavelet basis function 134, wherein the wavelet transform basis is used as the computation engine 136. The wavelet basis function 134 comprises a wavelet low-pass filter 138 and a high-pass filter 139.

Next, referring to the right side of FIG. 12, the wavelet transform device 112 modifies the wavelet basis function 134 in accordance with the desired filtering effect. The desired filtered effect is accomplished using a desired filter 144 suited for the particular purpose, for example, noise reduction or edge enhancement. For instance, if noise-reduction is the object, then a low-pass filter may be utilized. Still referring to the right side of FIG. 12, the modification is effected by convolving 146 the wavelet basis function 134 with the desired filter 144, thereby forming a modified wavelet basis function 148, wherein the wavelet transform basis is used as the computation engine 136. The convolution 146 results in the modified wavelet basis function 148 comprising a modified wavelet low-pass filter 150 and a modified wavelet high-pass filter 152.

5. PRESENT INVENTION LINEAR FILTERING IN WAVELET DOMAIN

In addition to the MWT filtering, some applications might need the present invention modified inverse wavelet transform (MIWT) filtering. In signal processing applications, e.g., during typical image processing applications, it may be desirable to perform some type of sharpening, such as image enhancement or edge enhancement of the image prior to or after image decompression or desegmentation. The disclosed embodiments of the novel methods and systems of the modified inverse wavelet transform (MIWT) 172 are preferred examples of the many variations and modifications which would be appreciated by one of ordinary skill in the art in keeping with the present invention, i.e., they are exemplary embodiments rather than limiting.

Figure 13A:
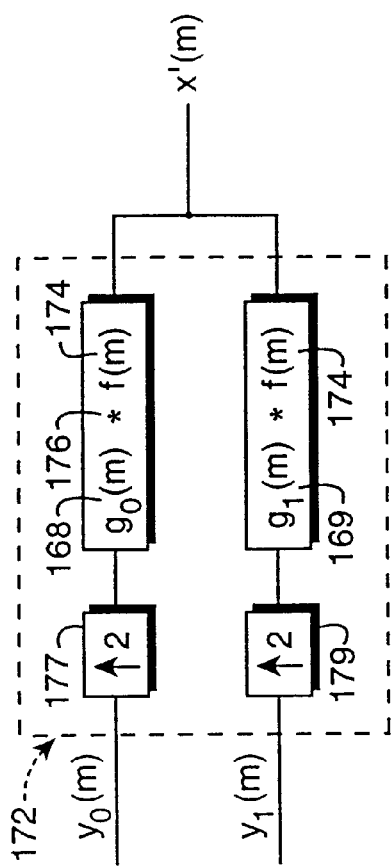
FIG. 13(A) is a schematic diagram of a linear filtering process in the synthesis stage using the inverse wavelet transform as the computation engine by modifying the inverse wavelet basis function of the discrete inverse wavelet transform forming a modified inverse wavelet transform (MIWT).
Figure 13B:
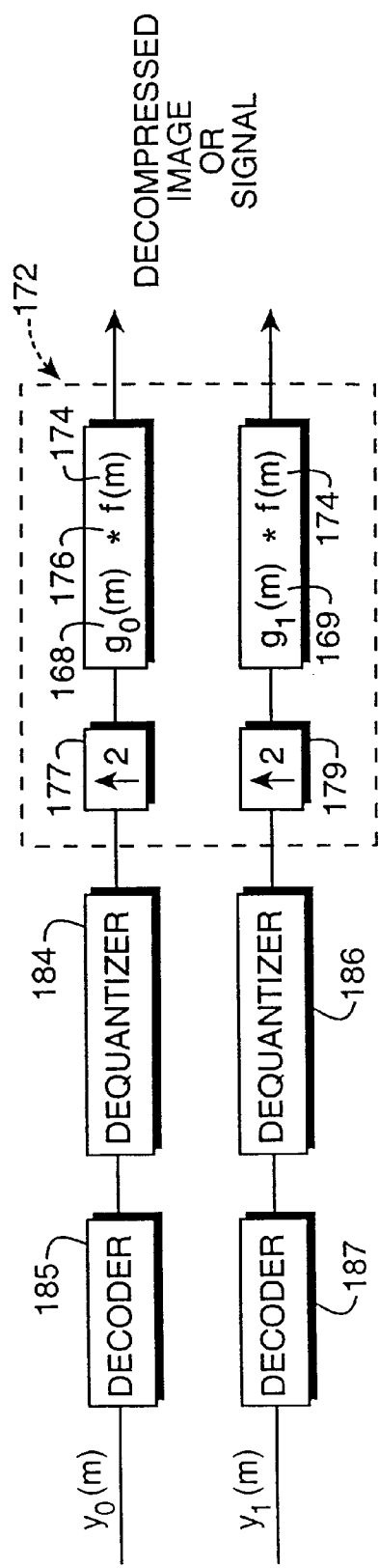
FIG. 13(B) is a schematic diagram of the MIWT of FIG. 13(A) in an inverse wavelet-based decompression system.

As shown in FIGS. 13(A) and (B), one embodiment of the present invention provides linear filtering in the inverse wavelet synthesis stage by using the inverse wavelet transform as the computation engine by modifying the wavelet basis function of the inverse wavelet transform to form a modified inverse wavelet transform (MIWT) 172. The inverse wavelet basis function is modified by convolving the conventional inverse wavelet synthesis low-pass filter $g_0(n)$ 168 with the desired filter f(n) 174 (e.g., sharpening) and similarly the conventional inverse wavelet synthesis high-pass filter $g_1(n)$ 169 is convolved with the desired filter f(n) 174 in, for example, the last stage level, $N^{th}$ stage level, i.e., the convolution operation of $g_0(n)$*f(n), and $g_1(n)$*f(n).

The MIWT filtering method as discussed immediately above was done for one stage level of reconstruction. The same MIWT filtering can also be applied for an inverse wavelet transform having multiple number of sequential synthesis reconstruction stage levels. Let us denote by N as the total number of stage levels in each of the wavelet and inverse wavelet transforms. In one embodiment, the overall method starts by processing with the conventional low and high-pass wavelet filters and performing the analysis wavelet decomposition for all stage levels by processing the wavelet coefficients. Thereafter, in the corresponding portion in the inverse wavelet synthesis section, the reconstruction is performed using the regular synthesis filtering for all stage levels except for the last stage level (Nth stage level), or said differently, for the first stage level through the $(N-1)^{th}$ stage level. At the last reconstruction synthesis stage level, $N^{th}$ stage level, the MIWT linear filtering method is performed.

As shown in FIG. 13(A), another embodiment of the present invention is illustrated wherein the MIWT 172 linear filtering method is combined with image decoders 185 and 187 and dequantizers 184 and 186 to achieve decompression. FIGS. 13(A) and (B) also illustrate the interpolators 177 and 179 prior to the inverse wavelet synthesis for up-sampling the input. One skilled in the art would appreciate that the up-sampling may also be performed after the inverse wavelet synthesis.

Still yet another embodiment of the present invention may involve performing the MIWT at each of the recursively or sequentially descending reconstruction synthesis stage levels; or performing the MIWT filtering at a predetermined selection of stage levels.

Finally, another embodiment of the present invention may include any of the aforementioned embodiments of the MWT linear filtering analysis methods/apparatuses and combining them with any of the aforementioned embodiments of the MIWT linear filtering synthesis methods/apparatuses.

Figure 14:
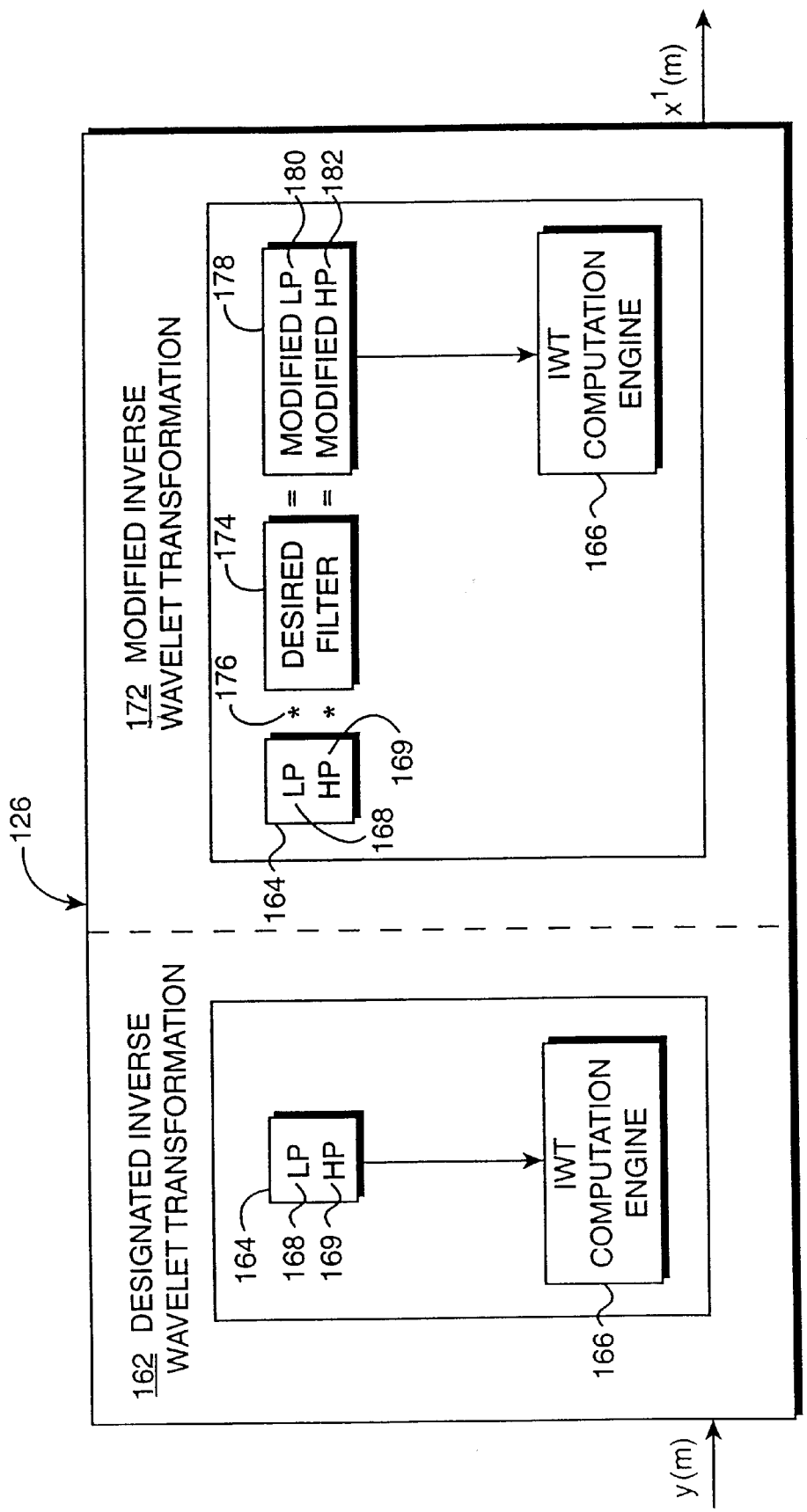
FIG. 14 is a block diagram illustrating an embodiment of the present invention inverse wavelet transform apparatus to perform linear filtering.

FIG. 14 is a block diagram illustrating an embodiment of the present invention of the inverse wavelet transform apparatus 126. Referring to the left side of FIG. 14, the inverse wavelet transform apparatus 126 performs the designated or conventional inverse wavelet transformation 162 on the wavelet coefficient y(n) received from the corresponding wavelet analysis. Still referring to the left side of FIG. 14, the inverse wavelet transform apparatus 126 transforms the coefficients y(n) with an inverse wavelet basis function 164, wherein the inverse wavelet transform basis is used as the computation engine 166. The inverse wavelet basis function 164 comprises an inverse wavelet low-pass filter 168 and a high-pass filter 169.

Next, referring to the right side of FIG. 14, the inverse wavelet apparatus 126 performs a modified inverse wavelet transformation 172 on the wavelet coefficient y(n). The inverse wavelet transform device 126 modifies the inverse wavelet basis function 164 in accordance with the desired filtering effect. The desired filtered effect is accomplished using a desired filter 174 suited for the particular purpose, for example, noise reduction or enhancement. For instance, if enhancement is the object, then a high-pass filter may be utilized. Still referring to the right side of FIG. 14, the modification is effected by convolving 176 the inverse wavelet basis function 164 with the desired filter 174, thereby forming a modified inverse wavelet basis function 178 of the modified inverse wavelet transform 172, wherein the modified inverse wavelet transform basis is used as the computation engine 166. The convolution 176 results in the modified inverse wavelet basis function 178 comprising a modified inverse wavelet low-pass filter 180 and a modified inverse wavelet high-pass filter 182.

6. MATLAB™ PROGRAM

For purpose of illustrating the principles of the present invention, MATLAB™ Program examples were executed illustrating the following three scenarios: (1) a conventional base case wherein a conventional one level wavelet transform (WT) analysis decomposition is coupled with a corresponding conventional inverse wavelet transform (IWT) synthesis reconstruction; (2) an illustrative embodiment of the present invention wherein a one-level modified wavelet transform (MWT) analysis decomposition is coupled with a conventional inverse wavelet transform (IWT) synthesis reconstruction; and (3) an illustrative embodiment of the present invention wherein a conventional one-level wavelet transform (WT) analysis decomposition is coupled with a modified inverse wavelet transform (MIWT) synthesis reconstruction. MATLAB™ is a commercially available integrated technical computing environment that combines numeric computation, advanced graphics and visualization, and a high-level programming language.

Table I below lists the definitions of the abbreviations used in the MATLAB™ Program.

TABLE I

Abbreviations

| SYMBOL | MATLAB PROGRAM DEFINITIONS |
|---|---|
| x | Input signal |
| lo_dfil | low decomposition filter |
| hi_dril | high decomposition filter |
| lo_rfil | low reconstruction filter |
| hi_rfil | high reconstruction filter |
| low1 | decomposed signal - low |
| high1 | decomposed signal - high |
| dwt | discrete wavelet transform (conventional) |
| rec_x | reconstructed original signal |
| idwt | inverse discrete wavelet transform (conventional) |
| mod_lo_dfil | modified low decomposition filter |
| mod_hi_dfil | modified high decomposition filter |
| conv | convolution/convolving |
| pre_mod_inv_x | reconstructed signal from modified decomposition filters |
| mod_inv x | reconstructed signal from modified reconstruction filters |
| low_pass_filter | low pass filter (desired noise reduction) |
| mod_lo_rfil | modified low reconstruction filter |
| mod_hi_rfil | modified high reconstruction filter |

Table II below represents the one-dimensional input signal data x, which was into the MATLAB™ program as a single row of 101 columns of input signal The one-dimensional input signal data x is graphically represented in FIG. 16.

TABLE II

Input Signal Data(x)

| col. | input(x) |
|---|---|
| 1 | 0.7370 |
| 2 | 0.8337 |
| 3 | 0.9485 |
| 4 | 0.8925 |
| 5 | 1.2448 |
| 6 | 2.1721 |
| 7 | 2.6396 |
| 8 | 2.5296 |
| 9 | 2.7305 |
| 10 | 2.6784 |
| 11 | 3.1169 |
| 12 | 2.7417 |
| 13 | 3.5320 |
| 14 | 3.8308 |
| 15 | 3.6120 |
| 16 | 3.5421 |
| 17 | 3.2983 |
| 18 | 3.4839 |
| 19 | 2.9351 |
| 20 | 3.4193 |
| 21 | 3.5924 |
| 22 | 2.6776 |
| 23 | 2.7123 |
| 24 | 2.5915 |
| 25 | 2.7717 |
| 26 | 2.4891 |
| 27 | 2.1669 |
| 28 | 1.9077 |
| 29 | 1.6033 |

TABLE II-continued

| col. | input(x) |
|---|---|
| 30 | 0.9744 |
| 31 | 0.4310 |
| 32 | 0.6789 |
| 33 | 0.5171 |
| 34 | 0.2583 |
| 35 | 0.1350 |
| 36 | −0.7595 |
| 37 | −0.9112 |
| 38 | −0.7677 |
| 39 | −1.1173 |
| 40 | −1.9352 |
| 41 | −2.2098 |
| 42 | −1.9865 |
| 43 | −2.4330 |
| 44 | −2.4248 |
| 45 | −2.5718 |
| 46 | −2.0901 |
| 47 | −2.2394 |
| 48 | −2.4861 |
| 49 | −2.7927 |
| 50 | −2.0978 |
| 51 | −2.7132 |
| 52 | −1.7963 |
| 53 | −2.1977 |
| 54 | −1.6435 |
| 55 | −2.0156 |
| 56 | −1.1214 |
| 57 | −1.0829 |
| 58 | −0.8594 |
| 59 | −1.1823 |
| 60 | −0.5325 |
| 61 | −0.2064 |
| 62 | 0.2841 |
| 63 | 0.4577 |
| 64 | 0.4820 |
| 65 | 0.6694 |
| 66 | 0.6970 |
| 67 | 1.0903 |
| 68 | 2.1712 |
| 69 | 1.9197 |
| 70 | 2.0925 |
| 71 | 2.5053 |
| 72 | 2.7436 |
| 73 | 2.9590 |
| 74 | 2.6256 |
| 75 | 3.6735 |
| 76 | 2.9697 |
| 77 | 3.8482 |
| 78 | 3.7202 |
| 79 | 3.7434 |
| 80 | 3.2799 |
| 81 | 3.7577 |
| 82 | 3.7794 |
| 83 | 2.8344 |
| 84 | 3.5123 |
| 85 | 2.8762 |
| 86 | 3.1198 |
| 87 | 2.9405 |
| 88 | 2.8501 |
| 89 | 2.3224 |
| 90 | 1.7161 |
| 91 | 1.4666 |
| 92 | 1.8514 |
| 93 | 1.4449 |
| 94 | 1.3592 |
| 95 | 0.4373 |
| 96 | 0.2681 |
| 97 | 0.2665 |
| 98 | −0.6636 |
| 99 | −0.8897 |
| 100 | −0.7098 |
| 101 | −1.1026 | a. MATLAB™ Conventional Base Case

Figure 15A:
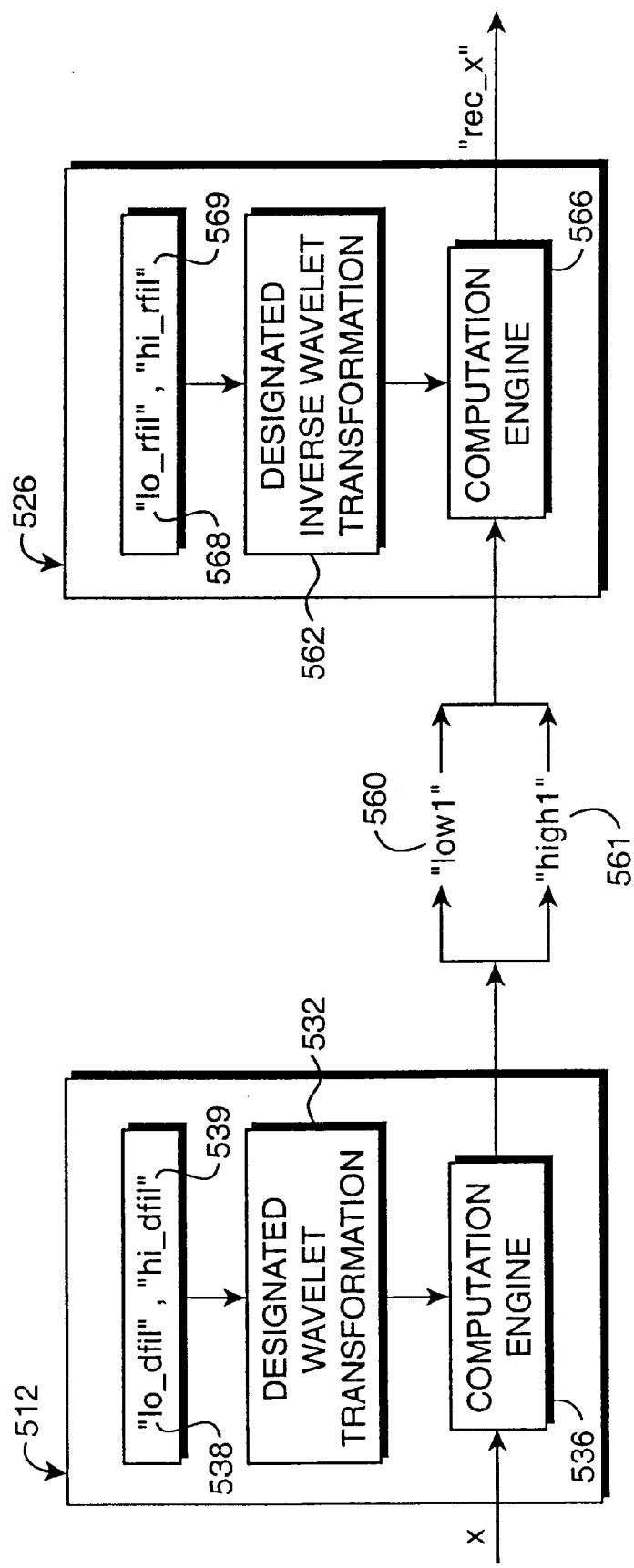
FIG. 15(A) is a block diagram of the selected parts of the MATLAB™ program illustrating a conventional wavelet transform analysis decomposition coupled with a corresponding conventional inverse wavelet transform synthesis.
Figure 17A:
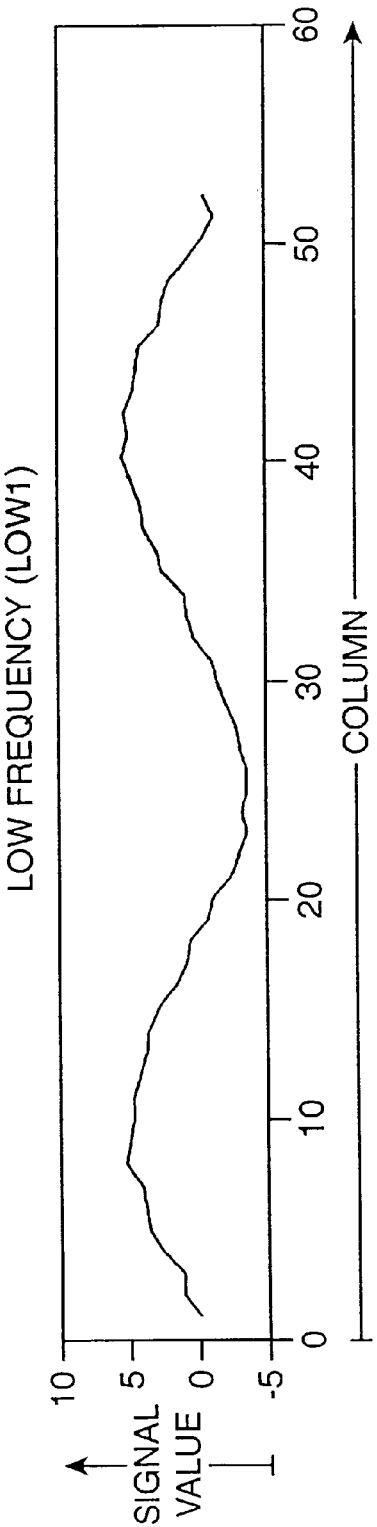
FIG. 17(A) is the graphical representation of the results of the conventional discrete wavelet transform (WT) analysis decomposition using the conventional wavelet analysis decomposition low-pass filter.
Figure 17B:
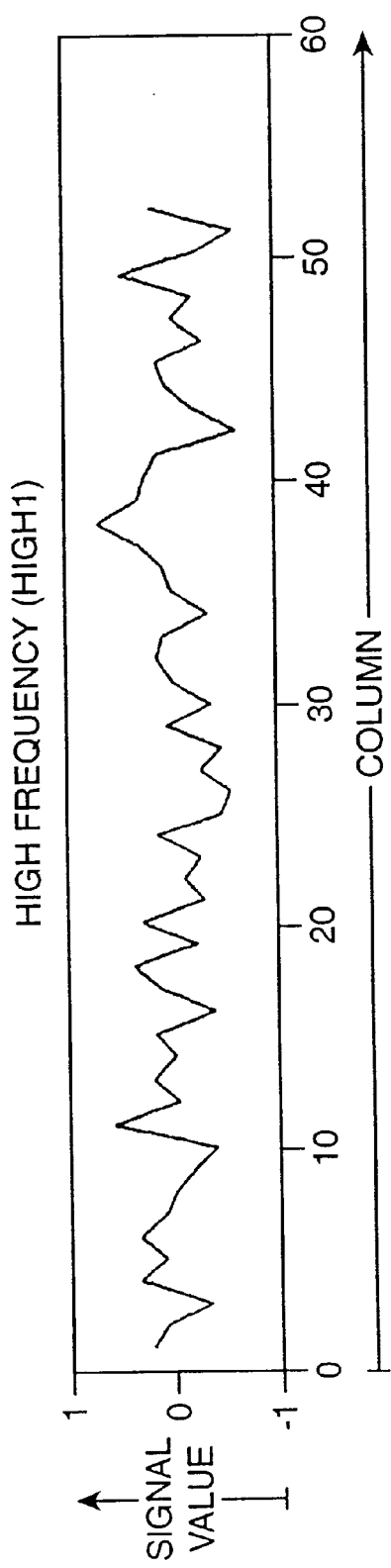
FIG. 17(B) is the graphical representation of the results of the conventional discrete wavelet transform (DWT) analysis decomposition using the conventional wavelet analysis decomposition high-pass filter.

First, with regards to the conventional base case as illustrated in FIG. 15(A), the analysis decomposition apparatus comprises analysis wavelet decomposition filters "lo_dfil" 538 and "hi_dfil" 539 that low-pass and high-pass, respectively, the signals x (as enumerated in Table II above). The transformation 532 of the conventional one level discrete wavelet transform (DWT) 512 analysis decomposition using the conventional wavelet analysis decomposition low-pass filter "lo_dfil" 538 and high pass filter "hi_dfil" 539 are represented numerically in III and IV below, and graphically in FIGS. 17(A) and (B).

TABLE III

Low-pass Band ("lo_dif") of Conventional Base Case

| col. | lo_dif |
|---|---|
| 1 | 0.0573 |
| 2 | 1.1505 |
| 3 | 1.2026 |
| 4 | 2.6824 |
| 5 | 3.6563 |
| 6 | 3.9031 |
| 7 | 4.0948 |
| 8 | 5.2616 |
| 9 | 4.9960 |
| 10 | 4.7227 |
| 11 | 4.7365 |
| 12 | 4.2474 |
| 13 | 3.7769 |
| 14 | 3.6596 |
| 15 | 2.8757 |
| 16 | 1.5982 |
| 17 | 0.8585 |
| 18 | 0.5944 |
| 19 | −0.6751 |
| 20 | −1.0823 |
| 21 | −2.3967 |
| 22 | −2.9605 |
| 23 | −3.5094 |
| 24 | −3.1707 |
| 25 | −3.5157 |
| 26 | −3.4793 |
| 27 | −3.0929 |
| 28 | −2.7429 |
| 29 | −2.0430 |
| 30 | −1.4380 |
| 31 | −1.0995 |
| 32 | 0.1782 |
| 33 | 0.6841 |
| 34 | 0.8698 |
| 35 | 2.5023 |
| 36 | 2.8841 |
| 37 | 3.8285 |
| 38 | 4.0645 |
| 39 | 4.6395 |
| 40 | 5.3852 |
| 41 | 4.9048 |
| 42 | 5.1572 |
| 43 | 4.5480 |
| 44 | 4.2891 |
| 45 | 4.1028 |
| 46 | 2.6463 |
| 47 | 2.4050 |
| 48 | 1.8982 |
| 49 | 0.5811 |
| 50 | −0.5339 |
| 51 | −1.2706 |
| 52 | −0.5325 |

TABLE IV

High-pass Band ("hi_dif") of Conventional Base Case

| col. | hi_dif |
|---|---|
| 1 | 0.2139 |
| 2 | 0.0801 |
| 3 | −0.3305 |
| 4 | 0.3384 |
| 5 | 0.0820 |
| 6 | 0.3295 |
| 7 | 0.0865 |
| 8 | −0.0049 |
| 9 | −0.1849 |
| 10 | −0.4038 |
| 11 | 0.5657 |
| 12 | −0.0478 |
| 13 | 0.1845 |
| 14 | −0.0254 |
| 15 | 0.1626 |
| 16 | −0.3933 |
| 17 | 0.0998 |
| 18 | 0.3549 |
| 19 | −0.2387 |
| 20 | 0.2900 |
| 21 | −0.3108 |
| 22 | −0.1330 |
| 23 | −0.2835 |
| 24 | 0.1287 |
| 25 | −0.4759 |
| 26 | −0.5705 |
| 27 | −0.2909 |
| 28 | −0.4917 |
| 29 | 0.0214 |
| 30 | −0.3990 |
| 31 | −0.0375 |
| 32 | 0.1131 |
| 33 | 0.0561 |
| 34 | −0.3794 |
| 35 | −0.0325 |
| 36 | 0.0532 |
| 37 | 0.2680 |
| 38 | 0.6673 |
| 39 | 0.2813 |
| 40 | 0.2155 |
| 41 | 0.0985 |
| 42 | −0.6587 |
| 43 | −0.2548 |
| 44 | 0.0118 |
| 45 | 0.0946 |
| 46 | −0.3525 |
| 47 | −0.0525 |
| 48 | −0.2553 |
| 49 | 0.4268 |
| 50 | −0.2871 |
| 51 | −0.6481 |
| 52 | 0.1427 |

Figure 17C:
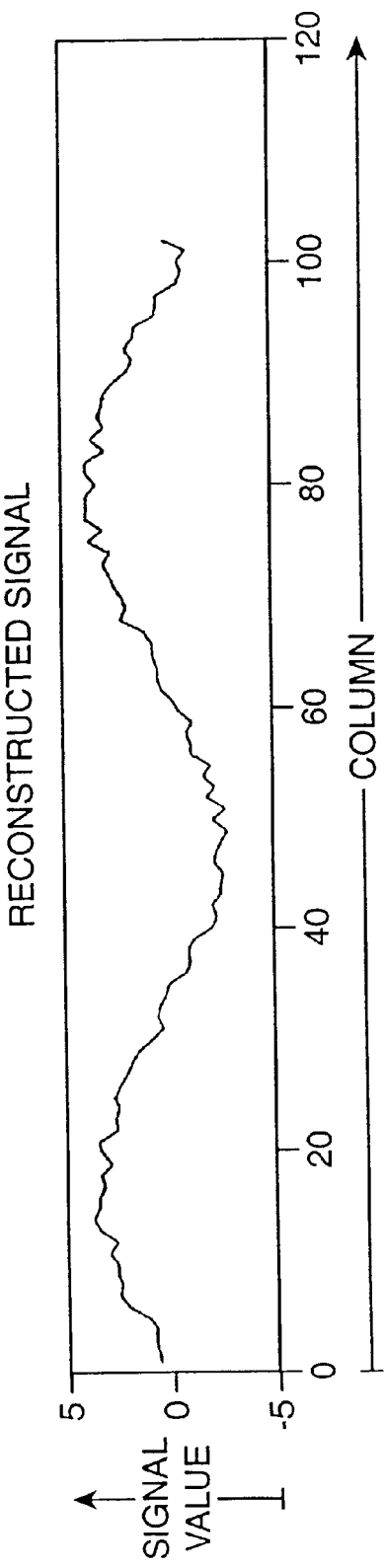
FIG. 17(C) is the graphical representation of the results of the conventional inverse discrete wavelet transform (IDWT) synthesis reconstruction wherein the decomposed signals are reconstructed into its original signal condition.

Thereafter, the decomposed signals "low1" 560 and "high1" 561 received from the output of the decomposition portion are reconstructed and transformed 562 in the corresponding conventional synthesis in the inverse discrete wavelet transform (IDWT) 526 using inverse wavelet filters "lo_rfil" 568 and "hi_rfil" 569, as illustrated in the right side of FIG. 15(A). The results of the conventional one level inverse discrete wavelet transform (IDWT) 526 synthesis reconstruction demonstrates that the decomposed signals "low1" and "high1" are reconstructed into its original signal condition "rec_x" and are represented numerically in table V below, and graphically represented in FIG. 17(C).

TABLE V

Reconstructed Signal ("rec_x") of Conventional Base Case

| col. | rec_x |
|---|---|
| 1 | 0.7370 |
| 2 | 0.8337 |
| 3 | 0.9485 |
| 4 | 0.8925 |
| 5 | 1.2448 |
| 6 | 2.1721 |
| 7 | 2.6396 |
| 8 | 2.5296 |
| 9 | 2.7305 |
| 10 | 2.6784 |
| 11 | 3.1169 |
| 12 | 2.7417 |
| 13 | 3.5320 |
| 14 | 3.8308 |
| 15 | 3.6120 |
| 16 | 3.5421 |
| 17 | 3.2983 |
| 18 | 3.4839 |
| 19 | 2.9351 |
| 20 | 3.4193 |
| 21 | 3.5924 |
| 22 | 2.6776 |
| 23 | 2.7123 |
| 24 | 2.5915 |
| 25 | 2.7717 |
| 26 | 2.4891 |
| 27 | 2.1669 |
| 28 | 1.9077 |
| 29 | 1.6033 |
| 30 | 0.9744 |
| 31 | 0.4310 |
| 32 | 0.6789 |
| 33 | 0.5171 |
| 34 | 0.2583 |
| 35 | 0.1350 |
| 36 | −0.7595 |
| 37 | −0.9112 |
| 38 | −0.7677 |
| 39 | −1.1173 |
| 40 | −1.9352 |
| 41 | −2.2098 |
| 42 | −1.9865 |
| 43 | −2.4330 |
| 44 | −2.4248 |
| 45 | −2.5718 |
| 46 | −2.0901 |
| 47 | −2.2394 |
| 48 | −2.4861 |
| 49 | −2.7927 |
| 50 | −2.0978 |
| 51 | −2.7132 |
| 52 | −1.7963 |
| 53 | −2.1977 |
| 54 | −1.6435 |
| 55 | −2.0156 |
| 56 | −1.1214 |
| 57 | −1.0829 |
| 58 | −0.8594 |
| 59 | −1.1823 |
| 60 | −0.5325 |
| 61 | −0.2064 |
| 62 | 0.2841 |
| 63 | 0.4577 |
| 64 | 0.4820 |
| 65 | 0.6694 |
| 66 | 0.6970 |
| 67 | 1.0903 |
| 68 | 2.1712 |
| 69 | 1.9197 |
| 70 | 2.0925 |
| 71 | 2.5053 |
| 72 | 2.7436 |
| 73 | 2.9590 |
| 74 | 2.6256 |
| 75 | 3.6735 |

TABLE V-continued

Reconstructed Signal ("rec_x") of Conventional Base Case

| col. | rec_x |
| --- | --- |
| 76 | 2.9697 |
| 77 | 3.8482 |
| 78 | 3.7202 |
| 79 | 3.7434 |
| 80 | 3.2799 |
| 81 | 3.7577 |
| 82 | 3.7794 |
| 83 | 2.8344 |
| 84 | 3.5123 |
| 85 | 2.8762 |
| 86 | 3.1198 |
| 87 | 2.9405 |
| 88 | 2.8501 |
| 89 | 2.3224 |
| 90 | 1.7161 |
| 91 | 1.4666 |
| 92 | 1.8514 |
| 93 | 1.4449 |
| 94 | 1.3592 |
| 95 | 0.4373 |
| 96 | 0.2681 |
| 97 | 0.2665 |
| 98 | −0.6636 |
| 99 | −0.8897 |
| 100 | −0.7098 |
| 101 | −1.1026 |

It is readily apparent that the reconstructed signal "rec_x" is an accurate reconstruction of the original input signals x. Accordingly, the code supporting this application of the MATLAB™ program language for this conventional base case is reproduced below.

Conventional Base Case Code

```
load sig;
plot (x);
[lo_dfil,hi_dfil,lo_rfil,hi_rfil] = wfilters('db2');
[low1,high1] = dwt(x,lo_dfil,hi_dfil);
clf
subplot(411)
plot(x)
subplot(412)
plot(low1);
subplot(413)
plot(high1);
[rec_x] = idwt(low1,high1,lo_rfil,hi_rfil);
subplot(414)
plot(rec_x,'red');
diary data_wav_1d
x
lo_dfil
hi_dfil
low1
high1
rec_x
diary off.
lo_dfil = −0.1294    0.2241    0.8365    0.4830
hi_dfil = −0.4830    0.8360   −0.2241    0.1294
``` b. MATLAB™ Modified Wavelet Transform (MWT) Analysis Decomposition

Figure 15B:
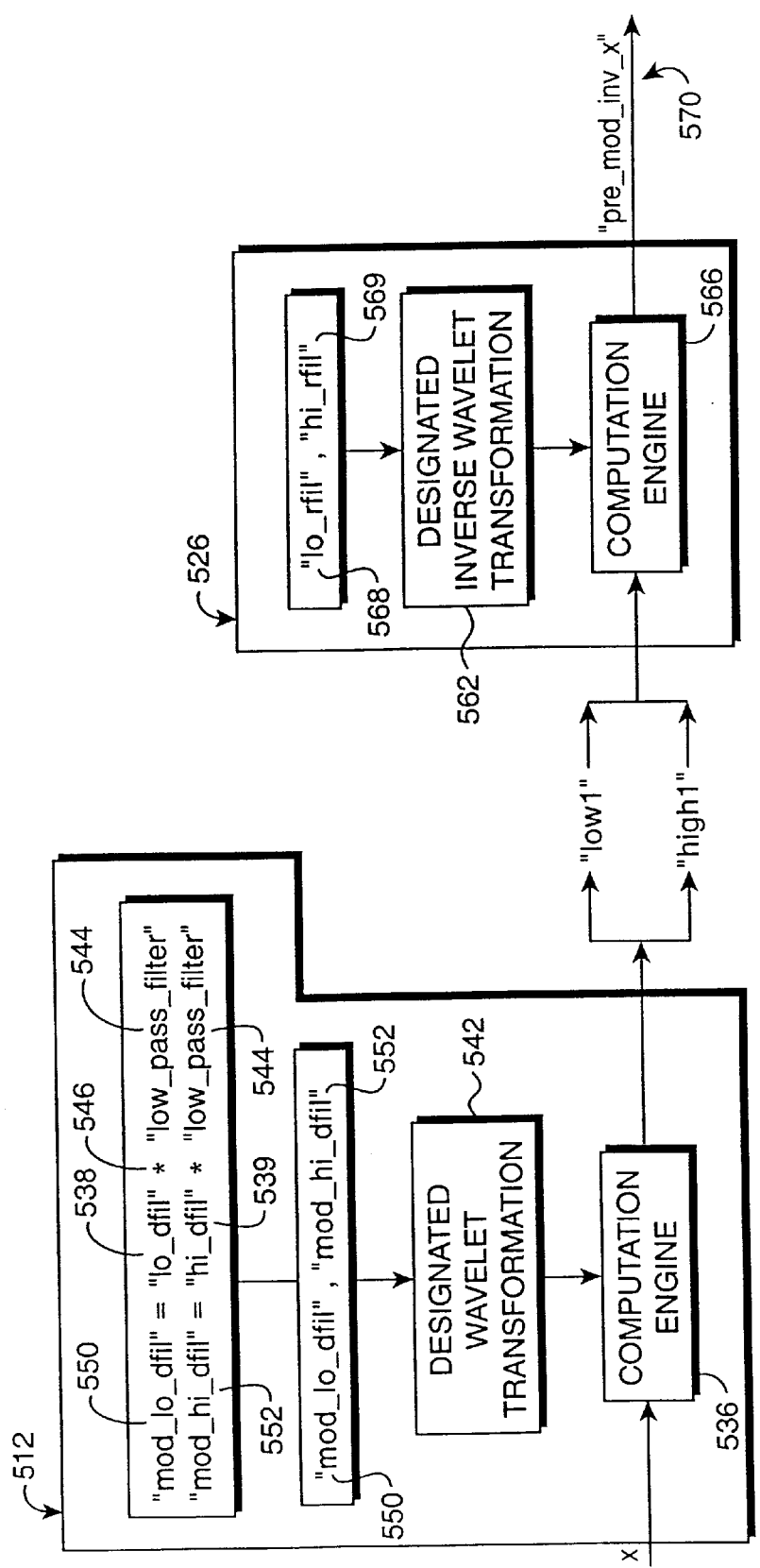
FIG. 15(B) is a block diagram of the selected parts of the MATLAB™ program illustrating a modified wavelet transform (MWT) analysis decomposition coupled with a conventional inverse wavelet transform (IWT) synthesis reconstruction.

Second, with regards to the illustrative example of the present invention modified wavelet transform (MWT) 542 analysis decomposition case, as illustrated in FIG. 15(B), the wavelet transform 512 comprises modified analysis wavelet decomposition filters "mod_lo_dfil" 550 and "mod_hi_dfil" 552 that are formed by convolving 546 the low-pass and high-pass filters "lo_dfil" 538 and "hi_dfil" 539 with a desired filter "low_pass_filter" 544, such as for noise-reduction. This convolution operation 546, as represented in equations 6 and 7 below, creates the modified wavelet filters "mod_lo_dfil" 550 and "mod hi_dfil" 552 required for the MWT 542.

$$\text{mod\_lo\_dfil} = (\text{lo\_dfil}) * (\text{low\_pass\_filter}) \quad (6)$$

$$\text{mod\_hi\_dfil} = (\text{hi\_dfil}) * (\text{low\_pass\_filter}) \quad (7)$$

Figure 16:
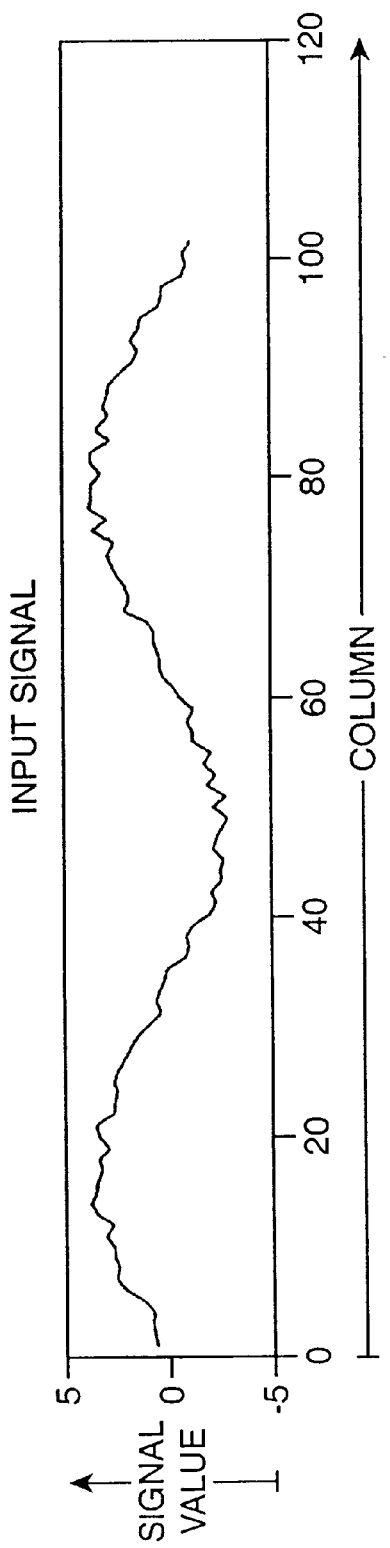
FIG. 16 is the graphical representation of the signal data input into the MATLAB™ program.

The decomposition modified analysis wavelet decomposition filters "mod_lo_dfil" 550 and "mod_hi_dfil" 552 low-pass and high-pass filter the one-dimensional row of input digital signals x, as provided numerically in Table II above, and graphically in FIG. 16 (wherein x represents a single row of a 101 columns of input signal data).

Figure 18A:
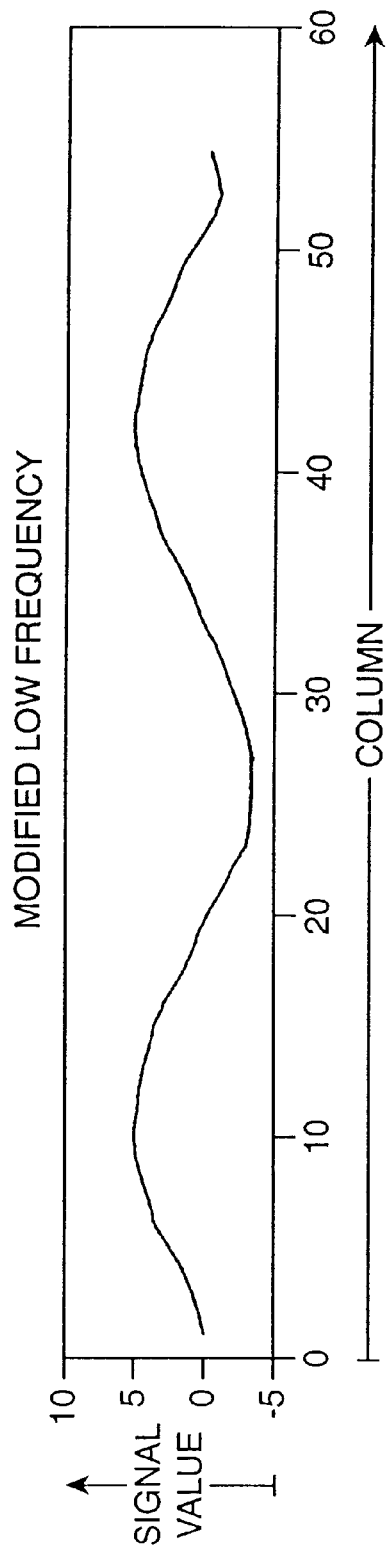
FIG. 18(A) is the graphical representation of the results of the modified wavelet transform (MWT) analysis decomposition using the modified analysis wavelet decomposition low-pass filters.
Figure 18B:
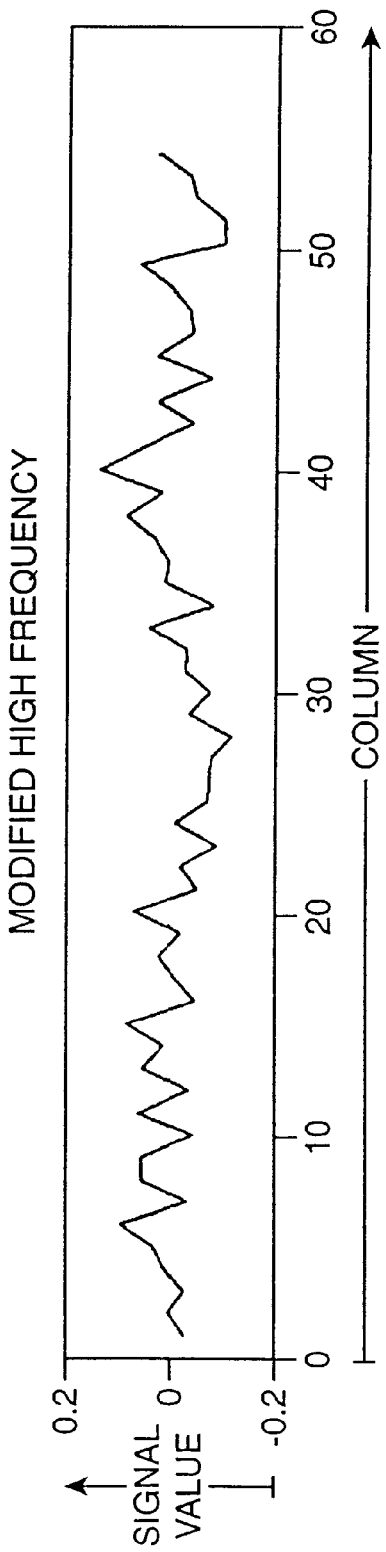
FIG. 18(B) is the graphical representation of the results of the modified wavelet transform (MWT) analysis decomposition using the modified analysis wavelet decomposition high-pass filter.

The results of the low-pass and high pass filtering of the modified analysis wavelet decomposition filters "mod_lo_dfil" 550 and "mod_hi_dfil" 552 are represented numerically in table VI and VII below, and graphically FIGS. 18(A) and (B). These modified decomposition filters thereby provide wavelet coefficients that have been modified by convolving the basis function of the wavelet decomposition filters "lo_dfil" 538 and "hi_dfil" 539 with the desired filter "low_pass_filter" 544. As a result, the desired linear filtering, e.g., noise reduction, is accomplished in the wavelet domain using the wavelet transform as the computation engine 536, without the cost of additional software or hardware support.

TABLE VI

Low-Pass Band ("mod_lo_dfil") of MWT Decomposition Case

| col. | mod_lo_dfil |
| --- | --- |
| 1 | −0.0076 |
| 2 | 0.3586 |
| 3 | 0.8652 |
| 4 | 1.5776 |
| 5 | 2.5259 |
| 6 | 3.4831 |
| 7 | 3.8831 |
| 8 | 4.3976 |
| 9 | 4.8522 |
| 10 | 5.0180 |
| 11 | 4.7531 |
| 12 | 4.6104 |
| 13 | 4.2902 |
| 14 | 3.8632 |
| 15 | 3.4790 |
| 16 | 2.7587 |
| 17 | 1.7348 |
| 18 | 0.9536 |
| 19 | 0.3528 |
| 20 | −0.4268 |
| 21 | −1.3528 |
| 22 | −2.1613 |
| 23 | −2.9971 |
| 24 | −3.2694 |
| 25 | −3.3551 |
| 26 | −3.3800 |
| 27 | −3.4290 |
| 28 | −3.1059 |
| 29 | −2.6567 |
| 30 | −2.0604 |
| 31 | −1.5129 |
| 32 | −0.8563 |
| 33 | −0.0242 |
| 34 | 0.6163 |
| 35 | 1.2702 |
| 36 | 2.1085 |
| 37 | 3.0705 |
| 38 | 3.6058 |
| 39 | 4.1909 |

TABLE VI-continued

Low-Pass Band ("mod_lo_dfil") of MWT Decomposition Case

| col. | mod_lo_dfil |
|---|---|
| 40 | 4.7201 |
| 41 | 5.0219 |
| 42 | 5.1664 |
| 43 | 4.8858 |
| 44 | 4.6054 |
| 45 | 4.3332 |
| 46 | 3.7715 |
| 47 | 2.9904 |
| 48 | 2.3168 |
| 49 | 1.6566 |
| 50 | 0.6624 |
| 51 | −0.3971 |
| 52 | −0.9367 |
| 53 | −0.6136 |
| 54 | −0.1065 |

TABLE VII

High-Pass Band ("mod_hi_dif") of MWT Decomposition Case

| col. | mod_hi_dfil |
|---|---|
| 1 | 0.0284 |
| 2 | 0.0024 |
| 3 | −0.0275 |
| 4 | 0.0121 |
| 5 | 0.0324 |
| 6 | 0.0941 |
| 7 | −0.0328 |
| 8 | 0.0534 |
| 9 | 0.0550 |
| 10 | −0.0460 |
| 11 | 0.0585 |
| 12 | −0.0374 |
| 13 | 0.0519 |
| 14 | 0.0130 |
| 15 | 0.0829 |
| 16 | −0.0483 |
| 17 | −0.0069 |
| 18 | 0.0208 |
| 19 | −0.0192 |
| 20 | 0.0694 |
| 21 | −0.0523 |
| 22 | −0.0193 |
| 23 | −0.0904 |
| 24 | −0.0097 |
| 25 | −0.0732 |
| 26 | −0.0746 |
| 27 | −0.0791 |
| 28 | −0.1182 |
| 29 | −0.0376 |
| 30 | −0.0760 |
| 31 | −0.0290 |
| 32 | −0.0322 |
| 33 | 0.0408 |
| 34 | −0.0851 |
| 35 | 0.0085 |
| 36 | 0.0050 |
| 37 | 0.0303 |
| 38 | 0.0852 |
| 39 | 0.0166 |
| 40 | 0.1368 |
| 41 | 0.0522 |
| 42 | −0.0421 |
| 43 | 0.0271 |
| 44 | −0.0773 |
| 45 | 0.0283 |
| 46 | −0.0417 |
| 47 | −0.0345 |
| 48 | 0.0004 |
| 49 | 0.0606 |

TABLE VII-continued

High-Pass Band ("mod_hi_dif") of MWT Decomposition Case

| col. | mod_hi_dfil |
|---|---|
| 50 | −0.1028 |
| 51 | −0.1009 |
| 52 | −0.0459 |
| 53 | −0.0333 |
| 54 | 0.0285 |

Figure 18C:
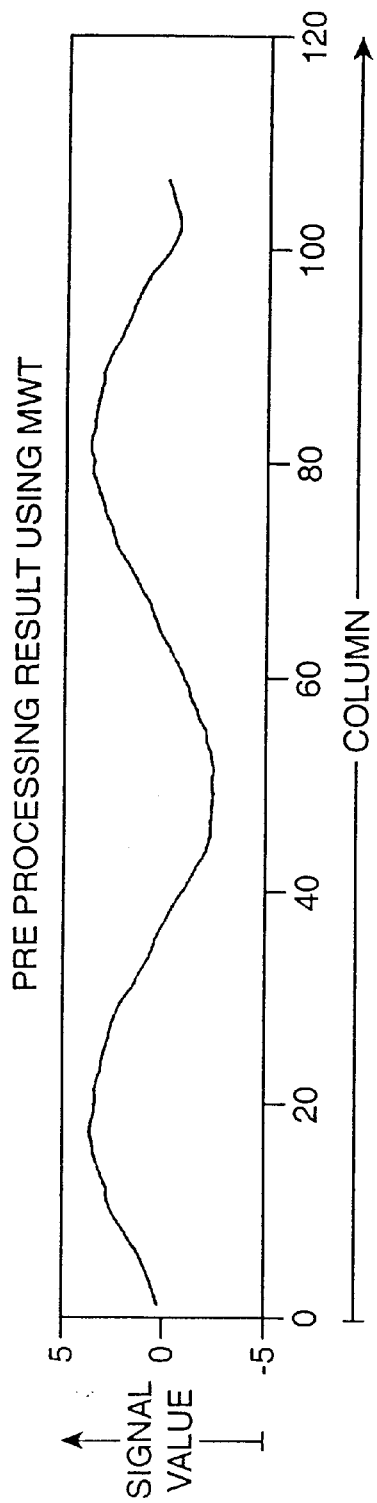
FIG. 18(C) is the graphical representation of the results of the conventional inverse wavelet transform (IWT) synthesis reconstruction wherein the decomposed signals are reconstructed after having been modified during the wavelet transform.

Thereafter, the decomposed signals "low1" and "high1" are reconstructed by the designated or conventional inverse wavelet transformation 562 of the IWI 526 using the inverse wavelet filters "lo_rfil" 568 and "hi_rfil" 569, as illustrated in the right of FIG. 15(B). The reconstructed signals "pre_mod_inv_x" 570 represent the original signals that has been modified during the wavelet transform. The reconstructed signals "pre_mod_inv_x" 570 are represented numerically in table VII below, and graphically represented in FIG. 18(C).

TABLE VIII

Pre-Processed Reconstructed Signal ("pre_mod_inv_x") of MWT

| col. | pre_mod_inv_x |
|---|---|
| 1 | 0.1474 |
| 2 | 0.3141 |
| 3 | 0.5038 |
| 4 | 0.6823 |
| 5 | 0.9313 |
| 6 | 1.2183 |
| 7 | 1.5795 |
| 8 | 1.8957 |
| 9 | 2.2633 |
| 10 | 2.5501 |
| 11 | 2.7390 |
| 12 | 2.7594 |
| 13 | 2.9599 |
| 14 | 3.1800 |
| 15 | 3.3667 |
| 16 | 3.4517 |
| 17 | 3.5631 |
| 18 | 3.5534 |
| 19 | 3.3743 |
| 20 | 3.3358 |
| 21 | 3.3458 |
| 22 | 3.2217 |
| 23 | 3.0673 |
| 24 | 2.9986 |
| 25 | 2.8691 |
| 26 | 2.6484 |
| 27 | 2.5463 |
| 28 | 2.3854 |
| 29 | 2.1878 |
| 30 | 1.8283 |
| 31 | 1.4167 |
| 32 | 1.1191 |
| 33 | 0.8409 |
| 34 | 0.5719 |
| 35 | 0.4040 |
| 36 | 0.1659 |
| 37 | −0.1521 |
| 38 | −0.4090 |
| 39 | −0.6842 |
| 40 | −1.0982 |
| 41 | −1.3882 |
| 42 | −1.6033 |
| 43 | −1.9364 |
| 44 | −2.1979 |
| 45 | −2.3252 |
| 46 | −2.3012 |

TABLE VIII-continued

| | Pre-Processed Reconstructed Signal ("pre_mod_inv_x") of MWT |
|---|---|
| col. | pre_mod_inv_x |
| 47 | −2.3518 |
| 48 | −2.3624 |
| 49 | −2.4360 |
| 50 | −2.3412 |
| 51 | −2.4658 |
| 52 | −2.3772 |
| 53 | −2.3195 |
| 54 | −2.0897 |
| 55 | −2.0733 |
| 56 | −1.7549 |
| 57 | −1.6122 |
| 58 | −1.3446 |
| 59 | −1.2523 |
| 60 | −0.9557 |
| 61 | −0.7727 |
| 62 | −0.4993 |
| 63 | −0.2359 |
| 64 | 0.0970 |
| 65 | 0.3374 |
| 66 | 0.5181 |
| 67 | 0.6793 |
| 68 | 1.0220 |
| 69 | 1.3095 |
| 70 | 1.5941 |
| 71 | 1.9558 |
| 72 | 2.2865 |
| 73 | 2.4440 |
| 74 | 2.5852 |
| 75 | 2.9014 |
| 76 | 2.9943 |
| 77 | 3.2152 |
| 78 | 3.3675 |
| 79 | 3.5910 |
| 80 | 3.5123 |
| 81 | 3.6699 |
| 82 | 3.6561 |
| 83 | 3.4790 |
| 84 | 3.4327 |
| 85 | 3.3520 |
| 86 | 3.2244 |
| 87 | 3.0567 |
| 88 | 3.0598 |
| 89 | 2.8218 |
| 90 | 2.5898 |
| 91 | 2.2592 |
| 92 | 2.0413 |
| 93 | 1.7603 |
| 94 | 1.5676 |
| 95 | 1.3119 |
| 96 | 1.0722 |
| 97 | 0.7552 |
| 98 | 0.3335 |
| 99 | −0.1163 |
| 100 | −0.3457 |
| 101 | −0.6198 |
| 102 | −0.6731 |
| 103 | −0.5404 |
| 104 | −0.3625 |
| 105 | −0.2205 |

It is readily apparent that the reconstructed signals "pre_mod_inv_x" have received a noise reduction when compared with the original input data signals x. Accordingly, the code supporting this application of the MATLAB™ program language is reproduced below.

Modified Wavelet Transform (MWT) Decomposition Case Code

```
load sig;
plot(x);
[lo_dfil, hi_dfil, lo_rfil,hi_rfil] = wfilters ('db2');
low pass_filter = [1 1 1 1 1]/5;
mod_lo_dfil = conv (lo_dfil, low_pass_filter);
mod_hi_dfil = conv (hi_dfil, low_pass_filter);
[low1, high1] = dwt (x, mod_lo_dfil,mod_hi_dfil);
[pre_mod_inv_x] = idwt(low1,high1,lo_rfil,hi_rfil);
diary pre_filter
low_pass_filter
mod_lo_dfil
mod_hi_dfil
low1
high1
pre_mod_inv_x
diary off.
```

| | | | | | |
|---|---|---|---|---|---|
| low_pass_filter = | 0.2000 | 0.2000 | 0.2000 | 0.2000 | 0.2000 |
| mod_lo_dfil = | −0.0259 | 0.0189 | 0.1863 | 0.2828 | 0.2828 |
| | 0.3087 | 0.2639 | 0.0966 | (columns 1 through 8) | |
| mod_hi_dfil = | −0.0966 | 0.0707 | 0.0259 | −0.0000 | −0.0000 |
| | −0.0966 | −0.0707 | −0.0259 | (columns 1 through 8) | | c. Modified Inverse Wavelet Transform (MIWT) Synthesis Reconstruction

Figure 15C:
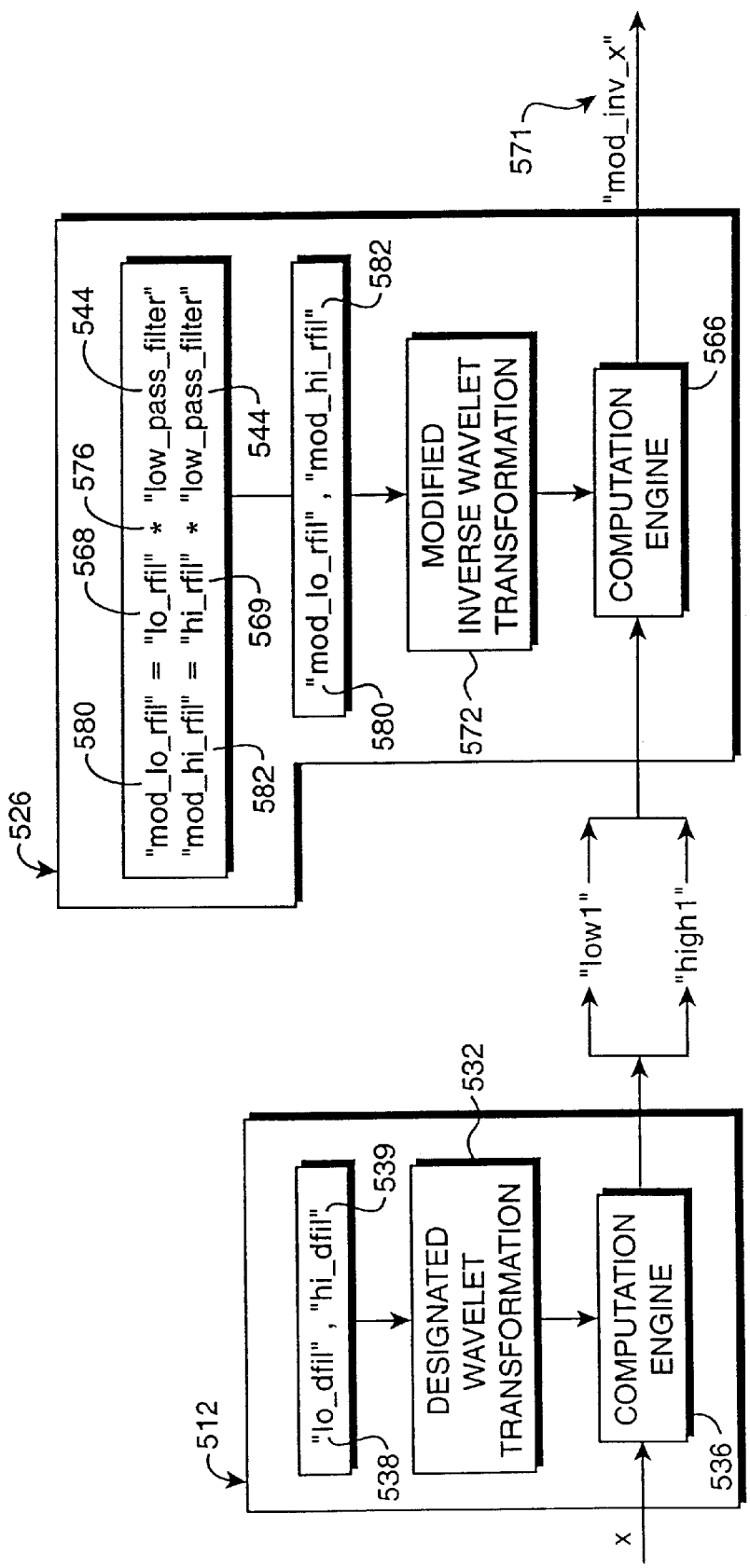
FIG. 15(C) is a block diagram of the selected parts of the MATLAB™ program illustrating a wavelet transform (WT) analysis decomposition coupled with a modified inverse wavelet transform (MIWT) synthesis reconstruction.

Third, with regards to the illustrative example of the present invention modified inverse wavelet transform (MIWT) reconstruction case, as illustrated in FIG. 15(C), the inverse wavelet transform 526 comprises inverse wavelet reconstruction filters "lo_rfil" 568 and "hi_rfil" 569 that are convolved 576 with a desired filter "low_pass-filter" 544, such as for noise reduction purposes. It would be appreciated by one skilled in the art that this desired filter could have been a high-pass filter for image enhancement. This convolution operation 576, as represented in equations 8 and 9, creates the modified inverse wavelet filters "mod lo rfil" 580 and "mod hi rfil" 582 required for the MIWT 572.

$$\text{mod\_lo\_rfil} = (\text{lo\_rfil}) * (\text{low\_pass\_filter}) \quad (8)$$

$$\text{mod\_hi\_rfil} = (\text{hi\_rfil}) * (\text{low\_pass\_filter}) \quad (9)$$

Therefore, the reconstruction includes modified synthesis wavelet reconstruction filters "mod_lo_rfil" 580 and "mod_hi_rfil" 582 that low-pass and high-pass filters, respectively, the decomposed signals "low1" and "high1" received from an analysis decomposition portion.

Figure 19A:
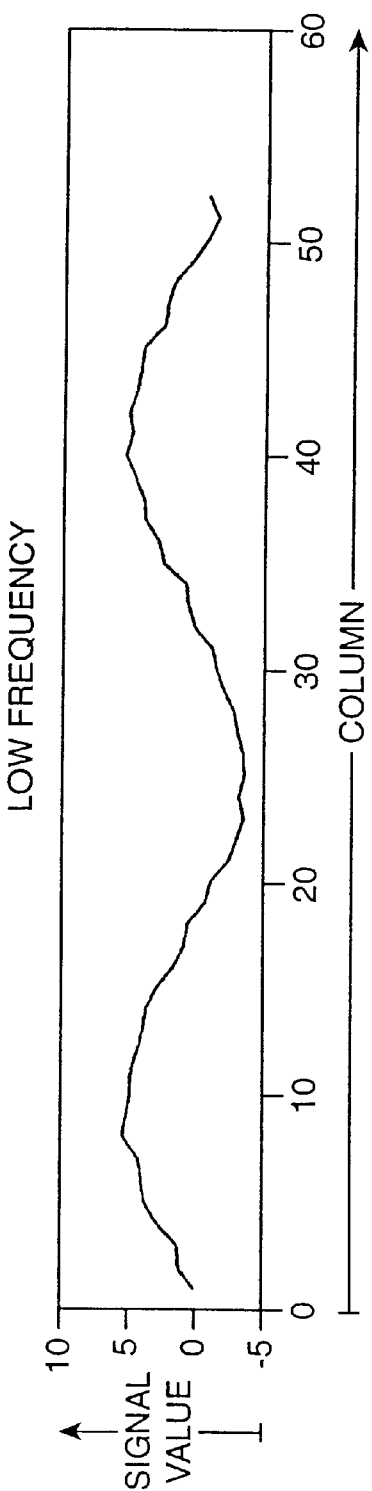
FIG. 19(A) is the graphical representation of the results of the modified inverse wavelet transform (MIWT) synthesis reconstruction using the modified synthesis inverse wavelet reconstruction low-pass filters.
Figure 19B:
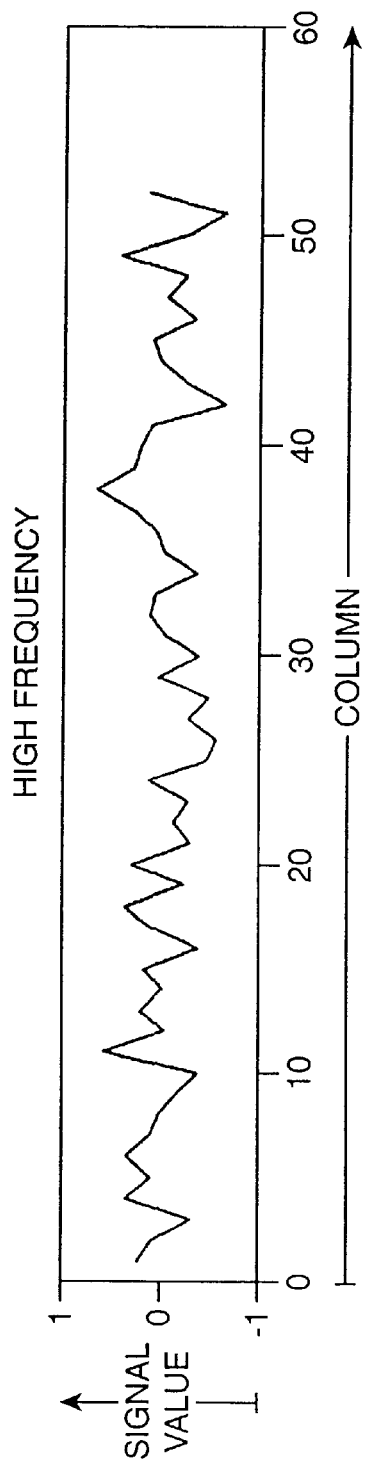
FIG. 19(B) is the graphical representation of the results of the modified inverse wavelet transform (MIWT) synthesis reconstruction using the modified synthesis inverse wavelet reconstruction high-pass filters.

The results due to the low-pass and high pass filtering by the modified synthesis inverse wavelet reconstruction filters "mod_lo_rfil" and "mod-hi-rfil" are represented numerically in table IX and X below, and graphically FIGS. 19(A) and (B). These modified reconstruction filters thereby provide modified inverse wavelet coefficients that have been modified by convolving 576 the basis function of the inverse wavelet reconstruction filters ("lo_rfil" 568 and "hi-rfil" 569) with the desired filter ("low_pass-filter" 544). As a result, the desired filtering is accomplished in the inverse wavelet domain using the inverse wavelet transform as the computation engine 566, without the cost of additional software or hardware support.

TABLE IX

Low-pass Band ("mod_lo_rfil")
of MIWT Reconstruction Case

| col. | mod_lo_rfil |
|---|---|
| 1 | 0.0573 |
| 2 | 1.1505 |
| 3 | 1.2026 |
| 4 | 2.6824 |
| 5 | 3.6563 |
| 6 | 3.9031 |
| 7 | 4.0948 |
| 8 | 5.2616 |
| 9 | 4.9960 |
| 10 | 4.7227 |
| 11 | 4.7365 |
| 12 | 4.2474 |
| 13 | 3.7769 |
| 14 | 3.6596 |
| 15 | 2.8757 |
| 16 | 1.5982 |
| 17 | 0.8585 |
| 18 | 0.5944 |
| 19 | −0.6751 |
| 20 | −1.0823 |
| 21 | −2.3967 |
| 22 | −2.9605 |
| 23 | −3.5094 |
| 24 | −3.1707 |
| 25 | −3.5157 |
| 26 | −3.4793 |
| 27 | −3.0929 |
| 28 | −2.7429 |
| 29 | −2.0430 |
| 30 | −1.4380 |
| 31 | −1.0995 |
| 32 | 0.1782 |
| 33 | 0.6841 |
| 34 | 0.8698 |
| 35 | 2.5023 |
| 36 | 2.8841 |
| 37 | 3.8285 |
| 38 | 4.0645 |
| 39 | 4.6395 |
| 40 | 5.3852 |
| 41 | 4.9048 |
| 42 | 5.1572 |
| 43 | 4.5480 |
| 44 | 4.2891 |
| 45 | 4.1028 |
| 46 | 2.6463 |
| 47 | 2.4050 |
| 48 | 1.8982 |
| 49 | 0.581 |
| 50 | 0.5339 |
| 51 | −1.2706 |
| 52 | −0.5325 |

TABLE X

High-Pass Band ("mod_hi_rfil")
of MIWT Reconstruction Case

| col. | mod_hi_rfil |
|---|---|
| 1 | 0.2139 |
| 2 | 0.0801 |
| 3 | −0.3305 |
| 4 | 0.3384 |
| 5 | 0.0820 |
| 6 | 0.3295 |
| 7 | 0.0865 |
| 8 | −0.0049 |
| 9 | −0.1849 |
| 10 | −0.4038 |
| 11 | 0.5657 |

TABLE X-continued

High-Pass Band ("mod_hi_rfil")
of MIWT Reconstruction Case

| col. | mod_hi_rfil |
|---|---|
| 12 | −0.0478 |
| 14 | −0.0254 |
| 15 | 0.1626 |
| 16 | −0.3933 |
| 17 | 0.0998 |
| 18 | 0.3549 |
| 19 | −0.2387 |
| 20 | 0.2900 |
| 21 | −0.3108 |
| 22 | −0.1330 |
| 23 | −0.2835 |
| 24 | 0.1287 |
| 25 | −0.4759 |
| 27 | 0.2909 |
| 28 | −0.4917 |
| 29 | 0.0214 |
| 30 | −0.3990 |
| 31 | −0.0375 |
| 32 | 0.1131 |
| 33 | 0.0561 |
| 34 | −0.3794 |
| 35 | −0.0325 |
| 36 | 0.0532 |
| 37 | 0.2680 |
| 38 | 0.6673 |
| 40 | 0.2155 |
| 41 | 0.0985 |
| 41 | −0.6587 |
| 43 | −0.2548 |
| 44 | 0.0118 |
| 45 | 0.0946 |
| 46 | −0.3525 |
| 47 | −0.0525 |
| 48 | −0.2553 |
| 49 | 0.4268 |
| 50 | −0.2871 |
| 51 | −0.6481 |
| 52 | 0.1427 |

Figure 19C:
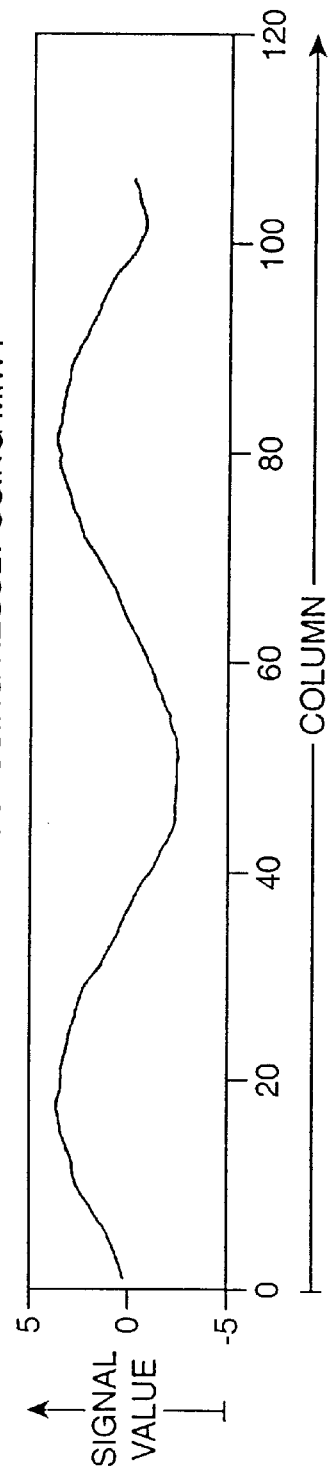
FIG. 19(C) is the graphical representation of the results of the modified inverse wavelet transform (MIWT) synthesis reconstruction wherein the signals have been reconstructed after having been modified in the inverse wavelet transform.

The reconstructed signals "mod_inv_x" 571 are represented numerically in table XI below, and graphically represented in FIG. 19(C).

TABLE XI

Post-Processed Reconstructed Signal
("mod_inv_x") of MIWT

| col. | mod_inv_x |
|---|---|
| 1 | 0.9313 |
| 2 | 1.2183 |
| 3 | 1.5795 |
| 4 | 1.8957 |
| 5 | 2.2633 |
| 6 | 2.5501 |
| 7 | 2.7390 |
| 8 | 2.7594 |
| 9 | 2.9599 |
| 10 | 3.1800 |
| 11 | 3.3667 |
| 12 | 3.4517 |
| 13 | 3.5631 |
| 14 | 3.5534 |
| 15 | 3.3743 |
| 16 | 3.3358 |
| 17 | 3.3458 |
| 18 | 3.2217 |
| 19 | 3.0673 |
| 20 | 2.9986 |
| 21 | 2.8691 |
| 22 | 2.6484 |

TABLE XI-continued

Post-Processed Reconstructed Signal ("mod_inv_x") of MIWT

| col. | mod_inv_x |
|---|---|
| 23 | 2.5463 |
| 24 | 2.3854 |
| 25 | 2.1878 |
| 26 | 1.8283 |
| 27 | 1.4167 |
| 28 | 1.1191 |
| 29 | 0.8409 |
| 30 | 0.5719 |
| 31 | 0.4040 |
| 32 | 0.1659 |
| 33 | −0.1521 |
| 34 | −0.4090 |
| 35 | −0.6842 |
| 36 | −1.0982 |
| 37 | −1.3882 |
| 38 | −1.6033 |
| 39 | −1.9364 |
| 40 | −2.1979 |
| 41 | −2.3252 |
| 42 | −2.3012 |
| 43 | −2.3518 |
| 44 | −2.3624 |
| 45 | −2.4360 |
| 46 | −2.3412 |
| 47 | −2.4658 |
| 48 | −2.3772 |
| 49 | −2.3195 |
| 50 | −2.0897 |
| 51 | −2.0733 |
| 52 | −1.7549 |
| 53 | −1.6122 |
| 54 | −1.3446 |
| 55 | −1.2523 |
| 56 | −0.9557 |
| 57 | −0.7727 |
| 58 | −0.4993 |
| 59 | −0.2359 |
| 60 | 0.0970 |
| 61 | 0.3374 |
| 62 | 0.5181 |
| 63 | 0.6793 |
| 64 | 1.0220 |
| 65 | 1.3095 |
| 66 | 1.5941 |
| 67 | 1.9558 |
| 68 | 2.2865 |
| 69 | 2.4440 |
| 70 | 2.5852 |
| 71 | 2.9014 |
| 72 | 2.9943 |
| 73 | 3.2152 |
| 74 | 3.3675 |
| 75 | 3.5910 |
| 76 | 3.5123 |
| 77 | 3.6699 |
| 78 | 3.6561 |
| 79 | 3.4790 |
| 80 | 3.4327 |
| 81 | 3.3520 |
| 82 | 3.2244 |
| 83 | 3.0567 |
| 84 | 3.0598 |
| 85 | 2.8218 |
| 86 | 2.5898 |
| 87 | 2.2592 |
| 88 | 2.0413 |
| 89 | 1.7603 |
| 90 | 1.5676 |
| 91 | 1.3119 |
| 92 | 1.0722 |
| 93 | 0.7552 |
| 94 | 0.3335 |
| 95 | −0.1163 |
| 96 | −0.3457 |
| 97 | −0.6198 |
| 98 | −0.6731 |

It is readily apparent that the reconstructed signals "mod_inv_x" 571 have received a noise-reduction treatment when compared with the original input signals x. Accordingly, the code supporting this application of the MATLAB™ program language is reproduced below.

Modified Inverse Wavelet Transform (MIWT) Reconstruction Case

```
load sig;
plot(x);
[lo_dfil,hi_dfil,lo_rfil,hi_rfil] = wfilters ('db2');
[low1,high1] = dwt(x,lo_dfil,hi_dfil);
low_pass_filter = [ 1 1 1 1 1 ]/5;
mod_lo_rfil - conv(lo_rfil,low_pass_filter);
mod_hi_rfil - conv(hi_rfil,low_pass_filter);
[mod_inv_x] = idwt(low1,high1,mod_lo_rfil,mod_hi_rfil];
diary post_filter
low1
high1
low_pass_filter
mod_lo_rfil
mod_hi_rfil
mod_inv_x
diary off.
low_pass_filter =    0.2000   0.2000   0.2000   0.2000
mod_lo_rfil =        0.0966   0.2639   0.3087   0.2828  0.2828
                     0.1863   0.0189  −0.0259   (columns 1
                                                 through 8)
mod_hi_rfil =       −0.0259  −0.0707   0.0966  −0.0000  0.0000
                     0.0259   0.0707  −0.0966   (columns 1
                                                 through 8)
```

The present invention provides a novel approach for modifying the wavelet (inverse wavelet) basis function of the wavelet (inverse wavelet) transform in accordance to a desired linear filtering effect. The present invention convolves the wavelet (inverse wavelet) basis function of the wavelet transform with a desired filter to form a modified wavelet (inverse wavelet) transform. By practicing the invention, the skilled practitioner can now linear filter using the wavelet (inverse wavelet) transform as the computation engine. Thus the teachings of the present invention overcome the limitations of the prior art modes that linear filter in the frequency domain or time domain, rather than the wavelet (inverse wavelet) domain.

The present invention can be used for linear filtering digital signals and images with desired filters of any shape and length using the forward wavelet/inverse wavelet transform hardware and software as the only computation engine. Except for an initial (one time) modification of the wavelet basis functions all of the computation to perform linear filtering in the present invention can be done either in the forward wavelet transform step, in the inverse wavelet transform step or in both the forward and inverse wavelet transforms.

Consequently, an advantage of the present invention is that linear filtering is performed using-the-wavelet transform in a method that is mathematically equivalent to the filtering operation in the spatial domain. The application of wavelet transforms to perform linear filtering is not well known and offers an opportunity to conveniently utilize available custom hardware or general purpose computers to achieve linear filtering. This is an important advantage to digital signal processing and image processing because the wavelet transform is becoming an integral part of various signal processing and imaging processing devices, as well as their related industry standards.

As the present invention teaches linear filtering using the wavelet (inverse wavelet) transform as the computation engine, an advantage of the present invention is that the linear filtering is performed without incurring extra cost in terms of software/algorithm computations or apparatus/hardware modifications relative to the prior art.

As the present invention is able to use the wavelet (inverse wavelet) transform as the computation engine of the linear filtering method/apparatus, the present invention harnesses and leverages the wavelet (inverse wavelet) basis function of the wavelet transform so as to perform the desired linear filtering of the digital or analog signals, without incurring extra cost in terms of software computations or hardware modifications.

The embodiments described above provide a number of significant advantages. The methods/apparatuses of the present invention perform linear filtering in the wavelet transform domain where the desired filtering can be performed at the same time as the wavelet and inverse wavelet transformations without any significant costs in terms of computations, memory, or apparatus modifications. Thus, the present invention eliminates the need for another program for software support or additional silicon area or real estate to accommodate more functions in hardware. For instance, in a given system the existing software programs or subroutines and the existing digital signal processing (DSP) chips or computer processors that would already be in place will be adequate to perform the desired linear filtering.

The present invention may be embodied in other specific forms without departing from the spirit or essential characteristics thereof. The foregoing embodiments are therefore to be considered in all respects illustrative rather than limiting of the invention described herein. Scope of the invention is thus indicated by the appended claims rather than by the foregoing description, and all changes which come within the meaning and range of equivalency of the claims are therefore intended to be embraced herein.

We claim:

1. A method for linear filtering digital signals from a data source using desired filters of various shape and length to establish a desired filtered effect, the filtering method comprising the steps of:
   wavelet transforming said digital signals with modified wavelet filter bank functions during a wavelet decomposition analysis using said wavelet transform as a computation engine; and
   forming said modified wavelet filter bank functions from the filter bank functions of said wavelet transform in accordance with said desired filtering effect, said modification of said filter bank functions comprising:
      convolving each filter bank function of at least one stage level of said wavelet transform with said desired filter, thereby forming a modified wavelet transform.

2. The method of claim 1, further comprising:
   storing said digital signals from said data source in a computer readable memory, wherein said digital signals being at least one-dimensional;
   performing said modified wavelet transformation for analysis decomposition on said digital signals in a first stage level to generate one or more sub-bands of modified wavelet coefficients at said first stage level.

3. The method of claim 2, further comprising:
   sequentially performing one or more designated wavelet transformations for analysis decomposition at recursively ascending stage levels, wherein at each of said stage levels said designated wavelet transformations are performed on said wavelet coefficients that are present at immediately preceding stage level to generate wavelet coefficients as a succession of sub-bands.

4. The method of claim 2, wherein said first stage level modified wavelet transformations performed on one-dimensional said digital signals further comprises:
   performing said modified wavelet transformation on said digital signals to produce modified wavelet coefficients in a low(L)-frequency portion and a high(H)-frequency portion to generate one or more sub-bands of modified wavelet coefficients at said first stage level.

5. The method of claim 4, further comprising:
   sequentially performing one or more designated wavelet transformations on said one-dimensional digital signals for analysis decomposition at recursively ascending stage levels, wherein said designated wavelet transformation comprises:
      performing said designated wavelet transformation on said low(L)-frequency portion wavelet coefficients that are present at immediately preceding stage level to generate designated wavelet coefficients as a succession of sub-bands.

6. The method of claim 2, wherein said analysis decomposition on two-dimensional said digital signals includes N number (N=1,2,3,4 . . . ) of stage levels, and wherein said first stage level modified wavelet transformation further comprises:
   performing said modified wavelet transformation on said two-dimensional digital signals in a first direction to produce modified wavelet coefficients in a first direction low(L)-frequency portion and a first direction high(H)-frequency portion; and
   performing said modified wavelet transformation in a second direction on said first direction low(L)-frequency portion of said first stage to produce modified wavelet coefficients in a second direction low-low (LL) frequency portion and a second direction low-high(LH) frequency portion; and
   performing said modified wavelet transformation in a second direction on said first direction high(H)-frequency portion of said first stage to produce modified wavelet coefficients in a second direction high-low (HL) frequency portion and a second direction high-high(HH) frequency portion.

7. The method of claim 6, further comprising:
   sequentially performing one or more designated wavelet transformations on said two-dimensional digital signals for analysis decomposition at recursively ascending analysis stage levels, wherein said designated wavelet transformation comprises:
      performing said designated wavelet transformation at subject recursive stage level on the wavelet coefficients that are present at immediately preceding stage level low-low(LL)-frequency portion to produce designated wavelet coefficients in a first direction low(L)-frequency portion and a first direction high(H)-frequency portion of subject stage level;
      performing said designated wavelet transformation at subject recursive stage level in a second direction on said first direction low(L)-frequency portion to produce designated wavelet coefficients in a second direction low-low(LL) frequency portion and a second direction low-high(LH) frequency portion; and performing said designated wavelet transformation at subject recursive stage level in a second direction on said first direction high(H)-frequency portion to produce designated wavelet coefficients in a second direction high-low(HL) frequency portion and a second direction high-high(HH) frequency portion.

8. The method of claims 3, 5, or 7, further comprising steps for compressing said digital signals as follows:

quantizing said modified wavelet coefficients or said designated wavelet coefficients existing at the highest said stage level using a quantizer at a selected quantization level; and entropy encoding said quantized coefficients using an encoder to obtain the compressed data.

9. A method for linear filtering digital signals from a data source using desired filters of various shape and length to establish a desired filtered effect, the filtering method comprising the steps of:

inverse wavelet transforming said digital signals with modified inverse wavelet filter bank functions during an inverse wavelet reconstruction synthesis using said inverse wavelet transform as a computation engine; and forming said modified inverse wavelet filter bank functions from the filter bank functions of said inverse wavelet transform in accordance with said desired filtering effect, said modification of filter bank functions comprising:

convolving each filter bank function of at least one stage level of said inverse wavelet transform with said desired filter, thereby forming a modified inverse wavelet transform.

10. The method of claim 9, wherein said digital signals from said data source are stored in a computer readable memory; wherein said digital signals have been decomposed in a wavelet transform decomposition analysis having N number (N=1,2,3,4 . . . ) of recursively ascending analysis stage levels; wherein said decomposed analysis digital signals are reconstructed in an inverse wavelet transform reconstruction synthesis having a corresponding and equal N number (N=1,2,3,4 . . . ) of recursively descending synthesis stage levels, and if the N number of stage levels is greater than one, then the method further comprises:

sequentially performing one or more designated inverse wavelet transformations for synthesis reconstruction at the recursively descending synthesis stage levels at each of the first through (N−1) synthesis stage levels, wherein at each of said synthesis stage levels said designated inverse wavelet transformations are performed on said coefficients that are present at immediately preceding synthesis stage level or at corresponding analysis stage level to generate inverse wavelet coefficients as a succession of full bands, and performing said modified inverse wavelet transformation in said last synthesis stage level, Nth level, for synthesis reconstruction; wherein said modified inverse wavelet transformation being performed on coefficients that are present at immediately preceding synthesis stage level or at corresponding analysis stage level to generate one or more full bands of modified inverse wavelet coefficients at said last stage level, $N^{th}$ level.

11. The method of claim 10, wherein said one-dimensional digital signals from the decomposition analysis have been decomposed in said wavelet transform at a last ascended analysis stage level, $N^{th}$ level, of said decomposition analysis forming wavelet coefficients in a low(L)-frequency portion and high(H) frequency portion, and wherein if the N number of stage levels of said inverse wavelet reconstruction synthesis is greater than one, then said method further comprises:

sequentially performing one or more designated inverse wavelet transformations on said one-dimensional digital signals for synthesis reconstruction at recursively descending synthesis stage levels to produce inverse wavelet coefficients in a low(L)-frequency portion and a high(H) frequency portion, wherein:

said designated inverse wavelet transformation at first synthesis stage level comprises:

performing said designated inverse wavelet transformation on corresponding low-pass and high-pass wavelet coefficients received from corresponding analysis stage level; and said designated inverse wavelet transformation for each of the second through the (N−1) synthesis stage levels comprises:

performing said designated inverse wavelet transformation on the low-pass inverse wavelet coefficients filters received from said immediately preceding synthesis stage level, and on the high-pass wavelet coefficients received from the corresponding analysis stage level, and whereby said designated inverse wavelet transformation produces inverse wavelet coefficients that reconstructs the signal to recombine the sub-bands in to a succession of full bands.

12. The method of claim 11, having said modified inverse wavelet transformations performed on said one-dimensional signals, wherein:

if said inverse wavelet reconstruction synthesis includes only one stage level, said modified method comprises:

performing said modified inverse wavelet transformation on the corresponding low-pass and high-pass wavelet coefficients that are outputted from corresponding analysis stage level; and alternatively, if said inverse wavelet reconstruction synthesis includes more than one stage level, said modified method shall be performed in said last synthesis stage level, Nth stage level, wherein said modified method comprises:

performing said modified inverse wavelet transformation on the low-pass inverse wavelet coefficients that are present at said immediately preceding synthesis stage level, and on the high-pass wavelet coefficients from the corresponding analysis stage level, whereby said modified inverse wavelet transformation produces inverse wavelet coefficients that reconstructs the signal to recombine the sub-bands into a full band.

13. The method of claim 10, wherein said digital signals being two-dimensional digital signals, wherein said two-dimensional digital signals from the decomposition analysis has been decomposed in said wavelet transform through the last recursively ascended analysis stage level, Nth level, whereby having formed wavelet coefficients in: a first direction low(L) frequency and a second direction low(L)-frequency portion resulting in a low-low(LL)-frequency portion; a first direction low(L)frequency and a second direction high(H)-frequency portion resulting in a low-high (LH)-frequency portion; a first direction high(H) frequency and a second direction low(L)-frequency portion resulting in a high-low(HL)-frequency portion; and a first direction high(H)frequency and a second direction high(H)-frequency portion resulting in a high-high(HH)-frequency portion, and wherein if the N number of stage levels of said inverse wavelet reconstruction synthesis is greater than one, then said method further comprises:

sequentially performing one or more designated inverse wavelet transformations on said two-dimensional digital signals for synthesis reconstruction at recursively descending synthesis stage levels, wherein:

said designated inverse wavelet transformation at the first synthesis stage level comprises:

performing said designated inverse wavelet transformation at the first synthesis stage level in a second direction on the coefficients of said low-low(LL) frequency portion and said low-high(LH) frequency portion received from the corresponding analysis stage level to produce designated inverse wavelet coefficients that are reconstructed into a second direction low(L)-frequency portion at the first synthesis stage level, performing said designated inverse wavelet transformation at the first synthesis stage level in a second direction on the coefficients of said high-low(HL) frequency portion and said high-high(HH) frequency portion received from the corresponding analysis stage level to produce designated inverse wavelet coefficients that are reconstructed into a second direction high(H)-frequency portion of the first synthesis stage level, and performing said designated inverse wavelet transformation at said first synthesis stage level in a first direction on said second direction reconstructed coefficients of said low-pass and high-pass frequency portions to produce designated inverse wavelet coefficients that reconstructs the signal to recombine the sub-bands into a full band; and said designated inverse wavelet transformation at each of the second through the (N−1) synthesis stage levels comprises:

performing said designated inverse wavelet transformation at subject recursive synthesis stage level in a second direction on the coefficients received from said immediately preceding synthesis stage level, and on said low-high(LH) frequency portion received from the corresponding analysis stage level to produce designated inverse wavelet coefficients that are reconstructed into a second direction low(L)-frequency portion of the subject synthesis stage level, performing said designated inverse wavelet transformation at subject recursive synthesis stage level in a second direction on the coefficients of said high-low(HL) frequency portion and said high-high(HH) frequency portion at the subject synthesis stage level received from the corresponding analysis stage level to produce designated inverse wavelet coefficients that are reconstructed in a second direction high(H)-frequency portion of the subject synthesis stage level, and performing said designated inverse wavelet transformation at subject recursive synthesis stage level in a first direction on said second direction reconstructed coefficients of said low-pass and high-pass frequency portions that are present at subject recursive synthesis stage level to produce designated inverse wavelet coefficients that reconstructs the signal to recombine the sub-bands into a full band.

14. The method of claim 12, having said modified inverse wavelet transformations performed on said two-dimensional signals, wherein:

if said inverse wavelet reconstruction synthesis includes only one synthesis stage level then the method further comprises performing modified inverse wavelet transformation on said two-dimensional digital signals for synthesis reconstruction at said only synthesis stage level, whereby said only synthesis stage level being the first synthesis stage level, said modified method comprises:

performing said modified inverse wavelet transformation at said first synthesis stage level in a second direction on the coefficients of said low-low(LL) frequency portion and said low-high(LH) frequency portion received from the corresponding analysis stage level to produce modified inverse wavelet coefficients that are reconstructed in a second direction low(L)-frequency portion of said first synthesis stage level, performing said modified inverse wavelet transformation at said first synthesis stage level in a second direction on the coefficients of said high-low(HL) frequency portion and said high-high(HH) frequency portion received from the corresponding analysis stage level to produce modified inverse wavelet coefficients that are reconstructed in a second direction high(H)-frequency portion of said first synthesis stage level, and performing said modified inverse wavelet transformation at said first synthesis stage level in a first direction on the second direction reconstructed coefficients of said low-pass and high-pass frequency portions at said first synthesis stage level to produce modified inverse wavelet coefficients that reconstructs the signal to recombine the sub-bands into a full band; and alternatively, if said inverse wavelet reconstruction synthesis includes more than one synthesis stage level then the method comprises performing modified inverse wavelet transformation on said two-dimensional digital signals for synthesis reconstruction at the last synthesis stage level, $N^{th}$ level, said modified method comprises:

performing said modified inverse wavelet transformation at the last synthesis stage level in a second direction on the coefficients received from said immediately preceding synthesis stage level, and on the coefficients of said low-high(LH) frequency portion received from the corresponding analysis stage level to produce modified inverse wavelet coefficients that are reconstructed in a second direction low(L)-frequency portion of the last synthesis stage level, performing said modified inverse wavelet transformation at the last synthesis stage level in a second direction on the coefficients of said high-low(HL) frequency portion and said high-high(HH) frequency portion received from the corresponding analysis stage level to produce modified inverse wavelet coefficients that are reconstructed in a second direction high(H)-frequency portion of said last synthesis stage level, and performing said modified inverse wavelet transformation at the last synthesis stage level in a first direction on the second direction reconstructed coefficients of said low-pass and high-pass frequency portions at said last synthesis stage level to produce modified inverse wavelet coefficients that reconstructs the signal to recombine the sub-bands into a full band.

15. The method of claims 10, 12, or 14, further comprising steps for decompressing said digital signals as follows:

dequantizing said modified inverse wavelet coefficients at the highest synthesis stage level, Nth level, using a dequantizer at a selected dequantization level; and entropy decoding said dequantized coefficients using an decoder to obtain the decompressed data.

16. A method for linear filtering digital signals from a data source using desired filters of various shape and length to establish a desired filtered effect, the filtering method comprising the steps of:

wavelet transforming and inverse wavelet transforming said digital signals with modified filter bank functions using said wavelet and inverse wavelet transforms as a computation engines;

forming said modified filter bank functions from the filter bank functions of said wavelet and inverse wavelet transforms in accordance with said desired filtering effect; and splitting said desired filter in a first part and a second part, said modification of said filter bank functions of said wavelet and inverse wavelet transforms comprising:

convolving each filter bank function of at least one stage level of said wavelet transform with said first part of said desired filter, thereby forming a modified wavelet transform; and convolving each filter bank function of at least one stage level of said inverse wavelet transform with said second part of said desired filter, thereby forming a modified inverse wavelet transform.

17. The method of claim 16, wherein an analysis decomposition and a corresponding synthesis reconstruction each includes only one stage level, whereby said stage level defines a first stage level, said method further comprising:

storing said digital signals from said data source in a computer readable memory, wherein said digital signals being at least one-dimensional;

performing said modified wavelet transformation for said analysis decomposition on said digital signals in said first analysis stage level to generate one or more sub-bands of modified wavelet coefficients at said first analysis stage level; and performing said modified inverse wavelet transformation in said first synthesis stage level for synthesis reconstruction, wherein said modified inverse wavelet transformation being performed on coefficients received from corresponding first analysis stage level to generate one or more sub-bands of modified inverse wavelet coefficients at said first synthesis stage level.

18. The method of claim 16, wherein an analysis decomposition includes N number (N=2,3,4 . . . ) of recursively ascending analysis stage levels and wherein a synthesis reconstruction includes a corresponding N number (N=2,3,4 . . . ) of recursively descending synthesis stage levels, wherein the N number of stage levels is at least two levels, said method further comprising:

storing said digital signals from said data source in a computer readable memory, wherein said digital signals being at least one-dimensional;

said analysis decomposition further comprises:

performing said modified wavelet transformation for said analysis decomposition on said digital signals in first analysis stage level to generate one or more sub-bands of modified wavelet coefficients at said first analysis stage level; and sequentially performing one or more designated wavelet transformations for analysis decomposition at recursively ascending stage levels, wherein at each of said recursively ascending analysis stage levels said designated wavelet transformations are performed on said wavelet coefficients that are present at immediately preceding stage level to generate wavelet coefficients as a succession of sub-bands, and said synthesis reconstruction further comprises:

sequentially performing one or more designated inverse wavelet transformations for synthesis reconstruction at the recursively descending synthesis stage levels at each of the first through (n−1) synthesis stage levels, wherein at each of said synthesis stage levels said designated inverse wavelet transformations are performed on said coefficients that are present at immediately preceding synthesis stage level or at corresponding analysis stage level to generate inverse wavelet coefficients as a succession of sub-bands; and performing said modified inverse wavelet transformation in last synthesis stage level, Nth level, for synthesis reconstruction, wherein said modified inverse wavelet transformation being performed on coefficients that are present at immediately preceding synthesis stage level to generate one or more sub-bands of modified inverse wavelet coefficients at said last stage level, $N^{th}$ level.

19. The method of claims 17 or 18, further comprising steps for compressing and decompressing said digital signals, wherein said compressing includes the following steps:

quantizing said modified wavelet coefficients or said designated wavelet coefficients existing at the highest said analysis stage level using a quantizer at a selected quantization level; and entropy encoding said quantized coefficients using an encoder to obtain the compressed data, and said decompression includes the following steps:

dequantizing said modified inverse wavelet coefficients at the highest synthesis stage level, Nth level, using a dequantizer at a selected dequantization level; and entropy decoding said dequantized coefficients using an decoder to obtain the decompressed data.

20. A linear filtering apparatus for linear filtering digital signals using desired filters of various shape and length to establish a desired filtered effect on said digital signals, said apparatus having a control means for controlling the operation of said linear filtering apparatus, and a signal sensing means that receives said digital signals from a signal data source, said linear filtering apparatus comprising:

a wavelet transform means for wavelet transforming said digital signals with modified wavelet filter bank functions during a wavelet decomposition analysis using said wavelet transform means as a computation engine, wherein said modified wavelet filter bank functions are formed by convolving each of the filter bank functions of at least one stage level of said wavelet transform wavelet transform means.

21. The apparatus of claim 20, further comprising:

a storage device for storing digital signal arrays in a computer readable memory, said digital signal arrays having at least one-dimension representing said digital signals;

wherein said wavelet transform means performs said modified wavelet transformation for analysis decomposition on said digital signal arrays in a first analysis stage level to generate one or more sub-bands of modified wavelet coefficients at said first analysis stage level.

22. The apparatus of claim 21, wherein said wavelet transform means sequentially performs one or more designated wavelet transformations for analysis decomposition at recursively ascending analysis stage levels, wherein at each of said analysis stage levels said designated wavelet transformations are performed on said coefficients that are present at immediately preceding analysis stage level to generate wavelet coefficients as a succession of sub-bands.

23. The apparatus of claims 21 or 22, further comprising elements for compressing said digital signal arrays as follows:

a quantizer for quantizing at a selected quantization level said modified wavelet coefficients or said wavelet coefficients existing at highest said analysis stage level; and an encoder for entropy encoding said quantized coefficients to obtain the compressed data.

24. A linear filtering apparatus for linear filtering digital signals using desired filters of various shape and length to establish a desired filtered effect on said digital signals, said apparatus having a control means for controlling the operation of said linear filtering apparatus, and a signal sensing means that receives said digital signals from a signal data source, said linear filtering apparatus comprising:

an inverse wavelet transform means for inverse wavelet transforming said digital signals with modified wavelet filter bank functions during an inverse wavelet reconstruction synthesis using said wavelet transform as a computation engine, wherein:

said modified wavelet filter bank functions are formed by convolving the filter bank functions of at least one stage level of said inverse wavelet transform with said desired filter, thereby forming a modified inverse wavelet transform.

25. The apparatus of claim 24, further comprising:

a storage device for storing digital signal arrays in a computer readable memory, said digital signal arrays having at least one-dimension representing said digital signals; wherein said digital signals have been decomposed in a wavelet transform decomposition analysis having N number (N=1,2,3,4 . . . ) of recursively ascending analysis stage levels; wherein said decomposed analysis digital signals are reconstructed in an inverse wavelet transform reconstruction synthesis having a corresponding and equal N number (N=1,2, 3,4 . . . ) of recursively descending synthesis stage levels, and if the N number of stage levels is greater than one, the inverse wavelet transform means sequentially performs:

one or more designated inverse wavelet transformations for synthesis reconstruction at the recursively descending synthesis stage levels at each of the first through (n−1) synthesis stage levels, wherein at each of said synthesis stage levels said designated inverse wavelet transformations are performed on said coefficients that are present at immediately preceding synthesis stage level or at corresponding analysis stage level to generate inverse wavelet coefficients as a succession of full bands.

26. The apparatus of claim 25, wherein said inverse wavelet transform means performs said modified inverse wavelet transformation in last synthesis stage level, Nth level, for synthesis reconstruction, wherein said modified inverse wavelet transformation is performed on coefficients that are present at immediately preceding synthesis stage level or at corresponding analysis stage level to generate one or more full bands of modified inverse wavelet coefficients at said last stage level, $N^{th}$ level.

27. The apparatus of claims 25 or 26, further comprising elements for decompressing said digital signal array as follows:

a dequantizer for dequantizing said modified inverse wavelet coefficients at the highest synthesis stage level, Nth level; and a decoder for entropy decoding said dequantized coefficients to obtain the decompressed data.

28. A linear filtering apparatus for linear filtering digital signals using desired filters of various shape and length to establish a desired filtered effect on said digital signals, said apparatus having a control means for controlling the operation of said linear filtering apparatus, and a signal sensing means that receives said digital signals from a signal data source, said linear filtering apparatus comprising:

wavelet transform means and inverse wavelet transform means for wavelet transforming and inverse wavelet transforming, respectively, said digital signals with respective modified wavelet filter bank functions and modified inverse wavelet filter bank functions, during wavelet decomposition and inverse wavelet reconstruction analyses, respectively, using said wavelet and inverse wavelet transforms as computation engines, wherein:

said desired filter is split into a first part and a second part; and said modified wavelet filter bank functions of said wavelet transform are formed in accordance with said desired filtering effect, wherein said modification comprises:

convolving each of the wavelet filter bank functions of at least one stage level of said wavelet transform with said first part of said desired filter, thereby forming a modified wavelet transform; and said modified inverse wavelet filter bank functions of said inverse wavelet transform are formed in accordance with said desired filtering effect, wherein said modification comprises:

convolving each of the filter bank functions of at least one stage level of said inverse wavelet transform with said second part of said desired filter, thereby forming a modified inverse wavelet transform.

29. The apparatus of claim 28, further comprising:

a storage device for storing digital signal arrays in a computer readable memory, said digital signal arrays having at least one-dimension representing said digital signals, wherein an analysis decomposition and a corresponding synthesis reconstruction each includes only one stage level, whereby said stage level defines a first stage level, and wherein:

said wavelet transform means performs said modified wavelet transformation for said analysis decomposition on said digital signals in said first analysis stage level to generate one or more sub-bands of modified wavelet coefficients at said first analysis stage level; and said inverse wavelet transform means performs said modified inverse wavelet transformation in said first synthesis stage level for synthesis reconstruction on coefficients received from corresponding first analysis stage level to generate one or more full bands of modified inverse wavelet coefficients at said first synthesis stage level.

30. The apparatus of claim 28, further comprising:

a storage device for storing digital signal arrays in a computer readable memory, said digital signal arrays having at least one-dimension, wherein an analysis decomposition includes N number (N=2,3,4 . . . ) of recursively ascending analysis stage levels and wherein a synthesis reconstruction includes a corresponding N number (N=2,3,4 . . . ) of recursively descending synthesis stage levels, wherein the N number of stage levels is at least two stage levels, and wherein:

said wavelet transform means at said analysis decomposition:

performs said modified wavelet transformation at the first analysis stage level for said analysis decomposition on said digital signals to generate one or more sub-bands of modified wavelet coefficients at said first analysis stage level; and sequentially performs one or more designated wavelet transformations at recursively ascending stage levels for analysis decomposition on said wavelet coefficients received from immediately preceding stage level to generate wavelet coefficients as a succession of sub-bands, and said inverse wavelet transform at said synthesis reconstruction:

sequentially performs one or more designated inverse wavelet transformations at each of the first through (N−1) synthesis stage levels for synthesis reconstruction at the recursively descending synthesis stage levels on said coefficients received from immediately preceding synthesis stage level or corresponding analysis stage level to generate inverse wavelet coefficients as a succession of full bands; and performs said modified inverse wavelet transformation in last synthesis stage level, Nth level, for synthesis reconstruction on coefficients received from immediately preceding synthesis stage level to generate one or more full bands of modified inverse wavelet coefficients at said last stage level, $N^{th}$ level.

31. The apparatus of claims 29 or 30, further comprising elements for compressing and decompressing said digital signals wherein:

said elements for compressing includes:

a quantizer for quantizing at a selected quantization level said modified wavelet coefficients or said designated wavelet coefficients existing at the highest said analysis stage level; and an encoder for entropy encoding said quantized coefficients to obtain the compressed data, and said elements for decompressing includes:

a quantizer for dequantizing at a selected dequantization level said modified inverse wavelet coefficients at the highest synthesis stage level, Nth level; and a decoder for entropy decoding said dequantized coefficients to obtain the decompressed data.

32. A computer usable medium having computer readable program code thereon for linear filtering digital signals using desired filter means of various shape and length to establish a desired filtered effect on said digital signals, whereby said computer usable medium for use in a computer is controlled by a control means for operating the computer, and a signal sensing means that receives said digital signals from a signal data source, wherein said computer usable medium comprises:

a wavelet transform means for wavelet transforming said digital signals with modified wavelet filter bank functions using said wavelet transform means as a computation engine, said digital signals being at least one-dimensional wherein:

said modified wavelet filter bank functions are formed in accordance with said filtering effect by convolving each of the filter bank functions of at least one stage level of said wavelet transform with said desired filter, thereby forming a modified wavelet transform.

33. The computer usable medium of claim 32, wherein said digital signals being stored in a computer readable memory, and said wavelet transform means performs said modified wavelet transformation for analysis decomposition on said digital signal arrays in a first analysis stage level to generate one or more sub-bands of modified wavelet coefficients at said first stage level.

34. The computer usable medium of claim 33, wherein said wavelet transform means sequentially performs one or more designated wavelet transformations for analysis decomposition at recursively ascending analysis stage levels, wherein at each of said analysis stage levels said designated wavelet transformations are performed on said coefficients that are present at immediately preceding stage level to generate wavelet coefficients as a succession of sub-bands.

35. The computer usable medium of claims 33 or 34, further comprising means for compressing said digital signals as follows:

a quantizer means for quantizing at a selected quantization level of said modified wavelet coefficients or said designated wavelet coefficients existing at highest said analysis stage level; and an encoder means for entropy encoding said quantized coefficients to obtain the compressed data.

36. A computer usable medium having computer readable program code thereon for linear filtering digital signals using desired filter means of various shape and length to establish a desired filtered effect on said digital signals, whereby said computer usable medium for use in a computer is controlled by a control means for operating the computer, and a signal sensing means that receives said digital signals from a signal data source, wherein said computer usable medium comprises:

an inverse wavelet transform means for inverse wavelet transforming said digital signals with modified inverse wavelet filter bank functions during an inverse wavelet reconstruction synthesis using said inverse wavelet transform as a computation engine, wherein:

said modified inverse wavelet filter bank functions are formed in accordance with said desired filtering effect, by convolving each of the filter bank functions of at least one stage level of said inverse wavelet transform with said desired filter, thereby forming a modified inverse wavelet transform.

37. The computer usable medium of claim 36 wherein said digital signals being stored in a computer readable memory representing said digital signals and said digital signals being at least one-dimensional, said digital signals have been decomposed in a wavelet transform decomposition analysis having N number (N=1,2,3,4 . . . ) of recursively ascending analysis stage levels, said decomposed analysis digital signals are reconstructed in an inverse wavelet transform reconstruction synthesis having a corresponding and equal N number (N=1,2,3,4 . . . ) of recursively descending synthesis stage levels, and if the N number of stage levels is greater than one, said computer usable medium comprises:

said wavelet transform means that sequentially performs one or more designated inverse wavelet transformations for synthesis reconstruction at the recursively descending synthesis stage levels at each of the first through (N-1) synthesis stage levels, wherein at each of said synthesis stage levels said designated inverse wavelet transformations are performed on said coefficients that are present at immediately preceding synthesis stage level or at corresponding analysis stage level to generate inverse wavelet coefficients as a succession of full bands.

38. The computer usable medium of claim 37, wherein said inverse wavelet transform means performs said modified inverse wavelet transformation in last synthesis stage level, Nth level, for synthesis reconstruction, wherein said modified inverse wavelet transformation is performed on coefficients that are present at immediately preceding synthesis stage level or at corresponding analysis stage level to generate one or more full bands of modified inverse wavelet coefficients at said last stage level, $N^{th}$ level.

39. The computer usable medium of claims 37 or 38, further comprising means for decompressing said digital signals as follows:

a dequantizer means for dequantizing said modified inverse wavelet coefficients at the highest synthesis stage level, Nth level; and a decoder means for entropy decoding said dequantized coefficients to obtain the decompressed data.

40. A computer usable medium having computer readable program code thereon for linear filtering digital signals using desired filter means of various shape and length to establish a desired filtered effect on said digital signals, whereby said computer usable medium for use in a computer is controlled by a control means for operating the computer, and whereby said computer usable medium is for use with a signal sensing means that receives said digital signals from a signal data source, wherein said computer usable medium comprises:

wavelet transform means and inverse wavelet transform means for wavelet transforming and inverse wavelet transforming, respectively, said digital signals in with respective modified wavelet filter bank functions and modified inverse wavelet filter bank functions, using said wavelet and inverse wavelet transforms as a computation engines, wherein:

said desired filter is split into a first part and a second part; and said modified wavelet filter bank functions of said wavelet transform are formed in accordance with said desired filtering effect, by:

convolving the filter bank functions of at least one stage level of said wavelet transform with said first part of said desired filter, thereby forming a modified wavelet transform; and said modified inverse wavelet filter bank functions of said inverse wavelet transform are formed in accordance with said desired filtering effect by:

convolving the filter bank functions of at least one stage level of said inverse wavelet transform with said second part of said desired filter, thereby forming a modified inverse wavelet transform.

41. The computer usable medium of claim 40, wherein said digital signals being stored in a computer readable memory representing said digital signals and said digital signals being at least one-dimensional, wherein an analysis decomposition and a corresponding synthesis reconstruction each includes only one stage level, whereby said stage level defines a first stage level, and wherein:

said wavelet transform means performs said modified wavelet transformation for said analysis decomposition on said digital signals in said first analysis stage level to generate one or more sub-bands of modified wavelet coefficients at said first analysis stage level; and said inverse wavelet transform means performs said modified inverse wavelet transformation in said first synthesis stage level for synthesis reconstruction on coefficients received from corresponding first analysis stage level to generate one or more full bands of modified inverse wavelet coefficients at said first synthesis stage level.

42. The computer usable medium of claim 40, wherein said digital signals being stored in a computer readable memory representing said digital signals and said digital signals being at least one-dimensional, wherein an analysis decomposition includes N number (N=2,3,4 . . . ) of recursively ascending analysis stage levels and wherein a synthesis reconstruction includes a corresponding N number (N=2,3,4 . . . ) of recursively descending synthesis stage levels, wherein the N number of stage levels is at least two levels, said computer usable medium comprises:

said wavelet transform means at said analysis decomposition that:

performs said modified wavelet transformation of the first analysis stage level for said analysis decomposition on said digital signals to generate one or more sub-bands of modified wavelet coefficients at said first analysis stage level; and sequentially performs one or more designated wavelet transformations at recursively ascending stage levels for analysis decomposition on said wavelet coefficients received from immediately preceding analysis stage level to generate wavelet coefficients as a succession of sub-bands, and said inverse wavelet transform at said synthesis reconstruction that:

sequentially performs one or more designated inverse wavelet transformations at each of the first through (n-1) synthesis stage levels for synthesis reconstruction at the recursively descending synthesis stage levels on said wavelet coefficients received from immediately preceding synthesis stage level or corresponding analysis stage level to generate inverse wavelet coefficients as a succession of sub-bands; and performs said modified inverse wavelet transformation in last synthesis stage level, Nth level, for synthesis reconstruction on coefficients received from immediately preceding synthesis stage level to generate one or more full bands of modified inverse wavelet coefficients at said last stage level, $N^{th}$ level.

43. The apparatus of claims 41 or 42, further comprising means for compressing and decompressing said digital signals wherein:
said means for compressing includes:
a quantizer means for quantizing at a selected quantization level said modified wavelet coefficients or said designated wavelet coefficients existing at the highest said analysis stage level; and
an encoder means for entropy encoding said quantized coefficients to obtain the compressed data, and
said means for decompressing includes:
a quantizer means for dequantizing at a selected dequantization level said modified inverse wavelet coefficients at the highest synthesis stage level, Nth level; and
a decoder means for entropy decoding said dequantized coefficients to obtain the decompressed data.

44. A method for electronically sending digital signals over a communication network from a source acquisition system for use at a remote destination rendering system, said method comprising the steps of:
establishing an electronics communications link between said source acquisition system and said remote destination rendering system over said network; and operating said source acquisition system to transmit said digital signals over said network for use in a rendering device or output device at said remote destination rendering system, said method further comprising the steps of:
linear filtering at said source acquisition system said digital signals using a desired filter of various shape and length to establish a desired filtered effect, said linear filtering comprising the steps of:
wavelet transforming said digital signals with modified wavelet filter bank functions during a wavelet decomposition analysis using said wavelet transform as a computation engine; and forming said modified wavelet filter bank functions of said wavelet transform in accordance with said desired filtering effect, wherein said modification is effected by convolving the filter bank functions of at least one stage level of said wavelet transform with said desired filter, thereby forming a modified wavelet transform.

45. A method for electronically rendering digital signals at a destination rendering system, said signals being transmitted over a communication network that originates from a source acquisition system, said method comprising the steps of:
establishing an electronic communications link between said source acquisition system and said destination rendering system over said network; and operating said destination rendering system to receive said digital signals over said network for use in a rendering device or output device at said destination rendering system, said method further comprising the steps of:
linear filtering at said destination rendering system said digital signals transmitted from said source acquisition system using a desired filter of various shape and length to establish a desired filtered effect, said linear filtering comprising the steps of:
inverse wavelet transforming said digital signals with modified inverse wavelet filter bank functions during an inverse wavelet reconstruction analysis using said inverse wavelet transform as a computation engine; and forming said modified inverse wavelet filter bank functions of said inverse wavelet transform in accordance with said desired filtering effect, wherein said modification is effected by convolving each of the filter bank functions of at least one stage level of said inverse wavelet transform with said desired filter, thereby forming a modified inverse wavelet transform.

46. A method for electronically acquiring digital signals over a communication network from a source acquisition system by means of a remote destination rendering system, said method comprising the steps of:
establishing an electronic communications link between said source acquisition system and said remote destination rendering system over said network; and operating said source acquisition system to transmit said digital signals over said network for use in a rendering device or output device at said remote destination rendering system, and
operating said remote destination rendering system to receive said digital signals transmitted from said source acquisition system for use in said rendering device or output device, and said method further comprising the steps of:
a) splitting a desired filter of various shape and length into a first part and second part;
b) linear filtering at said source acquisition system said digital signals using said first part of said desired filter to establish a desired filtered effect, wherein said linear filtering comprises the steps of:
wavelet transforming said digital signals with modified wavelet filter bank functions during a wavelet decomposition analysis using said wavelet transform as a computation engine; and forming said modified wavelet filter bank functions from the filter bank functions of said wavelet transform in accordance with said desired filtering effect, wherein said modification is effected by convolving each of the filter bank functions of at least one stage level of said wavelet transform with said first part desired filter, thereby forming a modified wavelet transform; and
c) linear filtering at said remote destination rendering system said digital signals transmitted from said source acquisition system using said second part of said desired filter to establish a desired filtered effect, said linear filtering comprising the steps of:
inverse wavelet transforming said digital signals with modified inverse wavelet filter bank functions during a wavelet reconstruction analysis using said inverse wavelet transform as a computation engine; and forming said modified inverse wavelet filter bank functions from the filter bank functions of said inverse wavelet transform in accordance with said desired filtering effect, wherein said inverse wavelet modification is effected by convolving each of the filter bank functions of at least one stage level of said inverse wavelet transform with said second part desired filter, thereby forming a modified inverse wavelet transform.

* * * * *